United States Patent
Shim et al.

(10) Patent No.: US 6,281,815 B1
(45) Date of Patent: Aug. 28, 2001

(54) METHOD OF ALLOCATING RLL CODE HAVING ENHANCED DC SUPPRESSION CAPABILITY, MODULATION METHOD, DEMODULATION METHOD, AND DEMODULATION APPARATUS THEREFOR

(75) Inventors: Jae-seong Shim, Seoul; Yong-kwang Won, Suwon; Jung-wan Ko, Yongin, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/556,827

(22) Filed: Apr. 21, 2000

(30) Foreign Application Priority Data

Apr. 21, 1999 (KR) .................................................. 99-14284
Jun. 16, 1999 (KR) .................................................. 99-22574
Sep. 30, 1999 (KR) .................................................. 99-42032

(51) Int. Cl.$^7$ ....................................................... H03M 7/00
(52) U.S. Cl. .............................. 341/59; 341/58; 341/106
(58) Field of Search ................................... 341/58, 59, 65, 341/67, 102, 106, 95, 68

(56) References Cited

U.S. PATENT DOCUMENTS 5,400,023 * 3/1995 Ino et al. ................................ 341/59
5,818,367 * 10/1998 Okazaki et al. ....................... 341/106
5,870,037 * 2/1999 Okazaki et al. ........................ 341/58
5,969,651 * 10/1999 Okazaki et al. ...................... 341/106

* cited by examiner

Primary Examiner—Brian Young
Assistant Examiner—John B Nguyen
(74) Attorney, Agent, or Firm—Staas & Halsey LLP

(57) ABSTRACT

An allocating method of allocating a run length limited (RLL) code having enhanced direct current (DC) suppression capability, modulation and demodulation methods, and a demodulation apparatus are provided. In order to control DC suppression, a pair of code groups having suppression controlling capability are allocated, and a (1, 8, 8, 12) code having DC suppression capability, in which a code word of the pair of code groups has the sign of code word sum value (CSV) parameter, which represent DC value in a code word, and the characteristic of an INV parameter, which predicts the transition direction of digital sum value (DSV) of the succeeding code word, both opposite to those of the code word which belongs to the other code group and corresponds to the same source code, is used and is appropriate to high-density optical disc system.

69 Claims, 46 Drawing Sheets

| User Data | Channel Bit |
|---|---|
| 00 | 101 |
| 01 | 100 |
| 10 | 001 |
| 11 | 010 |

| User Data | Channel Bit |
|---|---|
| 00.00 | 101.000 |
| 01.01 | 100.000 |
| 10.00 | 001.000 |
| 10.01 | 010.000 |

FIG. 6A

| CODE GROUP | MCG1 | MCG2 | DCG1 | DCG2 | MCG1/MCG2 | DSV CODE GROUP |
|---|---|---|---|---|---|---|
| CODE WORD CHARACTERISTIC | CODE WORD WHICH BEGINS WITH 10 | CODE WORD WHICH BEGINS WITH 001~00000001 | CODE WORD WHICH SATISFY LZ≤5 AND WHOSE BIT9 AND BIT5 ARE "1" | CODE WORD WHICH SATISFY LZ≤5 AND WHOSE BIT9 AND BIT5 ARE "0" | CODE WORD WHICH BEGINS WITH 01 | CODE WORD WHICH BEGINS WITH 01 AND IS TO BE INCLUDED IN MCG1 |
| THE NUMBER OF CODE WORDS | 186 | 198 | 256 | 257 | 128 | 70 |

FIG. 6B

| CODE GROUP | MCG1 | MCG2 | DCG1 | DCG2 | MCG1/MCG2 | DSV CODE GROUP |
|---|---|---|---|---|---|---|
| CODE WORD CHARACTERISTIC | CODE WORD WHICH BEGINS WITH 10 | CODE WORD WHICH BEGINS WITH 001~00000001 | CODE WORD WHICH BEGINS WITH 10,00001 OR 000001 | CODE WORD WHICH BEGIN WITH 01,001 OR 0001 | CODE WORD WHICH BEGINS WITH 01 | CODE WORD WHICH BEGINS WITH 010 AND IS TO BE INCLUDED IN MCG1 |
| THE NUMBER OF CODE WORDS | 186 | 198 | 256 | 257 | 128 | 70 |

FIG. 7A

| Data Symbol | MCG1 Code Word MSB LSB | Next Code Group | MCG2 Code Word MSB LSB | Next Code Group | DCG1 Code Word MSB LSB | Next Code Group | DCG2 Code Word MSB LSB | Next Code Group |
|---|---|---|---|---|---|---|---|---|
| 000 | 101010000000 | 1 | 001010000000 | 1 | 001010000000 | 1 | 010000000010 | 3 |
| 001 | 100101000000 | 1 | 000101000000 | 1 | 010000100101 | 2 | 000101000000 | 1 |
| 002 | 100010100000 | 1 | 000010100000 | 1 | 000010100000 | 1 | 010000000100 | 3 |
| 003 | 100001010000 | 1 | 000001010000 | 1 | 010000101001 | 2 | 000001010000 | 1 |
| 004 | 100000101000 | 3 | 000000101000 | 3 | 100000101000 | 3 | 010000000100 | 4 |
| 005 | 100000101000 | 4 | 000000101000 | 4 | 100000101000 | 4 | 010000001000 | 3 |
| 006 | 100000010100 | 3 | 000000010100 | 3 | 010000101010 | 3 | 100000010100 | 3 |
| 007 | 100000010100 | 4 | 000000010100 | 4 | 010010100010 | 3 | 100000010100 | 4 |
| 008 | 100000001010 | 1 | 001001000000 | 1 | 001001000000 | 1 | 100000001010 | 3 |
| 009 | 100000000101 | 2 | 000100100000 | 1 | 000100100000 | 1 | 100000000101 | 2 |
| 010 | 010101000000 | 1 | 000010010000 | 1 | 010010100010 | 4 | 000010010000 | 1 |
| 011 | 010010100000 | 1 | 000001001000 | 3 | 010010100000 | 1 | 000001001000 | 3 |
| 012 | 010001010000 | 1 | 000001001000 | 4 | 010010100101 | 2 | 000001001000 | 4 |
| 013 | 010000101000 | 3 | 000000100100 | 3 | 010000101010 | 3 | 010000010010 | 3 |
| 014 | 010000101000 | 4 | 000000100100 | 4 | 010000101010 | 4 | 010000010010 | 4 |
| 015 | 010000010100 | 3 | 000000010010 | 3 | 010010101010 | 3 | 010000010100 | 3 |
| 016 | 010000010100 | 4 | 000000010010 | 4 | 010010101010 | 4 | 010000010100 | 4 |
| 017 | 010000001010 | 3 | 010100010100 | 3 | 010100100000 | 1 | 010000001010 | 3 |
| 018 | 010000000100 | 4 | 010100010100 | 4 | 010100100001 | 2 | 010000000110 | 4 |
| 019 | 010000000101 | 2 | 010100001010 | 3 | 010100101000 | 3 | 010000000101 | 2 |
| 020 | 010000000010 | 3 | 001010000001 | 2 | 001010000001 | 2 | 010000000010 | 4 |
| 021 | 010000000010 | 4 | 000101000001 | 2 | 010100101000 | 4 | 000101000001 | 2 |
| 022 | 010010100000 | 1 | 001010100000 | 1 | 010010100000 | 1 | 010010000000 | 1 |
| 023 | 010100000001 | 2 | 001000000001 | 2 | 001000000001 | 2 | 010100000001 | 2 |
| 024 | 101010000001 | 2 | 000010100001 | 2 | 000010100001 | 2 | 010001001000 | 3 |
| 025 | 101001000000 | 1 | 010100001010 | 4 | 101001000000 | 1 | 010100001010 | 3 |
| 026 | 101000000001 | 2 | 001000000010 | 3 | 001000000010 | 3 | 010001001000 | 4 |
| 027 | 100101000001 | 2 | 000001010001 | 2 | 100000100010 | 3 | 000001010001 | 2 |
| 028 | 100100100000 | 1 | 010100000101 | 2 | 100100100000 | 1 | 010100000101 | 2 |
| 029 | 100010100001 | 2 | 000000101001 | 2 | 100010100001 | 2 | 010001010000 | 1 |
| 030 | 100010010000 | 1 | 010001000000 | 1 | 100000100100 | 3 | 010001000000 | 1 |
| 031 | 100001010001 | 2 | 000000100101 | 2 | 100000100100 | 4 | 100001010001 | 2 |
| 032 | 100001001000 | 3 | 001010101000 | 3 | 001010101000 | 3 | 100001001000 | 3 |
| 033 | 100001001000 | 4 | 001010101000 | 4 | 001010101000 | 4 | 100001001000 | 4 |
| 034 | 100000101001 | 2 | 010010000001 | 2 | 100000101001 | 2 | 010010000001 | 2 |
| 035 | 100000100100 | 3 | 001010010100 | 3 | 010010100100 | 3 | 010010000010 | 3 |
| 036 | 100000100100 | 4 | 001010010100 | 4 | 010010010100 | 4 | 010010001010 | 4 |
| 037 | 100000010101 | 2 | 001010000010 | 3 | 001010000010 | 3 | 100000010101 | 2 |
| 038 | 100000010010 | 1 | 001010001010 | 3 | 001010001010 | 3 | 100000010010 | 3 |
| 039 | 100000001001 | 2 | 001010001010 | 4 | 001010001010 | 4 | 100000001001 | 2 |
| 040 | 100000000100 | 3 | 001010010100 | 4 | 010010000100 | 4 | 100000000100 | 3 |
| 041 | 100000000100 | 4 | 001001000001 | 2 | 001001000001 | 2 | 100000000100 | 4 |
| 042 | 010101000001 | 2 | 000101000010 | 3 | 100000101010 | 3 | 000101000010 | 3 |
| 043 | 010100100000 | 1 | 001010000101 | 2 | 001010000101 | 2 | 010100010000 | 1 |
| 044 | 010010100001 | 2 | 000101000010 | 4 | 010010100001 | 2 | 000101000010 | 4 |
| 045 | 010010010000 | 1 | 000010100100 | 1 | 001010010100 | 1 | 010010010000 | 1 |
| 046 | 010001010001 | 2 | 000100100001 | 2 | 000100100001 | 2 | 010001010001 | 2 |
| 047 | 010001001000 | 3 | 000101010100 | 3 | 100010100000 | 1 | 000101010100 | 3 |
| 048 | 010001001000 | 4 | 000101010100 | 4 | 100010100010 | 3 | 000101010100 | 4 |
| 049 | 010000101001 | 2 | 000010100010 | 3 | 000010100010 | 3 | 010100010100 | 3 |
| 050 | 010000100100 | 3 | 000101001010 | 3 | 010000100100 | 3 | 000101001010 | 3 |
| 051 | 010000100100 | 4 | 000101001010 | 4 | 010000100100 | 4 | 000101001010 | 4 |
| 052 | 010000010101 | 2 | 000010100010 | 4 | 000010100010 | 4 | 010000010101 | 2 |
| 053 | 010000010010 | 3 | 000101000101 | 2 | 100010101010 | 3 | 000101000101 | 2 |
| 054 | 010000010010 | 4 | 000100010000 | 1 | 100010101010 | 4 | 000100010000 | 1 |
| 055 | 010000001001 | 2 | 000101001010 | 3 | 000010101010 | 3 | 010000001001 | 2 |
| 056 | 010000000100 | 3 | 000100010001 | 2 | 100100100010 | 3 | 000010010001 | 2 |
| 057 | 010000000100 | 4 | 000010010010 | 3 | 100100100101 | 2 | 000001010010 | 3 |
| 058 | 010100000010 | 3 | 001010000010 | 4 | 001000000010 | 4 | 010100000010 | 4 |
| 059 | 010100000010 | 4 | 000100000001 | 2 | 100100101001 | 2 | 000100000001 | 2 |
| 060 | 010100101000 | 3 | 001001010000 | 1 | 001001010000 | 1 | 010100010100 | 4 |

FIG. 7B

| Data Symbol | MCG1 Code Word (MSB LSB) | MCG1 Next Code Group | MCG2 Code Word (MSB LSB) | MCG2 Next Code Group | DCG1 Code Word (MSB LSB) | DCG1 Next Code Group | DCG2 Code Word (MSB LSB) | DCG2 Next Code Group |
|---|---|---|---|---|---|---|---|---|
| 061 | 010100101000 | 4 | 001000101000 | 3 | 001000101000 | 3 | 010101000000 | 1 |
| 062 | 010101010000 | 1 | 001000101000 | 4 | 001000101000 | 4 | 010101010000 | 1 |
| 063 | 101010101000 | 3 | 000010101010 | 4 | 000010101010 | 4 | 010101000001 | 2 |
| 064 | 101010101000 | 4 | 000010100101 | 2 | 000010100101 | 2 | 010101000010 | 3 |
| 065 | 101010100000 | 1 | 001000010100 | 3 | 001000010100 | 3 | 010101000010 | 4 |
| 066 | 101010010100 | 3 | 000010001000 | 3 | 101010010100 | 3 | 000010001000 | 3 |
| 067 | 101010010100 | 4 | 000010001000 | 4 | 101010010100 | 4 | 000010001000 | 4 |
| 068 | 101010001010 | 3 | 000001010101 | 2 | 101010001010 | 3 | 000001010101 | 2 |
| 069 | 101010001010 | 4 | 000001000100 | 3 | 101010001010 | 4 | 000001000100 | 3 |
| 070 | 101010000101 | 2 | 000001000100 | 4 | 101010000101 | 2 | 000001000100 | 4 |
| 071 | 101010000010 | 3 | 000001010010 | 4 | 101010000010 | 3 | 000001010010 | 4 |
| 072 | 101010000010 | 4 | 000001001001 | 2 | 101010000010 | 4 | 000001001001 | 2 |
| 073 | 101001010000 | 1 | 001000010100 | 4 | 001000010100 | 4 | 010101000101 | 2 |
| 074 | 101001000001 | 2 | 000000101010 | 3 | 101001000001 | 2 | 010101001010 | 3 |
| 075 | 101000101000 | 3 | 001000001010 | 3 | 001000001010 | 3 | 100000001000 | 3 |
| 076 | 101000101000 | 4 | 001000001010 | 4 | 001000001010 | 4 | 100000001000 | 4 |
| 077 | 101000100000 | 1 | 000000100010 | 3 | 101000100000 | 1 | 100000001010 | 4 |
| 078 | 101000010100 | 3 | 001000000101 | 2 | 001000000101 | 2 | 100000010001 | 2 |
| 079 | 101000010100 | 4 | 000010000000 | 1 | 101000010100 | 3 | 100000010010 | 4 |
| 080 | 101000001010 | 3 | 001010010000 | 1 | 001010010000 | 1 | 100001000001 | 2 |
| 081 | 101000001010 | 4 | 001001001000 | 3 | 001001001000 | 3 | 100001000010 | 3 |
| 082 | 101000000101 | 2 | 001001001000 | 4 | 001001001000 | 4 | 100001000010 | 4 |
| 083 | 101000000010 | 3 | 001010100001 | 2 | 001010100001 | 2 | 100001000100 | 3 |
| 084 | 101000000010 | 4 | 001010010001 | 2 | 001010010001 | 2 | 100001000101 | 2 |
| 085 | 100101010100 | 3 | 000000100010 | 4 | 100100101010 | 3 | 100101010100 | 3 |
| 086 | 100101010100 | 4 | 000000010001 | 2 | 100100101010 | 4 | 100101010100 | 4 |
| 087 | 100101001010 | 1 | 010101001000 | 3 | 101000000001 | 2 | 010101001000 | 3 |
| 088 | 100101000101 | 2 | 010101001000 | 4 | 101000000010 | 3 | 010101001000 | 4 |
| 089 | 100101000010 | 1 | 000000101010 | 4 | 101000000010 | 4 | 100101000010 | 3 |
| 090 | 100100100001 | 2 | 000000100101 | 2 | 100100100001 | 2 | 100001001001 | 2 |
| 091 | 100100010000 | 1 | 010100100100 | 3 | 010100100100 | 3 | 100100010000 | 1 |
| 092 | 100100000001 | 2 | 001000101001 | 2 | 001000101001 | 2 | 100100000001 | 2 |
| 093 | 100010101010 | 1 | 010100100100 | 4 | 010100100100 | 4 | 100001001010 | 3 |
| 094 | 100010100101 | 2 | 010100010010 | 3 | 100010100101 | 2 | 010101001010 | 3 |
| 095 | 100010100010 | 1 | 010101010001 | 2 | 100010100010 | 4 | 010101010001 | 2 |
| 096 | 100010010001 | 2 | 010100101001 | 2 | 010100101001 | 2 | 100010010001 | 2 |
| 097 | 100010001000 | 3 | 010100010100 | 4 | 101000000101 | 2 | 010100010010 | 4 |
| 098 | 100010001000 | 4 | 010100001001 | 2 | 101000001000 | 3 | 010100001001 | 2 |
| 099 | 100010000000 | 1 | 001000100100 | 3 | 001000100100 | 3 | 100010000000 | 1 |
| 100 | 100001010101 | 2 | 010010101000 | 3 | 010010101000 | 3 | 100001010101 | 2 |
| 101 | 100001010010 | 1 | 010100010101 | 2 | 101000001000 | 4 | 010100010101 | 2 |
| 102 | 100001001001 | 2 | 010100000100 | 3 | 101000001010 | 3 | 010100000100 | 3 |
| 103 | 100001000100 | 3 | 010010101000 | 4 | 010010101000 | 4 | 100001000100 | 4 |
| 104 | 100001000100 | 4 | 010010010100 | 3 | 101000001010 | 4 | 010010010100 | 3 |
| 105 | 100000101010 | 1 | 010100000100 | 4 | 100000101010 | 4 | 010100000100 | 4 |
| 106 | 100000100101 | 2 | 010010000010 | 3 | 100000100101 | 2 | 010010000010 | 3 |
| 107 | 100000100001 | 1 | 010010010100 | 4 | 100000100010 | 4 | 010010010100 | 4 |
| 108 | 100000010001 | 2 | 010010001010 | 3 | 101000010001 | 2 | 010010001010 | 3 |
| 109 | 100000001000 | 3 | 010010000010 | 4 | 101000010010 | 3 | 010010000010 | 4 |
| 110 | 100000001000 | 4 | 010001000001 | 2 | 101000010010 | 4 | 010001000001 | 2 |
| 111 | 010101001001 | 2 | 001010101001 | 2 | 001010101001 | 2 | 100001001010 | 4 |
| 112 | 010101000101 | 2 | 010010001010 | 4 | 101000010100 | 4 | 010010001010 | 4 |
| 113 | 010100010000 | 1 | 010010000101 | 2 | 101000100100 | 3 | 010010000101 | 2 |
| 114 | 010010100010 | 3 | 001010010101 | 2 | 001010010101 | 2 | 100001010000 | 1 |
| 115 | 010010100010 | 4 | 001010000100 | 3 | 001010000100 | 3 | 100001010010 | 3 |
| 116 | 010010000101 | 2 | 010000100000 | 1 | 010000100000 | 1 | 100001010010 | 4 |
| 117 | 010010010001 | 2 | 001010000100 | 4 | 001010000100 | 4 | 010010010001 | 2 |
| 118 | 010010001000 | 3 | 001010100100 | 3 | 001010100100 | 3 | 010010001000 | 3 |
| 119 | 010010001000 | 4 | 001010100100 | 4 | 001010100100 | 4 | 010010001000 | 4 |
| 120 | 010001010101 | 2 | 001010010010 | 3 | 001010010010 | 3 | 010001010101 | 2 |

FIG. 7C

| Data Symbol | MCG1 Code Word (MSB LSB) | MCG1 Next Code Group | MCG2 Code Word (MSB LSB) | MCG2 Next Code Group | DCG1 Code Word (MSB LSB) | DCG1 Next Code Group | DCG2 Code Word (MSB LSB) | DCG2 Next Code Group |
|---|---|---|---|---|---|---|---|---|
| 121 | 010001010010 | 3 | 001001000010 | 3 | 001001000010 | 3 | 010001010010 | 3 |
| 122 | 010001010010 | 4 | 001001000010 | 4 | 001001000010 | 4 | 010001010010 | 4 |
| 123 | 010001001001 | 2 | 001000100001 | 2 | 001000100001 | 2 | 010001001001 | 2 |
| 124 | 010001000100 | 3 | 001010010010 | 4 | 001010010010 | 4 | 010001000100 | 3 |
| 125 | 010001000100 | 4 | 001010001001 | 2 | 001010001001 | 2 | 010001000100 | 4 |
| 126 | 010000010001 | 2 | 001001010100 | 3 | 001001010100 | 3 | 010000010001 | 2 |
| 127 | 010101010100 | 3 | 001001010100 | 4 | 001001010100 | 4 | 010101010100 | 3 |
| 128 | 010101010100 | 4 | 001001001010 | 3 | 001001001010 | 3 | 010101010100 | 4 |
| 129 | 010101000010 | 3 | 000101010101 | 2 | 101000101101 | 2 | 000101010101 | 2 |
| 130 | 010101000010 | 4 | 000101000100 | 3 | 101000101000 | 3 | 000101000100 | 3 |
| 131 | 010010101010 | 3 | 001001001010 | 4 | 001001001010 | 4 | 100001010100 | 3 |
| 132 | 010010101010 | 4 | 001001000101 | 2 | 001001000101 | 2 | 100001010100 | 4 |
| 133 | 010101001010 | 3 | 001000010000 | 1 | 001000010000 | 1 | 010101001010 | 4 |
| 134 | 010101001010 | 4 | 000101001010 | 3 | 101000101010 | 4 | 000101010010 | 3 |
| 135 | 010000101010 | 3 | 000101000100 | 4 | 010000101010 | 4 | 000101000100 | 4 |
| 136 | 010000101010 | 4 | 000100100010 | 3 | 000100100010 | 3 | 100010000001 | 2 |
| 137 | 010000100101 | 2 | 000100100010 | 4 | 000100100010 | 4 | 100010000010 | 3 |
| 138 | 010000100010 | 3 | 000101010010 | 4 | 010000100010 | 3 | 000101010010 | 4 |
| 139 | 010000100010 | 4 | 000101001001 | 2 | 010000100010 | 4 | 000101001001 | 2 |
| 140 | 010000001000 | 3 | 000100010001 | 2 | 101000101001 | 2 | 000100010001 | 2 |
| 141 | 010000001000 | 4 | 000010100100 | 3 | 000010100100 | 3 | 010000001000 | 4 |
| 142 | 101010101001 | 2 | 000010100100 | 4 | 000010100100 | 4 | 100010000010 | 4 |
| 143 | 101010100100 | 3 | 000100101010 | 3 | 000100101010 | 3 | 100010000100 | 3 |
| 144 | 101010100100 | 4 | 000100101010 | 4 | 000100101010 | 4 | 100010000100 | 4 |
| 145 | 101010100001 | 2 | 001000010101 | 2 | 001000010101 | 2 | 100010001000 | 3 |
| 146 | 101010010101 | 2 | 000010010010 | 3 | 101010010101 | 2 | 000010010010 | 3 |
| 147 | 101010010010 | 3 | 000100100101 | 2 | 000100100101 | 2 | 100010010000 | 4 |
| 148 | 101010010010 | 4 | 000100001000 | 3 | 101010010010 | 3 | 000100001000 | 3 |
| 149 | 101010010000 | 1 | 001000100100 | 4 | 001000100100 | 4 | 100010001001 | 2 |
| 150 | 101010001001 | 2 | 000100001000 | 4 | 101010001001 | 2 | 000100001000 | 4 |
| 151 | 101010000100 | 3 | 000010010010 | 4 | 101010000100 | 3 | 000010010010 | 4 |
| 152 | 101010000100 | 4 | 000010001001 | 2 | 101010000100 | 4 | 000010001001 | 2 |
| 153 | 101001010100 | 3 | 000010101001 | 2 | 000010101001 | 2 | 100010001010 | 3 |
| 154 | 101001010100 | 4 | 000010010101 | 2 | 101001010100 | 3 | 000010010101 | 2 |
| 155 | 101001010001 | 2 | 001000000100 | 3 | 001000000100 | 3 | 100010001010 | 4 |
| 156 | 101001001010 | 3 | 000010000100 | 3 | 101001001010 | 3 | 000010000100 | 3 |
| 157 | 101001001010 | 4 | 000010000100 | 4 | 101001001010 | 4 | 000010000100 | 4 |
| 158 | 101001001000 | 3 | 001000010010 | 3 | 001000010010 | 3 | 100010010000 | 1 |
| 159 | 101001001000 | 4 | 001000010010 | 4 | 001000010010 | 4 | 100010010010 | 3 |
| 160 | 101001000101 | 2 | 000001000010 | 3 | 101001000101 | 2 | 000001000010 | 3 |
| 161 | 101001000010 | 3 | 000001010100 | 3 | 101001000010 | 3 | 000001010100 | 3 |
| 162 | 101001000010 | 4 | 000001010100 | 4 | 101001000010 | 4 | 000001010100 | 4 |
| 163 | 101000101001 | 2 | 001000000100 | 4 | 001000000100 | 4 | 100010010100 | 3 |
| 164 | 101000100100 | 3 | 001000001001 | 2 | 001000001001 | 2 | 100010010100 | 4 |
| 165 | 101000100100 | 4 | 000101010000 | 1 | 101000100100 | 4 | 000101010000 | 1 |
| 166 | 101000100001 | 2 | 000000100010 | 3 | 101000100001 | 2 | 000000100001 | 3 |
| 167 | 101000010101 | 2 | 000100000010 | 3 | 101000010101 | 2 | 000100000010 | 3 |
| 168 | 101000010010 | 3 | 000100101000 | 3 | 000100101000 | 3 | 100010010101 | 2 |
| 169 | 101000010010 | 4 | 000100101000 | 4 | 000100101000 | 4 | 100100000010 | 3 |
| 170 | 101000010000 | 1 | 000001000010 | 4 | 101000010000 | 1 | 000001000010 | 4 |
| 171 | 101000001010 | 2 | 000100001010 | 3 | 101000001010 | 2 | 000100010100 | 3 |
| 172 | 101000000100 | 3 | 000100000010 | 4 | 101000000100 | 3 | 000100000010 | 4 |
| 173 | 101000000100 | 4 | 000010000001 | 2 | 101000000100 | 4 | 000010000001 | 2 |
| 174 | 100101010101 | 2 | 000001001010 | 4 | 101000101010 | 3 | 000001001010 | 4 |
| 175 | 100101010010 | 1 | 000000100001 | 2 | 101000101010 | 4 | 100101010010 | 3 |
| 176 | 100101010000 | 1 | 000100010100 | 4 | 101000101000 | 3 | 000100010100 | 4 |
| 177 | 100101001001 | 2 | 010101010101 | 2 | 101001000100 | 4 | 010101010101 | 2 |
| 178 | 100101000100 | 3 | 000001000101 | 2 | 101001001000 | 3 | 000001000101 | 2 |
| 179 | 100101000100 | 4 | 000000010000 | 1 | 101001001000 | 4 | 100101000100 | 3 |
| 180 | 100100101010 | 1 | 010100100010 | 3 | 010100100010 | 3 | 100100000100 | 3 |

FIG. 7D

| Data Symbol | MCG1 Code Word MSB LSB | Next Code Group | MCG2 Code Word MSB LSB | Next Code Group | DCG1 Code Word MSB LSB | Next Code Group | DCG2 Code Word MSB LSB | Next Code Group |
|---|---|---|---|---|---|---|---|---|
| 121 | 010001010010 | 3 | 001001000010 | 3 | 001001000010 | 3 | 010001010010 | 3 |
| 122 | 010001010010 | 4 | 001001000010 | 4 | 001001000010 | 4 | 010001010010 | 4 |
| 123 | 010001001001 | 2 | 001000100001 | 2 | 001000100001 | 2 | 010001001001 | 2 |
| 124 | 010001000100 | 3 | 001010010010 | 4 | 001010010010 | 4 | 010001000100 | 3 |
| 125 | 010001000100 | 4 | 001010001001 | 2 | 001010001001 | 2 | 010001000100 | 4 |
| 126 | 010000010001 | 2 | 001001010100 | 3 | 001001010100 | 3 | 010000010001 | 2 |
| 127 | 010101010100 | 3 | 001001010100 | 4 | 001001010100 | 4 | 010101010100 | 3 |
| 128 | 010101010100 | 4 | 001001001010 | 3 | 001001001010 | 3 | 010101010100 | 4 |
| 129 | 010101000010 | 3 | 000101010101 | 2 | 101000100101 | 2 | 000101010101 | 2 |
| 130 | 010101000010 | 4 | 000101000100 | 3 | 101000101000 | 3 | 000101000100 | 3 |
| 131 | 010010101010 | 3 | 001001001010 | 4 | 001001001010 | 4 | 100001010100 | 3 |
| 132 | 010010101010 | 4 | 001001000101 | 2 | 001001000101 | 2 | 100001010100 | 4 |
| 133 | 010101001010 | 3 | 001000010000 | 1 | 001000010000 | 1 | 010101001010 | 4 |
| 134 | 010101001010 | 4 | 000101010010 | 3 | 101000101000 | 4 | 000101010010 | 3 |
| 135 | 010000101010 | 3 | 000101000100 | 4 | 010000101010 | 4 | 000101000100 | 4 |
| 136 | 010000101010 | 4 | 000100100010 | 3 | 000100100010 | 3 | 100010000001 | 2 |
| 137 | 010000100101 | 2 | 000100100010 | 4 | 000100100010 | 4 | 100010000010 | 3 |
| 138 | 010000100010 | 3 | 000101010010 | 4 | 010000100010 | 3 | 000101010010 | 4 |
| 139 | 010000100010 | 4 | 000101001001 | 2 | 010000100010 | 4 | 000101001001 | 2 |
| 140 | 010000001000 | 3 | 000100010001 | 2 | 101000101001 | 2 | 000100010001 | 2 |
| 141 | 010000001000 | 4 | 000010100100 | 3 | 000010100100 | 3 | 010000001000 | 4 |
| 142 | 101010101001 | 2 | 000010100100 | 4 | 000010100100 | 4 | 100010000010 | 4 |
| 143 | 101010100100 | 3 | 000100101010 | 3 | 000100101010 | 3 | 100010000100 | 3 |
| 144 | 101010100100 | 4 | 000100101010 | 4 | 000100101010 | 4 | 100010000100 | 4 |
| 145 | 101010100001 | 2 | 001000010101 | 2 | 001000010101 | 2 | 100010001000 | 3 |
| 146 | 101010010101 | 2 | 000010100010 | 3 | 101010010101 | 2 | 000010100010 | 3 |
| 147 | 101010010010 | 3 | 000100100101 | 2 | 000100100101 | 2 | 100010001000 | 4 |
| 148 | 101010010010 | 4 | 000100001010 | 3 | 101010010010 | 3 | 000100001000 | 3 |
| 149 | 101010100000 | 1 | 001000100100 | 4 | 001000100100 | 4 | 100010001001 | 2 |
| 150 | 101010001001 | 2 | 000100001000 | 4 | 101010001001 | 2 | 000100001000 | 4 |
| 151 | 101010000100 | 3 | 000010010010 | 4 | 101010000100 | 3 | 000010010010 | 4 |
| 152 | 101010000100 | 4 | 000010001001 | 2 | 101010000100 | 4 | 000010001001 | 2 |
| 153 | 101001010100 | 3 | 000010101001 | 2 | 000010101001 | 2 | 100010001010 | 3 |
| 154 | 101001010100 | 4 | 000010010101 | 2 | 101001010100 | 3 | 000010010101 | 2 |
| 155 | 101001010001 | 2 | 001000000100 | 3 | 001000000100 | 3 | 100010001010 | 4 |
| 156 | 101001001010 | 3 | 000010000100 | 3 | 101001001010 | 3 | 000010000100 | 3 |
| 157 | 101001001010 | 4 | 000010000100 | 4 | 101001001010 | 4 | 000010000100 | 4 |
| 158 | 101001001000 | 3 | 001000010010 | 3 | 001000010010 | 3 | 100010010000 | 1 |
| 159 | 101001001000 | 4 | 001000010010 | 4 | 001000010010 | 4 | 100010010010 | 3 |
| 160 | 101001000101 | 2 | 000001000010 | 3 | 101001000101 | 2 | 000001000010 | 3 |
| 161 | 101001000010 | 3 | 000001010100 | 3 | 101001000010 | 3 | 000001010100 | 3 |
| 162 | 101001000010 | 4 | 000001010100 | 4 | 101001000010 | 4 | 000001010100 | 4 |
| 163 | 101000101001 | 2 | 001000000100 | 4 | 001000000100 | 4 | 100010010100 | 3 |
| 164 | 101000100100 | 3 | 001000001001 | 2 | 001000001001 | 2 | 100010010100 | 4 |
| 165 | 101000100100 | 4 | 000101010000 | 1 | 101000100100 | 4 | 000101010000 | 1 |
| 166 | 101000100001 | 2 | 000001001010 | 3 | 101000100001 | 2 | 000001001010 | 3 |
| 167 | 101000010101 | 2 | 000100000010 | 3 | 101000010101 | 2 | 000100000010 | 3 |
| 168 | 101000010010 | 3 | 000100101000 | 3 | 000100101000 | 3 | 100010010101 | 2 |
| 169 | 101000010010 | 4 | 000100101000 | 4 | 000100101000 | 4 | 100100000010 | 3 |
| 170 | 101000010000 | 1 | 000001000010 | 4 | 101000010000 | 1 | 000001000010 | 4 |
| 171 | 101000001001 | 2 | 000100010100 | 3 | 101000001001 | 2 | 000100010100 | 3 |
| 172 | 101000000100 | 3 | 000100000010 | 4 | 101000000100 | 3 | 000100000010 | 4 |
| 173 | 101000000100 | 4 | 000010000001 | 2 | 101000000100 | 4 | 000010000001 | 2 |
| 174 | 100101010101 | 2 | 000001001010 | 4 | 101001101010 | 3 | 000001001010 | 4 |
| 175 | 100101010010 | 1 | 000000100001 | 2 | 101001101010 | 4 | 100101010010 | 3 |
| 176 | 100101010000 | 1 | 000100010100 | 4 | 101001000100 | 3 | 000100010100 | 4 |
| 177 | 100101001001 | 2 | 010101010101 | 2 | 101001000100 | 4 | 010101010101 | 2 |
| 178 | 100101000100 | 3 | 000001000101 | 2 | 101001001000 | 3 | 000001000101 | 2 |
| 179 | 100101000100 | 4 | 000000010000 | 1 | 101001001000 | 4 | 100101000100 | 3 |
| 180 | 100100101010 | 1 | 010101000010 | 3 | 010100100010 | 3 | 100100000100 | 3 |

FIG. 7E

| Data Symbol | MCG1 Code Word MSB...LSB | MCG1 Next Code Group | MCG2 Code Word MSB...LSB | MCG2 Next Code Group | DCG1 Code Word MSB...LSB | DCG1 Next Code Group | DCG2 Code Word MSB...LSB | DCG2 Next Code Group |
|---|---|---|---|---|---|---|---|---|
| 241 | 100100100100 | 4 | 000100001001 | 2 | 100100100100 | 4 | 000100001001 | 2 |
| 242 | 100100010101 | 2 | 000100010101 | 2 | 101010100010 | 4 | 000100010101 | 2 |
| 243 | 100100010010 | 1 | 000010101000 | 3 | 000010101000 | 3 | 100100010010 | 4 |
| 244 | 100100001001 | 2 | 000010101000 | 4 | 000010101000 | 4 | 100100001001 | 2 |
| 245 | 100100000100 | 3 | 000100000100 | 3 | 101010100100 | 3 | 000100000100 | 3 |
| 246 | 100100000100 | 4 | 000100000100 | 4 | 101010100100 | 4 | 000100000100 | 4 |
| 247 | 100010101000 | 3 | 000010010100 | 3 | 100010101000 | 3 | 000010010100 | 3 |
| 248 | 100010101000 | 4 | 000010010100 | 4 | 100010101000 | 4 | 000010010100 | 4 |
| 249 | 100010010100 | 3 | 000010001010 | 3 | 101010100101 | 2 | 000010001010 | 3 |
| 250 | 100010010100 | 4 | 000010001010 | 4 | 101010101000 | 3 | 000010001010 | 4 |
| 251 | 100010001010 | 1 | 000010000101 | 2 | 101010101000 | 4 | 000010000101 | 2 |
| 252 | 100010000101 | 2 | 000000100000 | 1 | 101010101001 | 2 | 100010000101 | 2 |
| 253 | 100010000010 | 1 | 000010100000 | 3 | 101010101010 | 3 | 000010000010 | 3 |
| 254 | 100001000001 | 2 | 000010000010 | 4 | 101010101010 | 4 | 000010000010 | 4 |
| 255 | 100000100000 | 1 | 000001000001 | 2 | 100000100000 | 1 | 000001000001 | 2 |

FIG. 8

| Data Symbol | DSV Code Group Code Word MSB...LSB | Next Code Group | Data Symbol | DSV Code Group Code Word MSB...LSB | Next Code Group |
|---|---|---|---|---|---|
| 000 | 010101000000 | 1 | 035 | 010001000100 | 3 |
| 001 | 010010100000 | 1 | 036 | 010001000100 | 4 |
| 002 | 010001010000 | 1 | 037 | 010000000100 | 3 |
| 003 | 010000101000 | 3 | 038 | 010000010001 | 2 |
| 004 | 010000101000 | 4 | 039 | 010101010100 | 3 |
| 005 | 010000010100 | 3 | 040 | 010000000100 | 4 |
| 006 | 010000010100 | 4 | 041 | 010100100001 | 2 |
| 007 | 010000001010 | 3 | 042 | 010010100010 | 3 |
| 008 | 010000001010 | 4 | 043 | 010101010100 | 4 |
| 009 | 010000000101 | 2 | 044 | 010010100010 | 4 |
| 010 | 010100100000 | 1 | 045 | 010010101010 | 3 |
| 011 | 010010010000 | 1 | 046 | 010010010001 | 2 |
| 012 | 010001001000 | 3 | 047 | 010010101010 | 4 |
| 013 | 010001001000 | 4 | 048 | 010101001010 | 3 |
| 014 | 010000100100 | 3 | 049 | 010001010010 | 3 |
| 015 | 010000100100 | 4 | 050 | 010101001010 | 4 |
| 016 | 010000010010 | 3 | 051 | 010000100010 | 3 |
| 017 | 010000010010 | 4 | 052 | 010001010010 | 4 |
| 018 | 010000001001 | 2 | 053 | 010000100010 | 4 |
| 019 | 010101000101 | 2 | 054 | 010100101010 | 3 |
| 020 | 010000000010 | 3 | 055 | 010100101010 | 4 |
| 021 | 010000000010 | 4 | 056 | 010001001001 | 2 |
| 022 | 010010000000 | 1 | 057 | 010101000010 | 3 |
| 023 | 010100000001 | 2 | 058 | 010100000010 | 4 |
| 024 | 010101000001 | 2 | 059 | 010100101000 | 3 |
| 025 | 010100010000 | 1 | 060 | 010100101000 | 4 |
| 026 | 010100000010 | 3 | 061 | 010101010000 | 1 |
| 027 | 010010100001 | 2 | 062 | 010101000010 | 4 |
| 028 | 010010100101 | 2 | 063 | 010000101010 | 3 |
| 029 | 010001010001 | 2 | 064 | 010000101010 | 4 |
| 030 | 010010001000 | 3 | 065 | 010000100101 | 2 |
| 031 | 010000101001 | 2 | 066 | 010000001000 | 3 |
| 032 | 010010001000 | 4 | 067 | 010000001000 | 4 |
| 033 | 010001010101 | 2 | 068 | 010101000100 | 3 |
| 034 | 010000010101 | 2 | 069 | 010101000100 | 4 |

FIG. 9A

| Data Symbol | MCG1 Code Word MSB LSB | MCG1 Next Code Group | MCG2 Code Word MSB LSB | MCG2 Next Code Group | DCG1 Code Word MSB LSB | DCG1 Next Code Group | DCG2 Code Word MSB LSB | DCG2 Next Code Group |
|---|---|---|---|---|---|---|---|---|
| 000 | 0101010000000 | 1 | x001010000000 | 1 | x001010000000 | 1 | x010000000010 | 3 |
| 001 | 0100101000000 | 1 | x000101000000 | 1 | x010000100101 | 2 | x000101000000 | 1 |
| 002 | 0100010100000 | 1 | x000010100000 | 1 | x000010100000 | 1 | x010000000100 | 3 |
| 003 | 0100001010000 | 1 | x000001010000 | 1 | x010000101001 | 2 | x000001010000 | 1 |
| 004 | 0100000101000 | 3 | x000000101000 | 3 | 0100000101000 | 3 | x010000000100 | 4 |
| 005 | 0100000101000 | 4 | x000000101000 | 4 | 0100000101000 | 4 | x010000001000 | 3 |
| 006 | 0100000010100 | 3 | x000000010100 | 3 | x010000101010 | 3 | 0100000010100 | 3 |
| 007 | 0100000010100 | 4 | x000000010100 | 4 | x010010100010 | 3 | 0100000010100 | 4 |
| 008 | 0100000001010 | 1 | x001001000000 | 1 | x001001000000 | 1 | 0100000001010 | 3 |
| 009 | 0100000000101 | 2 | x000100100000 | 1 | x000100100000 | 1 | 0100000000101 | 2 |
| 010 | x010101000000 | 1 | x000100100000 | 1 | x010010100010 | 4 | x000010010000 | 1 |
| 011 | x010010100000 | 1 | x000001001000 | 3 | x010010100000 | 1 | x000001001000 | 3 |
| 012 | x010001010000 | 1 | x000001001000 | 4 | x010010100101 | 2 | x000001001000 | 4 |
| 013 | x010000101000 | 3 | x000000100100 | 3 | x010000101000 | 3 | x010000010010 | 3 |
| 014 | x010000101000 | 4 | x000000100100 | 4 | x010000101000 | 4 | x010000010010 | 4 |
| 015 | x010000010100 | 3 | x000000010010 | 3 | x010010101010 | 3 | x010000010100 | 3 |
| 016 | x010000010100 | 4 | x000000010010 | 4 | x010010101010 | 4 | x010000010100 | 4 |
| 017 | x010000001010 | 3 | x010100010100 | 3 | x010100100000 | 1 | x010000001010 | 3 |
| 018 | x010000001010 | 4 | x010100010100 | 4 | x010100100001 | 2 | x010000001010 | 4 |
| 019 | x010000000101 | 2 | x010100001010 | 3 | x010100101000 | 3 | x010000000101 | 2 |
| 020 | x010000000010 | 3 | x001010000001 | 2 | x001010000001 | 2 | x010000000010 | 4 |
| 021 | x010000000010 | 4 | x000101000001 | 2 | x010100101000 | 4 | x000101000001 | 2 |
| 022 | x010010000000 | 1 | x001010100000 | 1 | x001010100000 | 1 | x010010000000 | 1 |
| 023 | x010100000001 | 2 | x001000000001 | 2 | x001000000001 | 2 | x010100000001 | 2 |
| 024 | 0101010000001 | 2 | x000010100001 | 2 | x000010100001 | 2 | x010001001000 | 3 |
| 025 | 0101001000000 | 1 | x010100001010 | 4 | 0101001000000 | 1 | x010100001010 | 3 |
| 026 | 0101000000001 | 2 | x001000000010 | 3 | x001000000010 | 3 | x010001001000 | 4 |
| 027 | 0100101000001 | 2 | x000000010001 | 2 | 0100000100010 | 3 | x000001010001 | 2 |
| 028 | 0100010100001 | 1 | x010100000101 | 2 | 0100100100000 | 1 | x010010000101 | 2 |
| 029 | 0100010100001 | 2 | x000000101001 | 2 | 0100010100001 | 2 | x010001010000 | 1 |
| 030 | 0100010010000 | 1 | x010001000000 | 1 | 0100000100100 | 3 | x010001000000 | 1 |
| 031 | 0100001010001 | 2 | x000000010101 | 2 | 0100000100100 | 4 | 0100001010001 | 2 |
| 032 | 0100001001000 | 3 | x001010101000 | 3 | x010010101010 | 3 | 0100001001000 | 3 |
| 033 | 0100001001000 | 4 | x001010101000 | 4 | x001010101000 | 4 | 0100001001000 | 4 |
| 034 | 0100000101001 | 2 | x010010000001 | 2 | 0100000101001 | 2 | x010010000001 | 2 |
| 035 | 0100000100100 | 3 | x001010010100 | 3 | x001010010100 | 3 | x010100000010 | 3 |
| 036 | 0100000100100 | 4 | x001010010100 | 4 | x001010010100 | 4 | x010100001010 | 4 |
| 037 | 0100000010101 | 2 | x001010000101 | 3 | x001010000101 | 3 | 0100000010101 | 2 |
| 038 | 0100000010010 | 1 | x001010001010 | 3 | x001010001010 | 3 | 0100000010010 | 3 |
| 039 | 0100000001001 | 2 | x001010001010 | 4 | x001010001010 | 4 | 0100000001001 | 2 |
| 040 | 0100000000100 | 3 | x001010000010 | 4 | x001010000010 | 4 | 0100000000100 | 3 |
| 041 | 0100000000100 | 4 | x001001000001 | 2 | x001001000001 | 2 | 0100000000100 | 4 |
| 042 | x010101000001 | 2 | x000101000010 | 3 | 0100000101010 | 3 | x000101000010 | 3 |
| 043 | x010100100000 | 1 | x001010000101 | 2 | x001010000101 | 2 | x010100010000 | 1 |
| 044 | x010010100001 | 2 | x000101000010 | 4 | x010010100001 | 2 | x000101000010 | 4 |
| 045 | x010010010000 | 1 | x001000100000 | 1 | x001000100000 | 1 | x010010010000 | 1 |
| 046 | x010001010001 | 2 | x000100100001 | 2 | x000100100001 | 2 | x010001010001 | 2 |
| 047 | x010001001000 | 3 | x000101010010 | 3 | 0100001010100 | 1 | x000101010100 | 3 |
| 048 | x010001001000 | 4 | x000101010100 | 4 | 0100010100010 | 3 | x000101010100 | 4 |
| 049 | x010000101001 | 2 | x000010100010 | 3 | x000010100010 | 3 | x010100010100 | 3 |
| 050 | x010000100100 | 3 | x000101001010 | 3 | x010000100100 | 3 | x000101001010 | 3 |
| 051 | x010000100100 | 4 | x000101001010 | 4 | x010000100100 | 4 | x000101001010 | 4 |
| 052 | x010000010101 | 2 | x000010100010 | 4 | x000010100010 | 4 | x010000010101 | 2 |
| 053 | x010000010010 | 3 | x000101000101 | 2 | 0100010101010 | 3 | x000101000101 | 2 |
| 054 | x010000010010 | 4 | x000100010000 | 1 | 0100010101010 | 4 | x000100010000 | 1 |
| 055 | x010000001001 | 2 | x000010101010 | 3 | x000010101010 | 3 | x010000001001 | 2 |
| 056 | x010000000100 | 3 | x000001000001 | 2 | 0100010100010 | 3 | x000010010001 | 2 |
| 057 | x010000000100 | 4 | x000001010010 | 3 | 0100010100010 | 4 | x000000010010 | 3 |
| 058 | x010100000010 | 3 | x001000000010 | 4 | x001000000010 | 4 | x010100000010 | 4 |
| 059 | x010100000010 | 4 | x000100000001 | 2 | 0100100101001 | 2 | x000100000001 | 2 |
| 060 | x010100101000 | 3 | x001001010000 | 1 | x001001010000 | 1 | x010100010100 | 4 |

FIG. 9B

| Data Symbol | NCG1 Code Word MSB  LSB | NCG1 Next Code Group | NCG2 Code Word MSB  LSB | NCG2 Next Code Group | DCG1 Code Word MSB  LSB | DCG1 Next Code Group | DCG2 Code Word MSB  LSB | DCG2 Next Code Group |
|---|---|---|---|---|---|---|---|---|
| 061 | x010100101000 | 4 | x001000101000 | 3 | x001000101000 | 3 | x010101000000 | 1 |
| 062 | x010101010000 | 1 | x001000101000 | 4 | x001000101000 | 4 | x010101010000 | 1 |
| 063 | 0101010101000 | 3 | x000010101010 | 4 | x000010101010 | 4 | x010101000001 | 2 |
| 064 | 0101010101000 | 4 | x000010100101 | 2 | x000010100101 | 2 | x010101000010 | 3 |
| 065 | 0101010100000 | 1 | x001000010100 | 3 | x001000010100 | 3 | x010101000010 | 4 |
| 066 | 0101010010100 | 3 | x000010001000 | 3 | 0101010010100 | 3 | x000010001000 | 3 |
| 067 | 0101010010100 | 4 | x000010001000 | 4 | 0101010010100 | 4 | x000010001000 | 4 |
| 068 | 0101010001010 | 3 | x000001010101 | 2 | 0101010001010 | 3 | x000001010101 | 2 |
| 069 | 0101010001010 | 4 | x000001000100 | 3 | 0101010001010 | 4 | x000001000100 | 3 |
| 070 | 0101010000101 | 2 | x000001000100 | 4 | 0101010000101 | 2 | x000001000100 | 4 |
| 071 | 0101010000010 | 3 | x000010010010 | 4 | 0101010000010 | 3 | x000001010010 | 4 |
| 072 | 0101010000010 | 4 | x000001001001 | 2 | 0101010000010 | 4 | x000001001001 | 2 |
| 073 | 0101001010000 | 1 | x001000101000 | 4 | x001000010100 | 4 | x010101000101 | 2 |
| 074 | 0101001000001 | 2 | x000000101010 | 3 | 0101001000001 | 2 | x010101001010 | 3 |
| 075 | 0101000101000 | 3 | x001000001010 | 3 | x001000001010 | 3 | 0100000001000 | 3 |
| 076 | 0101000101000 | 4 | x001000001010 | 4 | x001000001010 | 4 | 0100000001000 | 4 |
| 077 | 0101000100000 | 1 | x000000100010 | 3 | 0101000100000 | 1 | 0100000001010 | 4 |
| 078 | 0101000010100 | 3 | x001000000101 | 2 | x001000000101 | 2 | 0100000010001 | 2 |
| 079 | 0101000010100 | 4 | x000010000000 | 1 | 0101000010100 | 3 | 0100000010010 | 4 |
| 080 | 0101000001010 | 3 | x001010010000 | 1 | x001010010000 | 1 | 0100001000001 | 2 |
| 081 | 0101000001010 | 4 | x001001001000 | 3 | x001001001000 | 3 | 0100001000010 | 3 |
| 082 | 0101000000101 | 2 | x001001001000 | 4 | x001001001000 | 4 | 0100001000010 | 4 |
| 083 | 0101000000010 | 3 | x001010100001 | 2 | x001010100001 | 2 | 0100001000100 | 3 |
| 084 | 0101000000010 | 4 | x001001010001 | 2 | x001001010001 | 2 | 0100001000101 | 2 |
| 085 | 0100101010100 | 3 | x000000100010 | 4 | 0100100101010 | 3 | 0100101010100 | 3 |
| 086 | 0100101010100 | 4 | x000000010001 | 2 | 0100100101010 | 4 | 0100101010100 | 4 |
| 087 | 0100101001010 | 1 | x010101001000 | 3 | 0101000000001 | 2 | x010101001000 | 3 |
| 088 | 0100101000101 | 2 | x010101001000 | 4 | 0101000000010 | 3 | x010101001000 | 4 |
| 089 | 0100101000010 | 1 | x000000101010 | 4 | 0101000000010 | 4 | 0100101000010 | 3 |
| 090 | 0100100100101 | 2 | x000000100101 | 2 | 0101000000101 | 2 | 0100000101001 | 2 |
| 091 | 0100100010000 | 1 | x010100100100 | 3 | x010100100100 | 3 | 0100100010000 | 1 |
| 092 | 0100100000001 | 2 | x001000101001 | 2 | x001000101001 | 2 | 0100100000001 | 2 |
| 093 | 0100010101010 | 1 | x010100100100 | 4 | x010100100100 | 4 | 0100001001010 | 3 |
| 094 | 0100010100101 | 2 | x010100010010 | 3 | 0100010100101 | 2 | x010100010010 | 3 |
| 095 | 0100010100010 | 1 | x010101010001 | 2 | 0100101010010 | 4 | x010101010001 | 2 |
| 096 | 0100010010001 | 2 | x010100101001 | 2 | x010100101001 | 2 | 0100010010001 | 2 |
| 097 | 0100010001000 | 3 | x010100010010 | 4 | 0101000000101 | 2 | x010100010010 | 4 |
| 098 | 0100010001000 | 4 | x010100001001 | 2 | 0101000001000 | 3 | x010100001001 | 2 |
| 099 | 0100010000000 | 1 | x001000100100 | 3 | x001000100100 | 3 | 0100000000000 | 1 |
| 100 | 0100001010101 | 2 | x010010101000 | 3 | x010010101000 | 3 | 0100001010101 | 2 |
| 101 | 0100001010010 | 1 | x010100010101 | 2 | 0101000001000 | 4 | x010100010101 | 2 |
| 102 | 0100001001001 | 2 | x010100000100 | 3 | 0101000001010 | 3 | x010100000100 | 3 |
| 103 | 0100001000100 | 3 | x010010101000 | 4 | x010010101000 | 4 | 0100001000100 | 4 |
| 104 | 0100001000100 | 4 | x010010010100 | 3 | 0101010100100 | 4 | x010010010100 | 3 |
| 105 | 0100000101010 | 1 | x010100100100 | 4 | 0100000101010 | 4 | x010100000100 | 4 |
| 106 | 0100000100101 | 2 | x010010000010 | 3 | 0100000100101 | 2 | x010010000010 | 3 |
| 107 | 0100000100010 | 1 | x010010010100 | 4 | 0100000100010 | 4 | x010010010100 | 4 |
| 108 | 0100000010001 | 2 | x010010001000 | 3 | 0101000010001 | 2 | x010010001010 | 3 |
| 109 | 0100000001000 | 3 | x010010000010 | 4 | 0101000010010 | 3 | x010010001010 | 4 |
| 110 | 0100000001000 | 4 | x010001000001 | 2 | 0101000010010 | 4 | x010001000001 | 2 |
| 111 | x010100100001 | 2 | x001010101001 | 2 | x001010101001 | 2 | 0100001001010 | 4 |
| 112 | x010101000101 | 2 | x010010001010 | 4 | 0101000010100 | 4 | x010010001010 | 4 |
| 113 | x010100010000 | 1 | x010010000101 | 2 | 0101000010100 | 3 | x010010000101 | 2 |
| 114 | x010010100010 | 3 | x001010010101 | 2 | x001010010101 | 2 | 0100001010000 | 1 |
| 115 | x010010100010 | 4 | x001010000100 | 3 | x001010000100 | 3 | 0100001010010 | 3 |
| 116 | x010010100101 | 2 | x010000100000 | 1 | x010000100000 | 1 | 0100001010010 | 4 |
| 117 | x010010100001 | 2 | x001010000100 | 4 | x001010000100 | 4 | x010010010001 | 2 |
| 118 | x010010001000 | 3 | x010010100100 | 3 | x001010100100 | 3 | x010010001000 | 3 |
| 119 | x010010001000 | 4 | x001010100100 | 4 | x001010100100 | 4 | x010010001000 | 4 |
| 120 | x010001010101 | 2 | x001010010010 | 3 | x001010010010 | 3 | x010001010101 | 2 |

FIG. 9C

| Data Symbol | MCG1 Code Word (MSB - LSB) | MCG1 Next Code Group | MCG2 Code Word (MSB - LSB) | MCG2 Next Code Group | DCG1 Code Word (MSB - LSB) | DCG1 Next Code Group | DCG2 Code Word (MSB - LSB) | DCG2 Next Code Group |
|---|---|---|---|---|---|---|---|---|
| 121 | x010001010010 | 3 | x001001000010 | 3 | x001001000010 | 3 | x010001010010 | 3 |
| 122 | x010001010010 | 4 | x001001000010 | 4 | x001001000010 | 4 | x010001010010 | 4 |
| 123 | x010001001001 | 2 | x001000100001 | 2 | x001000100001 | 2 | x010001001001 | 2 |
| 124 | x010001000100 | 3 | x001010010010 | 4 | x001010010010 | 4 | x010001000100 | 3 |
| 125 | x010001000100 | 4 | x001010001001 | 2 | x001010001001 | 2 | x010001000100 | 4 |
| 126 | x010000010001 | 2 | x001001010100 | 3 | x001001010100 | 3 | x010000010001 | 2 |
| 127 | x010101010100 | 3 | x001001010100 | 4 | x001001010100 | 4 | x010101010100 | 3 |
| 128 | x010101010100 | 4 | x001001001010 | 3 | x001001001010 | 3 | x010101010100 | 4 |
| 129 | x010101000010 | 3 | x000101010101 | 2 | 0101000100101 | 2 | x000101010101 | 2 |
| 130 | x010101000010 | 4 | x000101000100 | 3 | 0101000101000 | 3 | x000101000100 | 3 |
| 131 | x010010101010 | 3 | x001001001010 | 4 | x001001001010 | 4 | 0100001010100 | 3 |
| 132 | x010010101010 | 4 | x001001000101 | 2 | x001001000101 | 2 | 0100001010100 | 4 |
| 133 | x010101001010 | 3 | x001000010000 | 1 | x001000010000 | 1 | x010101001010 | 4 |
| 134 | x010101001010 | 4 | x000101010010 | 3 | 0101000101000 | 4 | x000101010010 | 3 |
| 135 | x010000101010 | 3 | x000101000100 | 4 | x010000101010 | 4 | x000101000100 | 4 |
| 136 | x010000101010 | 4 | x000100100010 | 3 | x000100100010 | 3 | 0100010000001 | 2 |
| 137 | x010000100101 | 2 | x000100100010 | 4 | x000100100010 | 4 | 0100010000010 | 3 |
| 138 | x010000100010 | 3 | x000101010010 | 4 | x010000100010 | 3 | x000101010010 | 4 |
| 139 | x010000100010 | 4 | x000101001001 | 2 | x010000100010 | 4 | x000101001001 | 2 |
| 140 | x010000001000 | 3 | x000100010001 | 2 | 0101000101001 | 2 | x000100010001 | 2 |
| 141 | x010000001000 | 4 | x000010100100 | 3 | x000010100100 | 3 | x010000001000 | 4 |
| 142 | 0101010101001 | 2 | x000010100100 | 4 | x000010100100 | 4 | 0100010000010 | 4 |
| 143 | 0101010100100 | 3 | x000100101010 | 3 | x000100101010 | 3 | 0100010000100 | 3 |
| 144 | 0101010100100 | 4 | x000100101010 | 4 | x000100101010 | 4 | 0100010000100 | 4 |
| 145 | 0101010100001 | 2 | x001000010101 | 2 | x001000010101 | 2 | 0100010000010 | 3 |
| 146 | 0101010010101 | 2 | x000010010010 | 3 | 0101010010101 | 2 | x000010010010 | 3 |
| 147 | 0101010010010 | 3 | x000100100101 | 2 | x000100100101 | 2 | 0100010001000 | 4 |
| 148 | 0101010010010 | 4 | x000100001000 | 3 | 0101010010010 | 3 | x000100001000 | 3 |
| 149 | 0101010010000 | 1 | x000100100100 | 4 | x001000101000 | 4 | 0100010001001 | 2 |
| 150 | 0101010001001 | 2 | x000100001000 | 4 | 0101010001001 | 2 | x000100001000 | 4 |
| 151 | 0101010000100 | 3 | x000010010010 | 4 | 0101010000100 | 3 | x000010010010 | 4 |
| 152 | 0101010000100 | 4 | x000010001001 | 2 | 0101010000100 | 4 | x000010001001 | 2 |
| 153 | 0101001010100 | 3 | x000010101001 | 2 | x000010101001 | 2 | 0100010010010 | 3 |
| 154 | 0101001010100 | 4 | x000010010101 | 2 | 0101001010100 | 3 | x000010010101 | 2 |
| 155 | 0101001010001 | 2 | x001000000100 | 3 | x001000000100 | 3 | 0100010001010 | 4 |
| 156 | 0101001001010 | 3 | x000010000100 | 3 | 0101001001010 | 3 | x000010000100 | 3 |
| 157 | 0101001001010 | 4 | x000010000100 | 4 | 0101001001010 | 4 | x000010000100 | 4 |
| 158 | 0101001001000 | 3 | x001000010010 | 3 | x001000010010 | 3 | 0100010010000 | 1 |
| 159 | 0101001001000 | 4 | x001000010010 | 4 | x001000010010 | 4 | 0100010010010 | 3 |
| 160 | 0101001000101 | 2 | x000001000010 | 3 | 0101001000101 | 2 | x000001000010 | 3 |
| 161 | 0101001000010 | 3 | x000001010100 | 3 | 0101001000010 | 3 | x000001010100 | 3 |
| 162 | 0101001000010 | 4 | x000001010100 | 4 | 0101001000010 | 4 | x000001010100 | 4 |
| 163 | 0101000101001 | 2 | x001000000100 | 4 | x001000000100 | 4 | 0100010100100 | 3 |
| 164 | 0101000100100 | 3 | x001000001001 | 2 | x001000001001 | 2 | 0100010010100 | 4 |
| 165 | 0101000100100 | 4 | x000101010000 | 1 | 0101000100100 | 4 | x000101010000 | 1 |
| 166 | 0101000100001 | 2 | x000010001010 | 3 | 0101000100001 | 2 | x000010001010 | 3 |
| 167 | 0101000010101 | 2 | x000100000010 | 3 | 0101000010101 | 2 | x000100000010 | 3 |
| 168 | 0101000010010 | 3 | x000100101000 | 3 | x000100101000 | 3 | 0100010010101 | 2 |
| 169 | 0101000010010 | 4 | x000100101000 | 4 | x000100101000 | 4 | 0100100000010 | 3 |
| 170 | 0101000010000 | 1 | x000001000010 | 4 | 0101000010000 | 1 | x000001000010 | 4 |
| 171 | 0101000001001 | 2 | x000100010100 | 3 | 0101000001001 | 2 | x000100010100 | 3 |
| 172 | 0101000000100 | 3 | x000100000010 | 4 | 0101000000100 | 3 | x000100000010 | 4 |
| 173 | 0101000000100 | 4 | x000010000001 | 2 | 0101000000100 | 4 | x000010000001 | 2 |
| 174 | 0100101010101 | 2 | x000100001010 | 4 | 0101000101010 | 3 | x000100001010 | 4 |
| 175 | 0100101010010 | 1 | x000000100001 | 2 | 0101000101010 | 4 | 0100101010010 | 3 |
| 176 | 0100101010000 | 1 | x000100010100 | 4 | 0101001000100 | 3 | x000100010100 | 4 |
| 177 | 0100101001001 | 2 | x010101010101 | 2 | 0101001000100 | 4 | x010101010101 | 2 |
| 178 | 0100101000100 | 3 | x000001001000 | 2 | 0101001001001 | 2 | x000001000101 | 2 |
| 179 | 0100101000100 | 4 | x000000010000 | 1 | 0101001001000 | 4 | 0100101000100 | 3 |
| 180 | 0100100101010 | 1 | x010100100010 | 3 | x010100100010 | 3 | 0100100000100 | 3 |

FIG. 9D

| Data Symbol | MCG1 Code Word MSB LSB | Next Code Group | MCG2 Code Word MSB LSB | Next Code Group | DCG1 Code Word MSB LSB | Next Code Group | DCG2 Code Word MSB LSB | Next Code Group |
|---|---|---|---|---|---|---|---|---|
| 181 | 0100100101000 | 3 | x000100001010 | 3 | 0100100101000 | 3 | x000100001010 | 3 |
| 182 | 0100100101000 | 4 | x000100001010 | 4 | 0100100101000 | 4 | x000100001010 | 4 |
| 183 | 0100100100101 | 2 | x010100100010 | 4 | x010100100010 | 4 | 0100100000100 | 4 |
| 184 | 0100100100010 | 1 | x010101010010 | 3 | 0100100100010 | 4 | x010101010010 | 3 |
| 185 | 0100100010100 | 3 | x000100000101 | 2 | 0101001001001 | 2 | x000100000101 | 2 |
| 186 | 0100100010100 | 4 | x000001000000 | 1 | 0101001010000 | 1 | x000001000000 | 1 |
| 187 | 0100100010001 | 2 | x010101010010 | 4 | 0101001010001 | 2 | x010101010010 | 4 |
| 188 | 0100100001010 | 1 | x010101001001 | 2 | 0101001010010 | 3 | x010101001001 | 2 |
| 189 | 0100100001000 | 3 | x010100010001 | 2 | 0101001010010 | 4 | x010100010001 | 2 |
| 190 | 0100100001000 | 4 | x010010100100 | 3 | x010010100100 | 3 | 0100100001000 | 3 |
| 191 | 0100100000101 | 2 | x010100100101 | 2 | x010100100101 | 2 | 0100100000101 | 2 |
| 192 | 0100100000010 | 1 | x010010100100 | 4 | x010010100100 | 4 | 0100100000010 | 4 |
| 193 | 0100010101001 | 2 | x010010010010 | 3 | 0100010101001 | 2 | x010010010010 | 3 |
| 194 | 0100010100100 | 3 | x010100001000 | 3 | 0100010100100 | 3 | x010100001000 | 3 |
| 195 | 0100010100100 | 4 | x010100001000 | 4 | 0100010100100 | 4 | x010100001000 | 4 |
| 196 | 0100010010101 | 2 | x010010010100 | 4 | x010010010100 | 4 | x010010010010 | 4 |
| 197 | 0100010010010 | 1 | x010010101001 | 2 | x010010101001 | 2 | 0100010010010 | 4 |
| 198 | 0100010001001 | 2 | x010010010101 | 2 | 0101001010101 | 2 | x010010010101 | 2 |
| 199 | 0100010000100 | 3 | x010010001001 | 2 | 0101010000000 | 1 | x010010001001 | 2 |
| 200 | 0100010000100 | 4 | x010010010100 | 3 | 0101010000001 | 2 | x010001010100 | 3 |
| 201 | 0100010000001 | 2 | x010010101100 | 4 | 0101010001001 | 3 | x010001010100 | 4 |
| 202 | 0100001010100 | 3 | x010010000100 | 3 | 0101010001000 | 4 | x010010000100 | 3 |
| 203 | 0100001010100 | 4 | x010010000100 | 4 | 0101010010000 | 1 | x010010000100 | 4 |
| 204 | 0100001001010 | 1 | x010001010010 | 3 | 0101010010001 | 2 | x010001000010 | 3 |
| 205 | 0100001000101 | 2 | x010001000010 | 4 | 0101010010010 | 4 | x010001000010 | 4 |
| 206 | 0100001000010 | 1 | x010001001010 | 3 | 0101010100000 | 1 | x010001001010 | 3 |
| 207 | 0100001000000 | 1 | x010000100001 | 2 | x010000100001 | 2 | 0100001000000 | 1 |
| 208 | 0100000100001 | 2 | x010000100010 | 4 | 0100000100001 | 2 | x010001001010 | 4 |
| 209 | 0100000010000 | 1 | x001010101010 | 3 | x001010101010 | 3 | 0100000010000 | 1 |
| 210 | x010101000100 | 3 | x001010101010 | 4 | x001010101010 | 4 | x010101000100 | 3 |
| 211 | x010101000100 | 4 | x001010100101 | 2 | x001010100101 | 2 | x010101000100 | 4 |
| 212 | x010100101010 | 3 | x010000101010 | 2 | x010100101010 | 3 | x010001000101 | 2 |
| 213 | x010100101010 | 4 | x010000010000 | 1 | x010100101010 | 4 | x010000010000 | 1 |
| 214 | 0101010101010 | 3 | x001010001000 | 3 | x001010001000 | 3 | 0100100001000 | 4 |
| 215 | 0101010101010 | 4 | x001010001000 | 4 | x001010001000 | 4 | 0100100001010 | 3 |
| 216 | 0101010100101 | 2 | x001010101010 | 2 | x001001010101 | 2 | 0100100001010 | 4 |
| 217 | 0101010100010 | 3 | x001010100010 | 3 | x001010100010 | 3 | 0100100010001 | 2 |
| 218 | 0101010100010 | 4 | x001010100010 | 4 | x001010100010 | 4 | 0100100010010 | 3 |
| 219 | 0101010010001 | 2 | x001010010001 | 2 | x001010010001 | 2 | 0100100010100 | 3 |
| 220 | 0101010010000 | 3 | x001001000100 | 3 | x001001000100 | 3 | 0100100010100 | 4 |
| 221 | 0101010001000 | 4 | x001001000100 | 4 | x001001000100 | 4 | 0100100010101 | 2 |
| 222 | 0101001010101 | 2 | x001000100010 | 3 | x001000100010 | 3 | 0100101000000 | 1 |
| 223 | 0101001010010 | 3 | x001001010010 | 3 | x001001010010 | 3 | 0100101000001 | 2 |
| 224 | 0101001010010 | 4 | x001001010010 | 4 | x001001010010 | 4 | 0100101000010 | 4 |
| 225 | 0101001001001 | 2 | x001001001001 | 2 | x001001001001 | 2 | 0100101000100 | 4 |
| 226 | 0101001000100 | 3 | x001000100010 | 4 | x001000100010 | 4 | 0100101000101 | 2 |
| 227 | 0101001000100 | 4 | x001000010001 | 2 | x001000010001 | 2 | 0100101001000 | 3 |
| 228 | 0101000101010 | 3 | x001000101010 | 3 | x001000101010 | 3 | 0100101001001 | 2 |
| 229 | 0101000101010 | 4 | x001000101010 | 4 | x001000101010 | 4 | 0100101001010 | 3 |
| 230 | 0101000100101 | 2 | x001000100101 | 2 | x001000100101 | 2 | 0100101001010 | 4 |
| 231 | 0101000100010 | 3 | x000101001000 | 3 | 0101000100010 | 3 | x000101001000 | 3 |
| 232 | 0101000100010 | 4 | x000101001000 | 4 | 0101000100010 | 4 | x000101001000 | 4 |
| 233 | 0101000010001 | 2 | x000100100100 | 3 | x000100100100 | 3 | 0100101010000 | 1 |
| 234 | 0101000001000 | 3 | x001000001000 | 3 | x001000001000 | 3 | 0100101010001 | 2 |
| 235 | 0101000001000 | 4 | x001000001000 | 4 | x001000001000 | 4 | 0100101010010 | 4 |
| 236 | 0100101010001 | 2 | x000101010001 | 2 | 0101010100001 | 2 | x000101010001 | 2 |
| 237 | 0100101010100 | 3 | x000100100100 | 4 | x000100100100 | 4 | 0100101001000 | 4 |
| 238 | 0100101001000 | 4 | x000100010010 | 3 | 0101010100010 | 3 | x000100010010 | 3 |
| 239 | 0100100101001 | 2 | x000100101001 | 2 | x000100101001 | 2 | 0100101010101 | 2 |
| 240 | 0100100100100 | 3 | x000100010010 | 4 | 0100100100100 | 3 | x000100010010 | 4 |

| Data Symbol | MCG1 Code Word MSB LSB | Next Code Group | MCG2 Code Word MSB LSB | Next Code Group | DCG1 Code Word MSB LSB | Next Code Group | DCG2 Code Word MSB LSB | Next Code Group |
|---|---|---|---|---|---|---|---|---|
| 241 | 0100100100100 | 4 | x000100001001 | 2 | 0100100100100 | 4 | x000100001001 | 2 |
| 242 | 0100100010101 | 2 | x000100010101 | 2 | 0101010100010 | 4 | x000100010101 | 2 |
| 243 | 0100100010010 | 1 | x000010101000 | 3 | x000010101000 | 3 | 0100100010010 | 4 |
| 244 | 0100100001001 | 2 | x000010101000 | 4 | x000010101000 | 4 | 0100100001001 | 2 |
| 245 | 0100100000100 | 3 | x000100000100 | 3 | 0101010100100 | 3 | x000100000100 | 3 |
| 246 | 0100100000100 | 4 | x000100000100 | 4 | 0101010100100 | 4 | x000100000100 | 4 |
| 247 | 0100010101000 | 3 | x000010101000 | 3 | 0100010101000 | 3 | x000010101000 | 3 |
| 248 | 0100010101000 | 4 | x000010010100 | 4 | 0100010101000 | 4 | x000010010100 | 4 |
| 249 | 0100010010100 | 3 | x000010001010 | 3 | 0101010100101 | 2 | x000010001010 | 3 |
| 250 | 0100010010100 | 4 | x000010001010 | 4 | 0101010101000 | 3 | x000010001010 | 4 |
| 251 | 0100010001010 | 1 | x000010000101 | 2 | 0101010101000 | 4 | x000010000101 | 2 |
| 252 | 0100010000101 | 2 | x000000100000 | 1 | 0101010101001 | 2 | 0100010000101 | 2 |
| 253 | 0100010000010 | 1 | x000010000010 | 3 | 0101010101010 | 3 | x000010000010 | 3 |
| 254 | 0100001000001 | 2 | x000010000010 | 4 | 0101010101010 | 4 | x000010000010 | 4 |
| 255 | 0100000100000 | 1 | x000001000001 | 2 | 0100000100000 | 1 | x000001000001 | 2 |

FIG. 12A

| No | MCG1-1 | Ncg 1-1 | MCG2-1 | Ncg 2-1 | DCG1-1 | Ncg 3-1 | DCG2-1 | Ncg 4-1 |
|---|---|---|---|---|---|---|---|---|
| 0 | 10001010000000 | 1 | 01001010000000 | 1 | 10001010000000 | 1 | 01001010000000 | 1 |
| 1 | 10000101000000 | 1 | 01000101000000 | 1 | 10000101000000 | 1 | 01000101000000 | 1 |
| 2 | 10000010100000 | 1 | 01000010100000 | 1 | 10000010100000 | 1 | 01000010100000 | 1 |
| 3 | 10000001010000 | 1 | 01000001010000 | 1 | 10000001010000 | 1 | 01000001010000 | 1 |
| 4 | 10000000101000 | 3 | 01000000101000 | 3 | 10000000101000 | 3 | 01000000101000 | 3 |
| 5 | 10000000101000 | 4 | 01000000101000 | 4 | 10000000101000 | 4 | 01000000101000 | 4 |
| 6 | 10000000010100 | 3 | 01000000010100 | 3 | 10000000010100 | 3 | 01000000010100 | 3 |
| 7 | 10000000010100 | 4 | 01000000010100 | 4 | 10000000010100 | 4 | 01000000010100 | 4 |
| 8 | 10101000000001 | 2 | 01000000001010 | 3 | 10101000000001 | 2 | 01000000001010 | 3 |
| 9 | 10010100000001 | 2 | 01000000001010 | 4 | 10010100000001 | 2 | 01000000001010 | 4 |
| 10 | 10010010000000 | 1 | 01010100000001 | 2 | 10010010000000 | 1 | 01010100000001 | 2 |
| 11 | 10001010000001 | 2 | 01010010000001 | 1 | 10001010000001 | 2 | 01010010000001 | 1 |
| 12 | 10001001000000 | 1 | 01001010000001 | 2 | 10001001000000 | 1 | 01001010000001 | 2 |
| 13 | 10000101000001 | 2 | 01001001000000 | 1 | 10000101000001 | 2 | 01001001000000 | 1 |
| 14 | 10000100101000 | 1 | 01000101000001 | 2 | 10000100101000 | 1 | 01000101000001 | 2 |
| 15 | 10000010100001 | 2 | 01000100101000 | 1 | 10000010100001 | 2 | 01000100101000 | 1 |
| 16 | 10000010010100 | 1 | 01000010100001 | 2 | 10000010010100 | 1 | 01000010100001 | 2 |
| 17 | 10000001010001 | 2 | 01000010010100 | 1 | 10000001010001 | 2 | 01000010010100 | 1 |
| 18 | 10000001001000 | 3 | 01000001010001 | 2 | 10000001001000 | 3 | 01000001010001 | 2 |
| 19 | 10000001001000 | 4 | 01000001001000 | 3 | 10000001001000 | 4 | 01000001001000 | 3 |
| 20 | 10000000101001 | 2 | 01000001001000 | 4 | 10000000101001 | 2 | 01000001001000 | 4 |
| 21 | 10000000100100 | 3 | 01000000101001 | 2 | 10000000100100 | 3 | 01000000101001 | 2 |
| 22 | 10000000100100 | 4 | 01000000100100 | 3 | 10000000100100 | 4 | 01000000100100 | 3 |
| 23 | 10000000010101 | 2 | 01000000100100 | 4 | 10000000010101 | 2 | 01000000100100 | 4 |
| 24 | 10000000010010 | 3 | 01000000010101 | 2 | 10000000010010 | 3 | 01000000010101 | 2 |
| 25 | 10000000010010 | 4 | 01000000010010 | 3 | 10000000010010 | 4 | 01000000010010 | 3 |
| 26 | 10101010100000 | 1 | 01000000010010 | 4 | 10101010100000 | 1 | 01000000010010 | 4 |
| 27 | 10101001010000 | 1 | 01000000001001 | 2 | 10101001010000 | 1 | 01000000001001 | 2 |
| 28 | 10101000101000 | 3 | 00101010000000 | 1 | 10101000101000 | 3 | 00101010000000 | 1 |
| 29 | 10101000101000 | 4 | 00100101000000 | 1 | 10101000101000 | 4 | 00100101000000 | 1 |
| 30 | 10101000010100 | 3 | 00100100101000 | 1 | 10101000010100 | 3 | 00100100101000 | 1 |
| 31 | 10101000010100 | 4 | 00100001010000 | 1 | 10101000010100 | 4 | 00100001010000 | 1 |
| 32 | 10101000001010 | 3 | 00100000101000 | 3 | 10101000001010 | 3 | 00100000101000 | 3 |
| 33 | 10101000001010 | 4 | 00100000001010 | 4 | 10101000001010 | 4 | 00100000001010 | 4 |
| 34 | 10101000000101 | 2 | 00100000010100 | 3 | 10101000000101 | 2 | 00100000010100 | 3 |
| 35 | 10101000000100 | 3 | 00100000010100 | 4 | 10101000000100 | 3 | 00100000010100 | 4 |
| 36 | 10101000000010 | 4 | 00100000001010 | 3 | 10101000000010 | 4 | 00100000001010 | 3 |
| 37 | 10100100000001 | 2 | 00100000001010 | 4 | 10100100000001 | 2 | 00100000001010 | 4 |
| 38 | 10100010000000 | 1 | 00100010000101 | 2 | 10100010000000 | 1 | 00100000000101 | 2 |
| 39 | 10010101010000 | 1 | 01010101010000 | 1 | 10010101010000 | 1 | 01010101010000 | 1 |
| 40 | 10010100101000 | 3 | 01010100101000 | 3 | 10010100101000 | 3 | 01010100101000 | 3 |
| 41 | 10010100101000 | 4 | 01010100101000 | 4 | 10010100101000 | 4 | 01010100101000 | 4 |
| 42 | 10010100010100 | 3 | 01010100010100 | 3 | 10010100010100 | 3 | 01010100010100 | 3 |
| 43 | 10010100010100 | 4 | 01010100010100 | 4 | 10010100010100 | 4 | 01010100010100 | 4 |
| 44 | 10010100001010 | 3 | 01010100001010 | 3 | 10010100001010 | 3 | 02010100001010 | 3 |
| 45 | 10010100001010 | 4 | 01010100001010 | 4 | 10010100001010 | 4 | 01010100001010 | 4 |
| 46 | 10010100000101 | 2 | 01010100000101 | 2 | 10010100000101 | 2 | 01010100000101 | 2 |
| 47 | 10010100000010 | 3 | 01010100000010 | 3 | 10010100000010 | 3 | 01010100000010 | 3 |
| 48 | 10010100000010 | 4 | 01010100000010 | 4 | 10010100000010 | 4 | 01010100000010 | 4 |
| 49 | 10010010000001 | 2 | 01010010000001 | 2 | 10010010000001 | 2 | 01010010000001 | 2 |
| 50 | 10010001000000 | 1 | 01010001000000 | 1 | 10010001000000 | 1 | 01010001000000 | 1 |
| 51 | 10001010101000 | 3 | 01001010101000 | 3 | 10001010101000 | 3 | 01001010101000 | 3 |
| 52 | 10001010101000 | 4 | 01001010101000 | 4 | 10001010101000 | 4 | 01001010101000 | 4 |
| 53 | 10001010010100 | 3 | 01001010010100 | 3 | 10001010010100 | 3 | 01001010010100 | 3 |
| 54 | 10001010010100 | 4 | 01001010010100 | 4 | 10001010010100 | 4 | 01001010010100 | 4 |
| 55 | 10001010001010 | 3 | 01001010001010 | 3 | 10001010001010 | 3 | 01001010001010 | 3 |
| 56 | 10001010001010 | 4 | 01001010001010 | 4 | 10001010001010 | 4 | 01001010001010 | 4 |
| 57 | 10001010000101 | 2 | 01001010000101 | 2 | 10001010000101 | 2 | 01001010000101 | 2 |
| 58 | 10001010000010 | 3 | 01001010000010 | 3 | 10001010000010 | 3 | 01001010000010 | 3 |
| 59 | 10001010000010 | 4 | 01001010000010 | 4 | 10001010000010 | 4 | 01001010000010 | 4 |
| 60 | 10001001000001 | 2 | 01001001000001 | 2 | 10001001000001 | 2 | 01001001000001 | 2 |
| 61 | 10001000100000 | 1 | 01001000100000 | 1 | 10001000100000 | 1 | 01001000100000 | 1 |
| 62 | 10000101010100 | 3 | 01000101010100 | 3 | 10000101010100 | 3 | 01000101010100 | 3 |
| 63 | 10000101010100 | 4 | 01000101010100 | 4 | 10000101010100 | 4 | 01000101010100 | 4 |
| 64 | 10000101001010 | 3 | 01000101001010 | 3 | 10000101001010 | 3 | 01000101001010 | 3 |
| 65 | 10000101001010 | 4 | 01000101001010 | 4 | 10000101001010 | 4 | 01000101001010 | 4 |
| 66 | 10000101000101 | 2 | 01000101000101 | 2 | 10000101000101 | 2 | 01000101000101 | 2 |
| 67 | 10000101000010 | 3 | 01000101000010 | 3 | 10000101000010 | 3 | 01000101000010 | 3 |
| 68 | 10000101000010 | 4 | 01000101000010 | 4 | 10000101000010 | 4 | 01000101000010 | 4 |
| 69 | 10000100100001 | 2 | 01000100100001 | 2 | 10000100100001 | 2 | 01000100100001 | 2 |
| 70 | 10000100010000 | 1 | 01000100010000 | 1 | 10000100010000 | 1 | 01000100010000 | 1 |
| 71 | 10000010101010 | 3 | 01000010101010 | 3 | 10000010101010 | 3 | 01000010101010 | 3 |
| 72 | 10000010101010 | 4 | 01000010101010 | 4 | 10000010101010 | 4 | 01000010101010 | 4 |
| 73 | 10000010100101 | 2 | 01000010100101 | 2 | 10000010100101 | 2 | 01000010100101 | 2 |
| 74 | 10000010100010 | 3 | 01000010100010 | 3 | 10000010100010 | 3 | 01000010100010 | 3 |
| 75 | 10000010100010 | 4 | 01000010100010 | 4 | 10000010100010 | 4 | 01000010100010 | 4 |
| 76 | 10000010010001 | 2 | 01000010010001 | 2 | 10000010010001 | 2 | 01000010010001 | 2 |
| 77 | 10000010001000 | 3 | 01000010001000 | 3 | 10000010001000 | 3 | 01000010001000 | 3 |
| 78 | 10000010001000 | 4 | 01000010001000 | 4 | 10000010001000 | 4 | 01000010001000 | 4 |
| 79 | 10000001010101 | 2 | 01000001010101 | 2 | 10000001010101 | 2 | 01000001010101 | 2 |
| 80 | 10000001010010 | 3 | 01000001010010 | 3 | 10000001010010 | 3 | 01000001010010 | 3 |
| 81 | 10000001010010 | 4 | 01000001010010 | 4 | 10000001010010 | 4 | 01000001010010 | 4 |
| 82 | 10000001001001 | 2 | 01000001001001 | 2 | 10000001001001 | 2 | 01000001001001 | 2 |
| 83 | 10000001000100 | 3 | 01000001000100 | 3 | 10000001000100 | 3 | 01000001000100 | 3 |
| 84 | 10000001000100 | 4 | 01000001000100 | 4 | 10000001000100 | 4 | 01000001000100 | 4 |
| 85 | 10000000101010 | 3 | 01000000101010 | 3 | 10000000101010 | 3 | 01000000101010 | 3 |
| 86 | 10000000101010 | 4 | 01000000101010 | 4 | 10000000101010 | 4 | 01000000101010 | 4 |
| 87 | 10000000100101 | 2 | 01000000100101 | 2 | 10000000100101 | 2 | 01000000100101 | 2 |
| 88 | 10000000100010 | 3 | 01000000100010 | 3 | 10000000100010 | 3 | 01000000100010 | 3 |
| 89 | 10000000100010 | 4 | 01000000100010 | 4 | 10000000100010 | 4 | 01000000100010 | 4 |

FIG. 12B

| No | MCG1-1 | Ncg 1-1 | MCG2-1 | Ncg 2-1 | DCG1-1 | Ncg 3-1 | DCG2-1 | Ncg 4-1 |
|---|---|---|---|---|---|---|---|---|
| 90 | 10000000010001 | 2 | 01000000010001 | 2 | 10000000010001 | 2 | 01000000010001 | 2 |
| 91 | 10101010100001 | 2 | 01000000001000 | 3 | 10101010100001 | 2 | 01000000001000 | 3 |
| 92 | 10101010010000 | 1 | 01000000001000 | 4 | 10101010010000 | 1 | 01000000001000 | 4 |
| 93 | 10101001010001 | 2 | 00101010000001 | 2 | 10101001010001 | 2 | 00101010000001 | 2 |
| 94 | 10101001001000 | 3 | 00101001000000 | 1 | 10101001001000 | 3 | 00101001000000 | 1 |
| 95 | 10101001001000 | 4 | 00100101000001 | 2 | 10101001001000 | 4 | 00100101000001 | 2 |
| 96 | 10101000101001 | 2 | 00100100100001 | 1 | 10101000101001 | 2 | 00100100100000 | 1 |
| 97 | 10101000100100 | 3 | 00100010100001 | 2 | 10101000100100 | 3 | 00100010100001 | 2 |
| 98 | 10101000100100 | 4 | 00100010010000 | 1 | 10101000100100 | 4 | 00100010010000 | 1 |
| 99 | 10101000010101 | 2 | 00100001010001 | 2 | 10101000010101 | 2 | 00100001010001 | 2 |
| 100 | 10101000010010 | 3 | 00100001001000 | 3 | 10101000010010 | 3 | 00100001001000 | 3 |
| 101 | 10101000010010 | 4 | 00100001001000 | 4 | 10101000010010 | 4 | 00100001001000 | 4 |
| 102 | 10101000001001 | 2 | 00100000101001 | 2 | 10101000001001 | 2 | 00100000101001 | 2 |
| 103 | 10101000000100 | 3 | 00100000100100 | 3 | 10101000000100 | 3 | 00100000100100 | 3 |
| 104 | 10101000000100 | 4 | 00100000100100 | 4 | 10101000000100 | 4 | 00100000100100 | 4 |
| 105 | 10100101010000 | 1 | 00100000010101 | 2 | 10100101010000 | 1 | 00100000010101 | 2 |
| 106 | 10100100101000 | 3 | 00100000010010 | 3 | 10100100101000 | 3 | 00100000010010 | 3 |
| 107 | 10100100101000 | 4 | 00100000010010 | 4 | 10100100101000 | 4 | 00100000010010 | 4 |
| 108 | 10100100010100 | 3 | 00100000001001 | 2 | 10100100010100 | 3 | 00100000001001 | 2 |
| 109 | 10100100010100 | 4 | 00100000000100 | 3 | 10100100010100 | 4 | 00100000000100 | 3 |
| 110 | 10100100001010 | 3 | 00100000000100 | 4 | 10100100001010 | 3 | 00100000000100 | 4 |
| 111 | 10100100001010 | 4 | 00010101000000 | 1 | 10100100001010 | 4 | 00010101000000 | 1 |
| 112 | 10100100000101 | 2 | 00010010100000 | 1 | 10100100000101 | 2 | 00010010100000 | 1 |
| 113 | 10100100000010 | 3 | 00010001010000 | 1 | 10100100000010 | 3 | 00010001010000 | 1 |
| 114 | 10100100000010 | 4 | 00010000101000 | 3 | 10100100000010 | 4 | 00010000101000 | 3 |
| 115 | 10100010000001 | 2 | 00010000101000 | 4 | 10100010000001 | 2 | 00010000101000 | 4 |
| 116 | 10100001000000 | 1 | 00010000010100 | 3 | 10100001000000 | 1 | 00010000010100 | 3 |
| 117 | 10010101010001 | 2 | 00010000010100 | 4 | 10010101010001 | 2 | 00010000010100 | 4 |
| 118 | 10010101001000 | 3 | 00010000000101 | 2 | 10010101001000 | 3 | 00010000001010 | 3 |
| 119 | 10010101001000 | 4 | 00010000000010 | 3 | 10010101001000 | 4 | 00010000001010 | 4 |
| 120 | 10010100101001 | 2 | 00010000000010 | 4 | 10010100101001 | 2 | 00010000000101 | 2 |
| 121 | 10010100100100 | 3 | 00001000000001 | 2 | 10010100100100 | 3 | 00010000000010 | 3 |
| 122 | 10010100100100 | 4 | 01010101010001 | 2 | 10010100100100 | 4 | 00010000000010 | 4 |
| 123 | 10010100010101 | 2 | 01010101001000 | 3 | 10010100010101 | 2 | 01010101010001 | 2 |
| 124 | 10010100010010 | 3 | 01010101001000 | 4 | 10010100010010 | 3 | 01010101001000 | 3 |
| 125 | 10010100010010 | 4 | 01010100101001 | 2 | 10010100010010 | 4 | 01010101001000 | 4 |
| 126 | 10010100001001 | 2 | 01010100100100 | 3 | 10010100001001 | 2 | 01010100101001 | 2 |
| 127 | 10010100000100 | 3 | 01010100100100 | 4 | 10010100000100 | 3 | 01010100100100 | 3 |
| 128 | 10010100000100 | 4 | 01010100010101 | 2 | 10010100000100 | 4 | 01010100100100 | 4 |
| 129 | 10010010101000 | 3 | 01010100010010 | 3 | 10010010101000 | 3 | 01010100010101 | 2 |
| 130 | 10010010101000 | 4 | 01010100010010 | 4 | 10010010101000 | 4 | 01010100010010 | 3 |
| 131 | 10010010010100 | 3 | 01010100001001 | 2 | 10010010010100 | 3 | 01010100010010 | 4 |
| 132 | 10010010010100 | 4 | 01010100000100 | 3 | 10010010010100 | 4 | 01010100001001 | 2 |
| 133 | 10010010001010 | 3 | 01010100000100 | 4 | 10010010001010 | 3 | 01010100000100 | 3 |
| 134 | 10010010001010 | 4 | 01010010101000 | 3 | 10010010001010 | 4 | 01010100000100 | 4 |
| 135 | 10010010000101 | 2 | 01010010101000 | 4 | 10010010000101 | 2 | 01010010101000 | 3 |
| 136 | 10010010000010 | 3 | 01010010010100 | 3 | 10010010000010 | 3 | 01010010101000 | 4 |
| 137 | 10010010000010 | 4 | 01010010010100 | 4 | 10010010000010 | 4 | 01010010010100 | 3 |
| 138 | 10010001000001 | 2 | 01010010001010 | 3 | 10010001000001 | 2 | 01010010010100 | 4 |
| 139 | 10010000100000 | 1 | 01010010001010 | 4 | 10010000100000 | 1 | 01010010001010 | 3 |
| 140 | 10001010101001 | 2 | 01010010000101 | 2 | 10001010101001 | 2 | 01010010001010 | 4 |
| 141 | 10001010100100 | 3 | 01010010000010 | 3 | 10001010100100 | 3 | 01010010000101 | 2 |
| 142 | 10001010100100 | 4 | 01010010000010 | 4 | 10001010100100 | 4 | 01010010000010 | 3 |
| 143 | 10001010010101 | 2 | 01010001000001 | 2 | 10001010010101 | 2 | 01010010000010 | 4 |
| 144 | 10001010010010 | 3 | 01010000100000 | 1 | 10001010010010 | 3 | 01010001000001 | 2 |
| 145 | 10001010010010 | 4 | 01001010101001 | 2 | 10001010010010 | 4 | 01010000100000 | 1 |
| 146 | 10001010001001 | 2 | 01001010100100 | 3 | 10001010001001 | 2 | 01001010101001 | 2 |
| 147 | 10001010000100 | 3 | 01001010100100 | 4 | 10001010000100 | 3 | 01001010100100 | 3 |
| 148 | 10001010000100 | 4 | 01001010010101 | 2 | 10001010000100 | 4 | 01001010100100 | 4 |
| 149 | 10001001010100 | 3 | 01001010010010 | 3 | 10001001010100 | 3 | 01001010010101 | 2 |
| 150 | 10001001010100 | 4 | 01001010010010 | 4 | 10001001010100 | 4 | 01001010010010 | 3 |
| 151 | 10001001001010 | 3 | 01001010001001 | 2 | 10001001001010 | 3 | 01001010010010 | 4 |
| 152 | 10001001001010 | 4 | 01001010000100 | 3 | 10001001001010 | 4 | 01001010001001 | 2 |
| 153 | 10001001000101 | 2 | 01001010000100 | 4 | 10001000100001 | 2 | 01001010000100 | 3 |
| 154 | 10001001000010 | 3 | 01001001010100 | 3 | 10001000010000 | 1 | 01001010000100 | 4 |
| 155 | 10001001000010 | 4 | 01001010010100 | 4 | 10000101010101 | 2 | 01001001010100 | 3 |
| 156 | 10001000100001 | 2 | 01001001001010 | 3 | 10000101001001 | 2 | 01001001010100 | 4 |
| 157 | 10001000010000 | 1 | 01001001001010 | 4 | 10000101000100 | 3 | 01001001001010 | 3 |
| 158 | 10000101010010 | 2 | 01001001000101 | 2 | 10000101000100 | 4 | 01001001001010 | 4 |
| 159 | 10000101010010 | 3 | 01001001000010 | 3 | 10000101000101 | 2 | 01001001000101 | 2 |
| 160 | 10000101010010 | 4 | 01001001000010 | 4 | 10000100100010 | 3 | 01001001000010 | 3 |
| 161 | 10000101001001 | 2 | 01001000100001 | 2 | 10000100100010 | 4 | 01001001000010 | 4 |
| 162 | 10000101000100 | 3 | 01001000010000 | 1 | 10000100010001 | 2 | 01001000100001 | 2 |
| 163 | 10000100101010 | 4 | 01000101010101 | 2 | 10000010101001 | 2 | 01001000010000 | 1 |
| 164 | 10000100101010 | 3 | 01000101010010 | 3 | 10000010100100 | 3 | 01000101010101 | 2 |
| 165 | 10000100101010 | 4 | 01000101010010 | 4 | 10000010100100 | 4 | 01000101010010 | 3 |
| 166 | 10000100100101 | 2 | 01000101001001 | 2 | 10000010010101 | 2 | 01000101010010 | 4 |
| 167 | 10000100100010 | 3 | 01000101000100 | 3 | 10000010010010 | 3 | 01000101001001 | 2 |
| 168 | 10000100100010 | 4 | 01000101000100 | 4 | 10000010010010 | 4 | 01000101000100 | 3 |
| 169 | 10000100010001 | 2 | 01000100101010 | 3 | 10000010001001 | 2 | 01000101000100 | 4 |
| 170 | 10000100001000 | 3 | 01000100101010 | 4 | 10000010000100 | 3 | 01000100101010 | 3 |
| 171 | 10000100001000 | 4 | 01000100100101 | 2 | 10000010000100 | 4 | 01000100101010 | 4 |
| 172 | 10000010101001 | 2 | 01000100100010 | 3 | 10000001010010 | 3 | 01000100100101 | 2 |
| 173 | 10000010100100 | 3 | 01000100100010 | 4 | 10000001001010 | 4 | 01000100100010 | 3 |
| 174 | 10000010100100 | 4 | 01000100010001 | 2 | 10000001000101 | 2 | 01000100100010 | 4 |
| 175 | 10000010010101 | 2 | 01000100001000 | 3 | 10000000100001 | 2 | 01000100010001 | 2 |
| 176 | 10000010010010 | 3 | 01000100001000 | 4 | 10000000010000 | 1 | 01000100001000 | 3 |
| 177 | 10000010010010 | 4 | 01000010101001 | 2 | 00001000000001 | 2 | 01000100001000 | 4 |
| 178 | 10000010001001 | 2 | 01000010100100 | 3 | 10101010100101 | 2 | 01000010101001 | 2 |
| 179 | 10000010000100 | 3 | 01000010100100 | 4 | 10101010100010 | 3 | 01000010100100 | 3 |

FIG. 12C

| No | MCG1-1 | Ncg 1-1 | MCG2-1 | Ncg 2-1 | DCG1-1 | Ncg 3-1 | DCG2-1 | Ncg 4-1 |
|---|---|---|---|---|---|---|---|---|
| 180 | 10000010000100 | 4 | 01000010010101 | 2 | 10101010100010 | 4 | 01000010100100 | 4 |
| 181 | 10000001010100 | 3 | 01000010010010 | 3 | 10101010010001 | 2 | 01000010010101 | 2 |
| 182 | 10000001010100 | 4 | 01000010010010 | 4 | 10101001010101 | 2 | 01000010010010 | 3 |
| 183 | 10000010001010 | 3 | 01000010001001 | 2 | 10101001010010 | 3 | 01000010010010 | 4 |
| 184 | 10000001001010 | 4 | 01000010000100 | 3 | 10101001010010 | 4 | 01000010001001 | 2 |
| 185 | 10000001000101 | 2 | 01000010000100 | 4 | 10101001001001 | 2 | 01000010000100 | 3 |
| 186 | 10000001000010 | 3 | 01000001010100 | 3 | 10101000101010 | 3 | 01000010000100 | 4 |
| 187 | 10000001000010 | 4 | 01000001010100 | 4 | 10101000101010 | 4 | 01000001010100 | 3 |
| 188 | 10000000100001 | 2 | 01000001001010 | 3 | 10101000100101 | 2 | 01000001010100 | 4 |
| 189 | 10000000010000 | 1 | 01000001001010 | 4 | 10101000010001 | 2 | 01000001001010 | 3 |
| 190 | 10101010100101 | 2 | 01000001000101 | 2 | 10101000001000 | 3 | 01000001001010 | 4 |
| 191 | 10101010100010 | 3 | 01000001000010 | 3 | 10101000001000 | 4 | 01000001000101 | 2 |
| 192 | 10101010100010 | 4 | 01000001000010 | 4 | 10100101010001 | 2 | 01000001000010 | 3 |
| 193 | 10101010010001 | 2 | 01000000100001 | 2 | 10100101010001 | 2 | 01000001000010 | 4 |
| 194 | 10101001010101 | 2 | 01000000010000 | 1 | 10100100101011 | 2 | 01000000100001 | 2 |
| 195 | 10101010010010 | 3 | 00101010101010 | 3 | 10100101001001 | 2 | 01000000010000 | 1 |
| 196 | 10101001010010 | 4 | 00101010101000 | 4 | 10100100000100 | 3 | 00101010101000 | 3 |
| 197 | 10101001001001 | 2 | 00101010010100 | 3 | 10100100000100 | 4 | 00101010101000 | 4 |
| 198 | 10101000101010 | 3 | 00101010101010 | 4 | 10100010000101 | 2 | 00101010010100 | 3 |
| 199 | 10101000101010 | 4 | 00101010001010 | 3 | 10100010000010 | 3 | 00101010010100 | 4 |
| 200 | 10101000100101 | 2 | 00101010001010 | 4 | 10100010000010 | 4 | 00101010001010 | 3 |
| 201 | 10101000010001 | 2 | 00101010000101 | 2 | 10100001000001 | 2 | 00101010001010 | 4 |
| 202 | 10101000001000 | 3 | 00101010000010 | 3 | 10100000100000 | 1 | 00101010000101 | 2 |
| 203 | 10101000001000 | 4 | 00101010000100 | 4 | 10010101010101 | 2 | 00101010000010 | 3 |
| 204 | 10100101010001 | 2 | 00101001000001 | 2 | 10010101010010 | 3 | 00101010000010 | 4 |
| 205 | 10100100101001 | 2 | 00101000100000 | 1 | 10010101010010 | 4 | 00101001000001 | 2 |
| 206 | 10100100010101 | 2 | 00100101010101 | 3 | 10010101001001 | 2 | 00101000100000 | 1 |
| 207 | 10100100001001 | 2 | 00100101010100 | 4 | 10010100101010 | 3 | 00100101010100 | 3 |
| 208 | 10100100000100 | 3 | 00100101001010 | 3 | 10010100101010 | 4 | 00100101010100 | 4 |
| 209 | 10100100000100 | 4 | 00100101001010 | 4 | 10010100100101 | 2 | 00100101001010 | 3 |
| 210 | 10100010000101 | 2 | 00100101000101 | 2 | 10010100010001 | 2 | 00100101001010 | 4 |
| 211 | 10100010000010 | 3 | 00100101000010 | 3 | 10010100001000 | 3 | 00100101000101 | 2 |
| 212 | 10100010000010 | 4 | 00100101000010 | 4 | 10010100001000 | 4 | 00100101000010 | 3 |
| 213 | 10100001000001 | 2 | 00100100100001 | 2 | 10010010101001 | 2 | 00100101000010 | 4 |
| 214 | 10100000100000 | 1 | 00100100010000 | 1 | 10010100010001 | 2 | 00100100100001 | 2 |
| 215 | 10010101010101 | 2 | 00100010101010 | 3 | 10010010001001 | 2 | 00100100010000 | 1 |
| 216 | 10010101010010 | 3 | 00100010101010 | 4 | 10010010000100 | 3 | 00100010101010 | 3 |
| 217 | 10010101010010 | 4 | 00100010100101 | 2 | 10010010000100 | 4 | 00100010101010 | 4 |
| 218 | 10010101001001 | 2 | 00100010100010 | 3 | 10010001000101 | 2 | 00100010100101 | 2 |
| 219 | 10010100101010 | 3 | 00100010101010 | 4 | 10010001000010 | 3 | 00100010100010 | 3 |
| 220 | 10010100101010 | 4 | 00100010010001 | 2 | 10010001000010 | 4 | 00100010100010 | 4 |
| 221 | 10010100100101 | 2 | 00100010001000 | 3 | 10010000100001 | 2 | 00100010010001 | 2 |
| 222 | 10010100010001 | 2 | 00100010001000 | 4 | 10010000010000 | 1 | 00100010001000 | 3 |
| 223 | 10010100001000 | 3 | 00100001010101 | 2 | 10001010101010 | 3 | 00100010001000 | 4 |
| 224 | 10010100001000 | 4 | 00100001010010 | 3 | 10001010101010 | 4 | 00100001010101 | 2 |
| 225 | 10010010101001 | 2 | 00100001010010 | 4 | 10001010100101 | 2 | 00100001010010 | 3 |
| 226 | 10010010101011 | 2 | 00100001001001 | 2 | 10001010010001 | 2 | 00100001010010 | 4 |
| 227 | 10010010001001 | 2 | 00100001000100 | 3 | 10001010001000 | 3 | 00100001001001 | 2 |
| 228 | 10010010000100 | 3 | 00100001000100 | 4 | 10001010001000 | 4 | 00100001000100 | 3 |
| 229 | 10010010000100 | 4 | 00100001001010 | 3 | 10001010001001 | 2 | 00100001000100 | 4 |
| 230 | 10010001000101 | 2 | 00100000101010 | 4 | 10001001001001 | 2 | 00100001001010 | 3 |
| 231 | 10010001000010 | 3 | 00100000100101 | 2 | 10001001001000 | 3 | 00100000101010 | 4 |
| 232 | 10010001000010 | 4 | 00100000100010 | 3 | 10001001000100 | 4 | 00100000100101 | 2 |
| 233 | 10010000100001 | 2 | 00100000100010 | 4 | 10001000100101 | 2 | 00100000100010 | 3 |
| 234 | 10010000010000 | 1 | 00100000010001 | 2 | 10001000100010 | 3 | 00100000100010 | 4 |
| 235 | 10001010101010 | 3 | 00100000001000 | 3 | 10001000100010 | 4 | 00100000010001 | 2 |
| 236 | 10001010101010 | 4 | 00100000001000 | 4 | 10001000010001 | 2 | 00100000001000 | 3 |
| 237 | 10001010100101 | 2 | 00010101010101 | 2 | 10000101010001 | 2 | 00100000001000 | 4 |
| 238 | 10001010010001 | 2 | 00010100100000 | 1 | 10000101001000 | 3 | 00010101000001 | 2 |
| 239 | 10001010001000 | 3 | 00010010100001 | 2 | 10000010101000 | 4 | 00010100100000 | 1 |
| 240 | 10001010001000 | 4 | 00010010010000 | 1 | 10000100101001 | 2 | 00010010100001 | 2 |
| 241 | 10001001010101 | 2 | 00010001010001 | 2 | 10000100100100 | 3 | 00010010010000 | 1 |
| 242 | 10001001001001 | 2 | 00010001001001 | 3 | 10000100100100 | 4 | 00010001010001 | 2 |
| 243 | 10001001000100 | 3 | 00010001001000 | 4 | 10000100010101 | 2 | 00010001001000 | 3 |
| 244 | 10001001000100 | 4 | 00010001001001 | 2 | 10000100010010 | 3 | 00010001001000 | 4 |
| 245 | 10001000100101 | 2 | 00010000100010 | 3 | 10000100010010 | 4 | 00010000101001 | 2 |
| 246 | 10001000100010 | 3 | 00010000100100 | 4 | 10000100001001 | 2 | 00010000101001 | 3 |
| 247 | 10001000100010 | 4 | 00010000010101 | 2 | 10000010101010 | 3 | 00010000100100 | 4 |
| 248 | 10001000010001 | 2 | 00010000010010 | 3 | 10000010101000 | 4 | 00010000010101 | 2 |
| 249 | 10000101010000 | 2 | 00010000001010 | 4 | 10000010000101 | 2 | 00010000010010 | 3 |
| 250 | 10000100101001 | 2 | 00010000001001 | 3 | 10000001000010 | 2 | 00010000010010 | 4 |
| 251 | 10000100010101 | 2 | 00010000000100 | 3 | 10000001000000 | 1 | 00010000001001 | 2 |
| 252 | 10000100001001 | 2 | 00010000001001 | 4 | 00010101010000 | 1 | 00010000000100 | 3 |
| 253 | 10000010000101 | 2 | 00001000000010 | 3 | 00001001010000 | 1 | 00010000000100 | 4 |
| 254 | 10000001000001 | 2 | 00001000000010 | 4 | 00001000000101 | 2 | 01010101010010 | 3 |
| 255 | 10000000100000 | 1 | 00000100000001 | 2 | 00000100000001 | 2 | 01010101010010 | 4 |

FIG. 13A

| No | MCG1-2 | Ncg 1-2 | MCG2-2 | Ncg 2-2 | DCG1-2 | Ncg 3-2 | DCG2-2 | Ncg 4-2 |
|---|---|---|---|---|---|---|---|---|
| 0 | 10101010000000 | 1 | 00001010000000 | 1 | 00001010000000 | 1 | 00010010000000 | 1 |
| 1 | 10100101000000 | 1 | 00000101000000 | 1 | 00000101000000 | 1 | 01010101000000 | 1 |
| 2 | 10100010100000 | 1 | 00000010100000 | 1 | 00001001000000 | 1 | 01010010100000 | 1 |
| 3 | 10100001010000 | 1 | 00000001010000 | 1 | 00000100100000 | 1 | 01010001010000 | 1 |
| 4 | 10100000101000 | 3 | 00010010000000 | 1 | 10101010000000 | 1 | 01010000101000 | 3 |
| 5 | 10100000101000 | 4 | 00001001000000 | 1 | 10100101000000 | 1 | 01010000101000 | 4 |
| 6 | 10100000010100 | 3 | 00000100100000 | 1 | 10100010100000 | 1 | 01010000010100 | 3 |
| 7 | 10100000010100 | 4 | 00000010100000 | 1 | 10100001010000 | 1 | 01010000010100 | 4 |
| 8 | 01010000000010 | 3 | 00101010100000 | 1 | 00001010000001 | 2 | 01010000001010 | 3 |
| 9 | 01010000000010 | 4 | 00101001010000 | 1 | 00000101000001 | 2 | 01010000001010 | 4 |
| 10 | 10100000001010 | 3 | 00101000000001 | 2 | 10100000101000 | 3 | 00101000000001 | 2 |
| 11 | 01001000000001 | 2 | 00101000101000 | 3 | 00001010000010 | 3 | 01010000000101 | 2 |
| 12 | 10100000001010 | 4 | 00010100000001 | 2 | 10100000101000 | 4 | 00010100000001 | 2 |
| 13 | 10101010000001 | 2 | 00101000101000 | 4 | 00001010000010 | 4 | 00101010100000 | 1 |
| 14 | 10100000000101 | 2 | 00001010000001 | 2 | 10100000010100 | 3 | 00101010100000 | 3 |
| 15 | 10100101000001 | 2 | 00101000010100 | 3 | 00001001000001 | 2 | 00101001010000 | 1 |
| 16 | 01010101000000 | 1 | 00000101000001 | 2 | 10100000010100 | 4 | 01010000000010 | 4 |
| 17 | 10100010100001 | 2 | 00101000010100 | 4 | 00000101000001 | 3 | 00101001010000 | 3 |
| 18 | 01010010100000 | 1 | 00000010100001 | 2 | 10100000001010 | 3 | 01001010000001 | 2 |
| 19 | 01010001010000 | 1 | 00101000001010 | 3 | 10100000001010 | 4 | 00101010100001 | 2 |
| 20 | 10100001010000 | 1 | 00101000001010 | 4 | 00000101000010 | 4 | 00101010100100 | 3 |
| 21 | 01010000101000 | 3 | 00000001010001 | 2 | 10100000000101 | 2 | 00101000000010 | 3 |
| 22 | 01010000101000 | 4 | 00101000000101 | 2 | 00001010101010 | 3 | 00101000010100 | 4 |
| 23 | 10100000101001 | 2 | 00100010000000 | 1 | 00000100100001 | 2 | 00101000001010 | 3 |
| 24 | 01010000010100 | 3 | 00101010000000 | 1 | 00001010101010 | 4 | 00101000000010 | 4 |
| 25 | 01010000010100 | 4 | 00001010101010 | 1 | 00001010010100 | 3 | 00101000001010 | 4 |
| 26 | 01010000001010 | 3 | 00010100101000 | 3 | 00001010010100 | 4 | 00101000000101 | 2 |
| 27 | 01010000001010 | 4 | 00010100101010 | 4 | 00001010001010 | 3 | 00100010000000 | 1 |
| 28 | 01010000000101 | 2 | 00010100010100 | 3 | 00001010001010 | 4 | 00010101010000 | 1 |
| 29 | 10101001000000 | 1 | 00010100010100 | 4 | 00001010000101 | 2 | 00010100101010 | 3 |
| 30 | 10100100100000 | 1 | 00010100001010 | 3 | 00001001000000 | 1 | 00010100101000 | 4 |
| 31 | 10100010010000 | 1 | 00010100001010 | 4 | 00000101010100 | 3 | 00010100010100 | 3 |
| 32 | 10100001001000 | 3 | 00010100000101 | 2 | 00000101010100 | 4 | 00010100010100 | 4 |
| 33 | 10100001001000 | 4 | 00010001000000 | 1 | 00000101001010 | 3 | 00010100001010 | 3 |
| 34 | 10100000100100 | 3 | 00001010101000 | 3 | 00000101001010 | 4 | 00010100001010 | 4 |
| 35 | 10100000010101 | 2 | 00001010101010 | 4 | 10101010000001 | 2 | 00010100000101 | 2 |
| 36 | 10100000000100 | 3 | 00001010010100 | 3 | 10100101000001 | 2 | 00010001000000 | 1 |
| 37 | 10100000000100 | 4 | 00001010010100 | 4 | 10100010100001 | 2 | 01010100101000 | 1 |
| 38 | 10100000100100 | 4 | 00001010001010 | 3 | 00000101000101 | 2 | 01010010010000 | 1 |
| 39 | 10100000010010 | 3 | 00001010010101 | 4 | 00000100010010 | 1 | 01010001001000 | 3 |
| 40 | 10100000010010 | 4 | 00001010000101 | 2 | 10101010000000 | 1 | 01010001001000 | 4 |
| 41 | 10100000001001 | 2 | 00001000100000 | 1 | 10100100100000 | 1 | 01010000100100 | 3 |
| 42 | 10010101000000 | 1 | 00000101010100 | 3 | 10100010010000 | 1 | 01010000100100 | 4 |
| 43 | 10010010100000 | 1 | 00000101010100 | 4 | 10100001001000 | 3 | 01010000010010 | 3 |
| 44 | 10010001010000 | 1 | 00000101001010 | 3 | 10100001001000 | 4 | 01010000010010 | 4 |
| 45 | 10010000101000 | 3 | 00000101001010 | 4 | 10100000100100 | 3 | 01010000001001 | 2 |
| 46 | 10010000101000 | 4 | 00000101001010 | 2 | 10100000100100 | 4 | 01001010100000 | 1 |
| 47 | 10010000000010 | 3 | 00101000000010 | 4 | 10100001010001 | 2 | 00100100000001 | 2 |
| 48 | 10010000000010 | 4 | 00100100000001 | 2 | 10100000101001 | 2 | 00010100000010 | 3 |
| 49 | 10010010000001 | 2 | 00101000001010 | 3 | 10100000010101 | 2 | 00010101010000 | 4 |
| 50 | 10010000010100 | 3 | 00000100010000 | 1 | 10100000010010 | 3 | 01001001010000 | 1 |
| 51 | 10010000010100 | 4 | 00000010010100 | 3 | 10100000010010 | 4 | 01001001010001 | 3 |
| 52 | 10010000001010 | 3 | 00000010101010 | 4 | 10100000001001 | 2 | 01001001101000 | 4 |
| 53 | 10010000001010 | 4 | 00000010100101 | 2 | 10010101000000 | 1 | 01001000010100 | 3 |
| 54 | 10010000000101 | 2 | 00000010001000 | 3 | 10010010100000 | 1 | 01001000010100 | 4 |
| 55 | 01010100100000 | 1 | 00000010001000 | 4 | 10010001010000 | 1 | 01001000001010 | 3 |
| 56 | 01010010100000 | 1 | 00000010101001 | 2 | 10010000101000 | 3 | 01001000001010 | 4 |
| 57 | 01010001001000 | 3 | 00101010010000 | 1 | 10010000101000 | 4 | 01001000000101 | 2 |
| 58 | 01010101000001 | 2 | 00010100000010 | 4 | 10100000000101 | 3 | 00010010000001 | 2 |
| 59 | 01010101100100 | 2 | 00010010000001 | 2 | 10100000000100 | 4 | 01010101000001 | 2 |
| 60 | 01010001010001 | 2 | 00001010000010 | 3 | 10010000000010 | 3 | 01010010100001 | 2 |
| 61 | 01010001001000 | 4 | 00101001001000 | 3 | 10010000000010 | 4 | 01000010000000 | 1 |
| 62 | 01010000100100 | 3 | 00101001001000 | 4 | 10010000101000 | 4 | 00101010010000 | 1 |
| 63 | 01010000100100 | 4 | 00101000100100 | 3 | 10010000001010 | 3 | 00101001001000 | 3 |
| 64 | 01010000010010 | 3 | 00101000100100 | 4 | 10010000001010 | 4 | 00101001001000 | 4 |
| 65 | 01010000010010 | 4 | 00101000010010 | 3 | 10010000000101 | 2 | 00101000100100 | 3 |
| 66 | 01010000001001 | 2 | 00101000010010 | 4 | 00001010100100 | 3 | 00101000100100 | 4 |
| 67 | 01010000101001 | 2 | 00001010000010 | 4 | 10010000100100 | 4 | 01010010101000 | 2 |
| 68 | 01010000101101 | 2 | 00001001000010 | 2 | 10001000000010 | 2 | 01010001001010 | 2 |
| 69 | 01010000000100 | 3 | 00000101000010 | 3 | 00001010100000 | 2 | 01010000010101 | 2 |
| 70 | 01001010100000 | 1 | 00101000001001 | 2 | 00001010100100 | 4 | 00101000010010 | 3 |
| 71 | 01010010100010 | 1 | 00100101010000 | 1 | 00001010010010 | 3 | 00101000010010 | 4 |
| 72 | 01010001001000 | 3 | 00100100101000 | 3 | 00001010010010 | 4 | 00101000100101 | 2 |
| 73 | 01010001001000 | 4 | 00100100101000 | 4 | 00001010010101 | 2 | 00100101010000 | 1 |
| 74 | 01010000000100 | 4 | 00000101000010 | 4 | 00001010010101 | 2 | 01010000000100 | 3 |
| 75 | 01001000000010 | 3 | 00000100100001 | 2 | 00001010000100 | 3 | 01010000000100 | 4 |
| 76 | 01001000000010 | 4 | 00000010010010 | 3 | 00001010000100 | 4 | 01001010000010 | 3 |
| 77 | 01001000010100 | 3 | 00100100010100 | 3 | 00001001010100 | 3 | 00100100101000 | 3 |
| 78 | 01001000010100 | 4 | 00100100010100 | 4 | 00001010010100 | 4 | 00100100101000 | 4 |
| 79 | 01001000001010 | 3 | 00100100001010 | 3 | 00001001001010 | 3 | 00100100010100 | 3 |
| 80 | 01000100000001 | 2 | 00000010100010 | 4 | 00001001000010 | 3 | 01001000000010 | 4 |
| 81 | 10101010100010 | 2 | 00000010010010 | 2 | 00001010000010 | 2 | 01000010000001 | 2 |
| 82 | 10101010000010 | 4 | 00000001010010 | 3 | 00001000100001 | 2 | 00101010100001 | 2 |
| 83 | 01001010000010 | 4 | 00100100100010 | 4 | 00001010010100 | 4 | 00100100100100 | 4 |
| 84 | 01001000000101 | 2 | 00100100000101 | 2 | 00001001000101 | 2 | 00101010101010 | 3 |
| 85 | 10101001000001 | 2 | 00000010010010 | 4 | 00000101010101 | 2 | 00101001010001 | 2 |
| 86 | 10100101000010 | 3 | 00000010001001 | 2 | 00000101000100 | 3 | 00101000101001 | 2 |
| 87 | 10100101000010 | 4 | 00101010100001 | 2 | 00000101000100 | 4 | 00101000101101 | 2 |
| 88 | 01000010100000 | 1 | 00100100010001 | 1 | 00000010100010 | 4 | 00100100001010 | 4 |
| 89 | 10101010101000 | 3 | 00010101001000 | 3 | 00000101010010 | 3 | 00100100000101 | 2 |

FIG. 13B

| No | MCG1-2 | Ncg 1-2 | MCG2-2 | Ncg 2-2 | DCG1-2 | Ncg 3-2 | DCG2-2 | Ncg 4-2 |
|---|---|---|---|---|---|---|---|---|
| 90 | 10101010101000 | 4 | 00101101001000 | 4 | 00000101010010 | 4 | 00100001000000 | 1 |
| 91 | 10100100100001 | 2 | 00101001010001 | 2 | 00000100100010 | 3 | 00101000000100 | 3 |
| 92 | 10101010010100 | 3 | 00101000101001 | 2 | 00000101001001 | 2 | 00101000000100 | 4 |
| 93 | 10100010100010 | 3 | 00101000010101 | 2 | 00000100100010 | 4 | 00100100000010 | 3 |
| 94 | 10101010010100 | 4 | 00010100100100 | 3 | 00000100101010 | 3 | 00010101001000 | 3 |
| 95 | 10101010001010 | 3 | 00101000000100 | 3 | 00000100101010 | 4 | 00100100000010 | 4 |
| 96 | 10100010100010 | 4 | 00010100100100 | 4 | 00000100010001 | 2 | 00010101001000 | 4 |
| 97 | 10101010001010 | 4 | 00101000000100 | 4 | 00000100100101 | 2 | 00100010000001 | 2 |
| 98 | 10101010000101 | 2 | 00010100010010 | 3 | 00000100001000 | 3 | 00010100100100 | 3 |
| 99 | 10100010010001 | 2 | 00100100000010 | 3 | 10101010000010 | 3 | 00010101010001 | 2 |
| 100 | 10101000100000 | 1 | 00010100001010 | 4 | 00000100001000 | 4 | 00010100100100 | 4 |
| 101 | 10100101010100 | 3 | 00010100001001 | 2 | 10101010101000 | 3 | 00010100010010 | 3 |
| 102 | 10100101010100 | 4 | 00100100000010 | 4 | 10101010101000 | 4 | 00010100101001 | 2 |
| 103 | 10100001010100 | 3 | 00010010101000 | 3 | 10101010000010 | 4 | 00010100010010 | 4 |
| 104 | 10100001010010 | 4 | 00010010101000 | 4 | 10101001000001 | 2 | 00010100001001 | 2 |
| 105 | 10100101001010 | 3 | 00100010000010 | 2 | 10101010010100 | 3 | 00010100010101 | 2 |
| 106 | 10100101001010 | 4 | 00010101010100 | 3 | 10101010010100 | 4 | 00010010101000 | 3 |
| 107 | 10100101000101 | 2 | 00010100010100 | 4 | 10101010010010 | 3 | 00010100010100 | 4 |
| 108 | 10100100010000 | 1 | 00010100001010 | 3 | 10101010001010 | 4 | 00010010010100 | 3 |
| 109 | 10100010101010 | 3 | 00010101010001 | 2 | 10101010000101 | 2 | 00010100000100 | 3 |
| 110 | 10100101010101 | 4 | 00010100101001 | 2 | 10101000100000 | 1 | 00010100000100 | 4 |
| 111 | 10100010100101 | 2 | 00010100001010 | 4 | 10100101010100 | 3 | 00010010010100 | 4 |
| 112 | 10100010001000 | 3 | 00010010000101 | 2 | 10101010101000 | 4 | 00010010001010 | 3 |
| 113 | 10100001001001 | 2 | 00010000100000 | 1 | 10100101000010 | 3 | 00010010001010 | 4 |
| 114 | 10100001010010 | 3 | 00001010100100 | 3 | 10100101000010 | 4 | 00010010000101 | 2 |
| 115 | 10100001010101 | 4 | 00010101010000 | 4 | 10100100100001 | 2 | 00010000100000 | 1 |
| 116 | 10100010001000 | 4 | 00010100010010 | 3 | 10100101001010 | 3 | 01010101010100 | 3 |
| 117 | 10100000100101 | 2 | 00010101010010 | 4 | 10100001010010 | 3 | 01010101010100 | 4 |
| 118 | 10100001010101 | 2 | 00001010001001 | 2 | 10100101001010 | 4 | 01010101001010 | 3 |
| 119 | 10100001000100 | 3 | 00010100010101 | 2 | 10100101000101 | 2 | 01010101010010 | 4 |
| 120 | 10100000001000 | 3 | 00010010000010 | 3 | 10100010101010 | 4 | 01010101000101 | 2 |
| 121 | 10100001000100 | 4 | 00010100000100 | 4 | 10100100010000 | 1 | 00010010000010 | 3 |
| 122 | 10100001010010 | 3 | 00010010100000 | 3 | 10100001010101 | 3 | 00010010000010 | 4 |
| 123 | 10100000001000 | 4 | 00001001010100 | 3 | 10100010010001 | 2 | 00010001000001 | 2 |
| 124 | 10100000100010 | 4 | 00001001010100 | 4 | 10100010101010 | 4 | 01010100010000 | 1 |
| 125 | 10100001010001 | 2 | 00010010000010 | 4 | 10100010100101 | 2 | 01010010101010 | 3 |
| 126 | 10010100100000 | 1 | 00010010001010 | 3 | 10100010001000 | 3 | 01010101000010 | 3 |
| 127 | 10010101000001 | 2 | 00010010100010 | 4 | 10100010001010 | 3 | 01010010101010 | 4 |
| 128 | 10010010100001 | 2 | 00010001000001 | 2 | 10100001010010 | 4 | 01010010100101 | 2 |
| 129 | 10010010010000 | 1 | 00001001000101 | 2 | 10100001001000 | 4 | 01010010001000 | 4 |
| 130 | 10010001001000 | 3 | 00001000010000 | 1 | 10100001010101 | 2 | 01010010001000 | 3 |
| 131 | 10010010010000 | 4 | 00000101010010 | 3 | 10100001000100 | 3 | 01010010001000 | 4 |
| 132 | 10010000101000 | 3 | 00010010101001 | 2 | 10100001000100 | 4 | 01010010101010 | 2 |
| 133 | 10010000100100 | 4 | 00001010010101 | 2 | 10100000100010 | 3 | 01010100100001 | 2 |
| 134 | 10010000010010 | 3 | 00000101010010 | 4 | 10100000010000 | 4 | 01010010100100 | 3 |
| 135 | 10010000010010 | 4 | 00000101001001 | 2 | 10100000010001 | 2 | 01010010001000 | 3 |
| 136 | 10010001010001 | 4 | 00000100101010 | 3 | 10100001001001 | 2 | 01010000100100 | 4 |
| 137 | 10010000101001 | 2 | 00000100101010 | 4 | 10100000101010 | 3 | 01010000100010 | 3 |
| 138 | 10010000010101 | 2 | 00000100100101 | 2 | 10100000101010 | 4 | 01010000100010 | 4 |
| 139 | 10010000001001 | 2 | 00000100001000 | 3 | 10010100100000 | 1 | 01010000010001 | 2 |
| 140 | 10010000000100 | 3 | 00000100001000 | 4 | 10100000100101 | 2 | 01001010010000 | 1 |
| 141 | 10001010100000 | 1 | 00001010000100 | 3 | 10010010010000 | 1 | 01001001001000 | 3 |
| 142 | 10001010101000 | 1 | 00010100001000 | 4 | 10010001001000 | 3 | 01010010100010 | 4 |
| 143 | 10010000000100 | 4 | 00001001000010 | 3 | 10100000100000 | 3 | 01010010010001 | 2 |
| 144 | 10001000101000 | 3 | 00000100101001 | 2 | 10010001001000 | 4 | 01010001010010 | 3 |
| 145 | 10001000101000 | 4 | 00001001000010 | 4 | 10010000100100 | 3 | 01001010001000 | 4 |
| 146 | 10001000010100 | 3 | 00000100010101 | 2 | 10010000010010 | 4 | 01010001010100 | 3 |
| 147 | 10001000000010 | 4 | 00101010010010 | 3 | 10100000001000 | 4 | 01001010010100 | 4 |
| 148 | 10001000000010 | 4 | 00010100010001 | 2 | 10010101000001 | 2 | 01001010010100 | 3 |
| 149 | 10001000001010 | 3 | 00101010010101 | 2 | 10010000010010 | 3 | 01010001001001 | 2 |
| 150 | 10001000001010 | 4 | 00101010100101 | 2 | 10010000010010 | 4 | 01001010010010 | 3 |
| 151 | 10001000001010 | 3 | 00101010100100 | 3 | 10010010100001 | 2 | 01001010001000 | 4 |
| 152 | 10001000000101 | 2 | 00000101010101 | 2 | 10010001010001 | 3 | 01001010001001 | 2 |
| 153 | 10000010000000 | 1 | 00000101000100 | 3 | 10010000101001 | 3 | 01010000101010 | 3 |
| 154 | 10000100000001 | 2 | 00101010001001 | 4 | 10010000101001 | 2 | 01010000101010 | 4 |
| 155 | 01010101000010 | 3 | 00101001010101 | 2 | 10010000010101 | 2 | 01000101010000 | 1 |
| 156 | 01010101000010 | 4 | 00101001010100 | 3 | 10010101001000 | 1 | 01000100101000 | 3 |
| 157 | 01010101010101 | 3 | 00101001001000 | 4 | 10010000000100 | 3 | 01000100101000 | 4 |
| 158 | 01010100100001 | 2 | 00101000100010 | 3 | 10010000000100 | 4 | 01000100010100 | 3 |
| 159 | 01010101001010 | 4 | 00000101010100 | 4 | 10001001010000 | 1 | 01000100010010 | 4 |
| 160 | 01010101001010 | 3 | 00000100100010 | 4 | 10001000000010 | 3 | 01010000100101 | 2 |
| 161 | 01010101001010 | 4 | 00000100100010 | 4 | 10001000000010 | 4 | 01010000001000 | 3 |
| 162 | 01010010100010 | 3 | 00101000100010 | 4 | 10001000000010 | 2 | 01010000001000 | 4 |
| 163 | 01010010100010 | 4 | 00000100010001 | 2 | 10001000101000 | 3 | 01001000010010 | 3 |
| 164 | 01010101010101 | 2 | 00101010100100 | 2 | 00001010101010 | 3 | 01001010100001 | 4 |
| 165 | 01010100010000 | 1 | 00101011001000 | 3 | 00001010101010 | 4 | 01000100001010 | 4 |
| 166 | 01010010101010 | 3 | 00101010101010 | 4 | 10001000001010 | 4 | 01000100001010 | 2 |
| 167 | 01010010010001 | 2 | 00000101010100 | 3 | 00001010100101 | 2 | 01000001000000 | 1 |
| 168 | 01010001010010 | 3 | 00000010100100 | 4 | 00010100010000 | 3 | 01001001010000 | 2 |
| 169 | 01010001010010 | 4 | 00101010100100 | 3 | 00001010001000 | 3 | 01010000101001 | 2 |
| 170 | 01010010101010 | 4 | 00101010100100 | 4 | 00001001010101 | 2 | 00101010101010 | 3 |
| 171 | 01010010101010 | 2 | 00101010100100 | 3 | 00001001000100 | 4 | 00101010101010 | 4 |
| 172 | 01010010001000 | 3 | 00000101010010 | 3 | 00001001000100 | 3 | 00101010100101 | 2 |
| 173 | 01010001001001 | 2 | 00000100010010 | 4 | 00001010100010 | 2 | 01001000010101 | 2 |
| 174 | 01010010101010 | 3 | 00000100010010 | 2 | 00001010100010 | 3 | 01001010000100 | 3 |
| 175 | 01010010101000 | 4 | 00101010010100 | 4 | 10001000010100 | 3 | 01001000000100 | 4 |
| 176 | 01010000101010 | 2 | 00101001000011 | 2 | 00001000010001 | 2 | 00101010000100 | 3 |
| 177 | 01010000100101 | 2 | 00100101101000 | 3 | 00000101001000 | 3 | 00101010001000 | 4 |
| 178 | 01010001001000 | 3 | 00000010101010 | 3 | 10001000001010 | 4 | 00101001010101 | 2 |
| 179 | 01010001010101 | 2 | 00000001010100 | 4 | 00000101001000 | 4 | 01000100000010 | 3 |

FIG. 13C

| No | MCG1-2 | Ncg 1-2 | MCG2-2 | Ncg 2-2 | DCG1-2 | Ncg 3-2 | DCG2-2 | Ncg 4-2 |
|---|---|---|---|---|---|---|---|---|
| 180 | 01010001000100 | 3 | 00100010101000 | 4 | 00000100100100 | 3 | 01000100000010 | 4 |
| 181 | 01010000001000 | 4 | 00000001001010 | 3 | 00000100100100 | 4 | 00101001000100 | 3 |
| 182 | 01001010100001 | 2 | 00000001001010 | 4 | 10001000001010 | 3 | 01000010000001 | 2 |
| 183 | 01001001010001 | 2 | 00101010100010 | 3 | 00000100010010 | 3 | 00101010100010 | 3 |
| 184 | 01001000101001 | 2 | 00100010010100 | 3 | 00000100010010 | 4 | 00101010100010 | 4 |
| 185 | 01001000010101 | 2 | 00100010010100 | 4 | 00000100001001 | 2 | 00101001000010 | 4 |
| 186 | 01010001000100 | 4 | 00101010100010 | 4 | 10101010101001 | 2 | 00101000100010 | 3 |
| 187 | 01010000100010 | 3 | 00101010010001 | 2 | 10101010010101 | 2 | 00101010010001 | 2 |
| 188 | 01010000100010 | 4 | 00101001010010 | 3 | 10101010000100 | 3 | 00101001010010 | 3 |
| 189 | 01001000000100 | 3 | 00101001010010 | 4 | 10001000001010 | 4 | 00101001010010 | 4 |
| 190 | 01010000010001 | 2 | 00101001001001 | 2 | 10101010000100 | 4 | 00101001001001 | 2 |
| 191 | 01001000000100 | 4 | 00100010001010 | 3 | 10101001000010 | 3 | 00101000101010 | 3 |
| 192 | 01000100000010 | 3 | 00100010001010 | 4 | 10101001000010 | 4 | 00101000100010 | 4 |
| 193 | 01000100000010 | 4 | 00100010000101 | 2 | 10101000100001 | 2 | 00101000100001 | 2 |
| 194 | 01001010010000 | 1 | 00101000101010 | 3 | 10100101010101 | 2 | 00100101001000 | 3 |
| 195 | 01000010000001 | 2 | 00100000100000 | 1 | 10001000000101 | 2 | 00101000101010 | 4 |
| 196 | 10101010010101 | 2 | 00010101010101 | 2 | 10100101000100 | 3 | 00100101001000 | 4 |
| 197 | 10101010000100 | 3 | 00010101000100 | 3 | 10100101000100 | 4 | 00100101000100 | 3 |
| 198 | 10101010000100 | 4 | 00010101000100 | 4 | 10000010000000 | 1 | 00100100100100 | 4 |
| 199 | 10101001000010 | 3 | 00010100100010 | 3 | 10100100100010 | 3 | 00100100100010 | 3 |
| 200 | 10101001000010 | 4 | 00010100100010 | 4 | 10100100100010 | 4 | 00100100010010 | 4 |
| 201 | 01001001001000 | 3 | 00010101000001 | 2 | 10100100001001 | 2 | 00100101001001 | 2 |
| 202 | 10101000100001 | 2 | 00101000101010 | 4 | 00001010100010 | 3 | 00100010101010 | 3 |
| 203 | 10100101010101 | 2 | 00101000100101 | 2 | 00001010100010 | 4 | 00101000100101 | 2 |
| 204 | 10100101001000 | 3 | 00100010001000 | 3 | 10100010100010 | 3 | 00101000001000 | 3 |
| 205 | 10100101000100 | 4 | 00010010100100 | 3 | 10100010100100 | 4 | 00101000001000 | 4 |
| 206 | 10100100100010 | 3 | 00010010100100 | 4 | 10100010010010 | 3 | 00100010101000 | 4 |
| 207 | 01001001001000 | 4 | 00010010010010 | 3 | 10100010010010 | 4 | 00100010010100 | 3 |
| 208 | 10100100100010 | 4 | 00010010010010 | 4 | 10100010001001 | 2 | 00100010010100 | 4 |
| 209 | 10100100001001 | 2 | 00010001001001 | 2 | 10100001010100 | 3 | 00100010001010 | 3 |
| 210 | 01001000100100 | 3 | 00010001010100 | 3 | 00001010010001 | 2 | 00100010001010 | 4 |
| 211 | 10100010100100 | 3 | 00101000001000 | 4 | 10100001010100 | 4 | 00100010000101 | 2 |
| 212 | 10100010101010 | 4 | 00100010010001 | 2 | 10100001001010 | 3 | 00100101010001 | 2 |
| 213 | 10100010010010 | 3 | 00100100101001 | 2 | 10100001001010 | 4 | 00100100101001 | 2 |
| 214 | 01001000100100 | 4 | 00010000101100 | 2 | 10100001000101 | 2 | 00100100010101 | 2 |
| 215 | 01001000010010 | 3 | 00010001001010 | 3 | 00001001010010 | 3 | 00100001010000 | 1 |
| 216 | 10100010010010 | 4 | 00010001001010 | 4 | 10100000010000 | 1 | 00010101010101 | 2 |
| 217 | 10100010001001 | 2 | 00010001001001 | 2 | 10010101010010 | 3 | 00010101001000 | 3 |
| 218 | 10100001010100 | 3 | 00100100010101 | 2 | 00001001010010 | 4 | 00010101000100 | 4 |
| 219 | 10100001010100 | 4 | 00100100100100 | 3 | 10010101010010 | 4 | 00100100000100 | 3 |
| 220 | 10100001001010 | 3 | 00100100000100 | 4 | 10010100100001 | 2 | 00100010000100 | 4 |
| 221 | 10100001001010 | 4 | 00010000010000 | 1 | 10010010100010 | 3 | 00100010000010 | 3 |
| 222 | 01001000010010 | 4 | 00001010100010 | 3 | 00010010010010 | 2 | 00010100100010 | 3 |
| 223 | 10100001000101 | 2 | 00001010100010 | 4 | 10010010100010 | 4 | 00010100100010 | 4 |
| 224 | 10100000010000 | 1 | 00100010000100 | 3 | 10010010010001 | 2 | 00010100010001 | 2 |
| 225 | 10010101010010 | 3 | 00100010000010 | 4 | 10010001010010 | 3 | 00100010000010 | 4 |
| 226 | 10010101000010 | 4 | 00100001000001 | 2 | 00001000101010 | 3 | 00100001000001 | 2 |
| 227 | 01001000001001 | 2 | 00010101010010 | 2 | 10010010010010 | 4 | 00010101010010 | 3 |
| 228 | 10010100100001 | 2 | 00001001010010 | 3 | 10010001001001 | 2 | 00010010100100 | 3 |
| 229 | 10010010100010 | 3 | 00010101010010 | 3 | 10010000101010 | 3 | 00010010100100 | 4 |
| 230 | 01001010010000 | 1 | 00010101010100 | 4 | 00001000101010 | 4 | 00010101010010 | 4 |
| 231 | 10010010100010 | 4 | 00010101001001 | 2 | 10010000101010 | 4 | 00010101001001 | 2 |
| 232 | 10010010100001 | 2 | 00010001001010 | 4 | 10010000100101 | 2 | 00010100101010 | 3 |
| 233 | 10010001010010 | 3 | 00001001001001 | 2 | 00001000100101 | 2 | 00010010010010 | 3 |
| 234 | 01000100101000 | 3 | 00001000101010 | 3 | 10010000001000 | 3 | 00010010010010 | 4 |
| 235 | 10010001010010 | 4 | 00010100101010 | 3 | 10010000001001 | 2 | 00010010001001 | 2 |
| 236 | 10010001001001 | 2 | 00010100101010 | 4 | 10001010100001 | 2 | 00010100101010 | 4 |
| 237 | 10010000101010 | 3 | 00010100100101 | 2 | 00001010001000 | 3 | 00010100100101 | 2 |
| 238 | 01000100101000 | 4 | 00001000101010 | 4 | 10010001010010 | 2 | 00010100100100 | 3 |
| 239 | 10010000101010 | 4 | 00010100001000 | 3 | 10001000101001 | 3 | 00010001010100 | 3 |
| 240 | 10010000100101 | 2 | 00001000100101 | 2 | 00001000010000 | 4 | 00010100000100 | 4 |
| 241 | 10010000001000 | 3 | 00010100101000 | 4 | 10001000010101 | 2 | 00010001010100 | 4 |
| 242 | 01000100010100 | 3 | 00001000001000 | 3 | 10001000000100 | 3 | 00010010101001 | 2 |
| 243 | 10010000001000 | 4 | 00001000001000 | 4 | 00000101010001 | 2 | 00010001001010 | 3 |
| 244 | 10001010100001 | 2 | 00010010101001 | 2 | 10001000000100 | 4 | 00010001001010 | 4 |
| 245 | 01000100010100 | 4 | 00000101010100 | 2 | 10000100000010 | 3 | 00010010101001 | 2 |
| 246 | 10001001010001 | 2 | 00000100101001 | 2 | 10000010000010 | 4 | 00010001000101 | 2 |
| 247 | 10001000101001 | 2 | 00010010010101 | 2 | 10000010000001 | 2 | 00010000010000 | 1 |
| 248 | 10001000101001 | 2 | 00000100010101 | 2 | 00010101010010 | 1 | 00100010000100 | 3 |
| 249 | 01001000001010 | 3 | 00000100000100 | 3 | 00001000001001 | 2 | 01010101001001 | 2 |
| 250 | 01001000001010 | 4 | 00000000000010 | 4 | 00000100101001 | 2 | 01010100101010 | 3 |
| 251 | 01001000000101 | 2 | 00001010000100 | 3 | 00000101010010 | 1 | 01010100101010 | 4 |
| 252 | 10001000000100 | 3 | 00010010000100 | 4 | 00000100010101 | 2 | 00010010000100 | 4 |
| 253 | 10001000000100 | 4 | 00010001000010 | 3 | 00000100000100 | 3 | 00010010001010 | 3 |
| 254 | 01000001000000 | 1 | 00010001000010 | 4 | 00000100000000 | 4 | 00010001000010 | 4 |
| 255 | 10000010000001 | 2 | 00010000100001 | 2 | 00000100000101 | 2 | 00010000100001 | 2 |

FIG. 15A

| Data Symbol | MCG1 Code Word MSB LSB | NCG | MCG2 Code Word MSB LSB | NCG | DCG1 Code Word MSB LSB | NCG | DCG2 Code Word MSB LSB | NCG |
|---|---|---|---|---|---|---|---|---|
| 000 | 101010000000 | 1 | 001010000000 | 1 | 101010000000 | 1 | 001010000000 | 1 |
| 001 | 100101000000 | 1 | 000101000000 | 1 | 100101000000 | 1 | 000101000000 | 1 |
| 002 | 100010100000 | 1 | 000010100000 | 1 | 100010100000 | 1 | 010000000010 | 3 |
| 003 | 100001010000 | 1 | 000001010000 | 1 | 100001010000 | 1 | 010000000010 | 4 |
| 004 | 100000101000 | 3 | 000000101000 | 3 | 100000101000 | 3 | 010000001000 | 3 |
| 005 | 100000101000 | 4 | 000000101000 | 4 | 100000101000 | 4 | 010000010001 | 2 |
| 006 | 100000010100 | 3 | 000000010100 | 3 | 100000010100 | 3 | 010000010010 | 3 |
| 007 | 100000010100 | 4 | 000000010100 | 4 | 100000010100 | 4 | 010000010010 | 4 |
| 008 | 100000001010 | 1 | 001001000000 | 1 | 100000001010 | 3 | 001001000000 | 1 |
| 009 | 100000000101 | 2 | 000100100000 | 1 | 100000000101 | 2 | 000100100000 | 1 |
| 010 | 010101000000 | 1 | 000100010000 | 1 | 000010010000 | 1 | 010101000000 | 1 |
| 011 | 010010100000 | 1 | 000001001000 | 3 | 000001001000 | 3 | 010010100000 | 1 |
| 012 | 010001010000 | 1 | 000001001000 | 4 | 000001001000 | 4 | 010010010000 | 1 |
| 013 | 010000101000 | 3 | 000000100100 | 3 | 100000001010 | 4 | 010000101000 | 3 |
| 014 | 010000101000 | 4 | 000000100100 | 4 | 100000010010 | 3 | 010000101000 | 4 |
| 015 | 010000010100 | 3 | 000000010010 | 3 | 100000100010 | 3 | 010000010100 | 3 |
| 016 | 010000010100 | 4 | 000000010010 | 4 | 100000101010 | 3 | 010000010100 | 4 |
| 017 | 010000001010 | 3 | 010100010100 | 3 | 100001010000 | 3 | 010000001010 | 3 |
| 018 | 010000001010 | 4 | 010100010100 | 4 | 100001001010 | 3 | 010000001010 | 4 |
| 019 | 010000000101 | 2 | 010100001010 | 3 | 100001010010 | 3 | 010000000101 | 2 |
| 020 | 010000000010 | 3 | 001010000001 | 2 | 100010000010 | 3 | 001010000001 | 2 |
| 021 | 010000000010 | 4 | 000101000001 | 2 | 100010001010 | 3 | 000101000001 | 2 |
| 022 | 010010100000 | 1 | 001010100000 | 1 | 100010010010 | 3 | 001010100000 | 1 |
| 023 | 010100000001 | 2 | 001000000001 | 2 | 100010100010 | 3 | 001000000001 | 2 |
| 024 | 101010000001 | 2 | 000010100001 | 2 | 101010000001 | 2 | 010000100010 | 3 |
| 025 | 101001000000 | 1 | 010100001010 | 4 | 101001000000 | 1 | 010100010010 | 3 |
| 026 | 101000000001 | 2 | 001000000010 | 3 | 101000000001 | 2 | 001000000010 | 3 |
| 027 | 100101000001 | 2 | 000010010001 | 2 | 100101000001 | 2 | 010000100010 | 4 |
| 028 | 100100100000 | 1 | 010100000101 | 2 | 100100100000 | 1 | 010100000101 | 2 |
| 029 | 100010100001 | 2 | 000000101001 | 2 | 100010100001 | 2 | 010000100100 | 3 |
| 030 | 100010010000 | 1 | 010001000001 | 1 | 100010010000 | 1 | 010001000000 | 1 |
| 031 | 100001010001 | 2 | 000000010101 | 2 | 100001010001 | 2 | 010000100100 | 4 |
| 032 | 100001001000 | 3 | 001010101000 | 3 | 100001001000 | 3 | 001010101000 | 3 |
| 033 | 100001001000 | 4 | 001010101000 | 4 | 100001001000 | 4 | 001010101000 | 4 |
| 034 | 100000101001 | 2 | 010010000001 | 2 | 100000101001 | 2 | 010010000001 | 2 |
| 035 | 100000100100 | 3 | 001010010100 | 3 | 100000101010 | 3 | 001010010100 | 3 |
| 036 | 100000100100 | 4 | 001010010100 | 4 | 100000100100 | 4 | 001010010100 | 4 |
| 037 | 100000010101 | 2 | 001010000010 | 3 | 100000010101 | 2 | 001010000010 | 3 |
| 038 | 100000010010 | 1 | 001010001010 | 3 | 100000010010 | 4 | 001010001010 | 3 |
| 039 | 100000001001 | 2 | 001010001001 | 4 | 100000001001 | 2 | 001010001010 | 4 |
| 040 | 100000000100 | 3 | 001010000010 | 4 | 100000000100 | 3 | 001010000010 | 4 |
| 041 | 100000000100 | 4 | 001001000001 | 2 | 100000000100 | 4 | 001001000001 | 2 |
| 042 | 010101000001 | 2 | 000101000010 | 3 | 100010101010 | 3 | 000101000010 | 3 |
| 043 | 010100100000 | 1 | 001010000101 | 2 | 100100000010 | 3 | 001010000101 | 2 |
| 044 | 010010100001 | 2 | 000010100010 | 4 | 100100100010 | 3 | 000101000010 | 4 |
| 045 | 010010010000 | 1 | 001000100000 | 1 | 100100010010 | 3 | 001000100000 | 1 |
| 046 | 010001010001 | 2 | 000100100001 | 2 | 100100100010 | 3 | 000100100001 | 2 |
| 047 | 010001001000 | 3 | 000101010100 | 3 | 100100101010 | 3 | 000101010100 | 3 |
| 048 | 010001001000 | 4 | 000101010100 | 4 | 100101010000 | 3 | 000101010100 | 4 |
| 049 | 010000101001 | 2 | 000010100010 | 3 | 000010100010 | 3 | 010000101001 | 2 |
| 050 | 010000100100 | 3 | 000101001010 | 3 | 100101001010 | 3 | 000101001010 | 3 |
| 051 | 010000100100 | 4 | 000101001010 | 4 | 100101010010 | 3 | 000101001010 | 4 |
| 052 | 010000010101 | 2 | 000010100010 | 4 | 000010100010 | 4 | 010000010101 | 2 |
| 053 | 010000010010 | 3 | 000101000101 | 2 | 000000100000 | 1 | 001010001001 | 2 |
| 054 | 010000010010 | 4 | 000100010000 | 1 | 000001000001 | 2 | 000101010000 | 1 |
| 055 | 010000001001 | 2 | 000010101010 | 3 | 000010101010 | 3 | 010000001001 | 2 |
| 056 | 010000000100 | 3 | 000010010001 | 2 | 000010010001 | 2 | 010000000100 | 3 |
| 057 | 010000000100 | 4 | 000000010010 | 3 | 000000010010 | 3 | 010000000100 | 4 |
| 058 | 010100000010 | 3 | 001000000010 | 4 | 000001000010 | 3 | 001010000010 | 4 |
| 059 | 010100000010 | 4 | 000100000001 | 2 | 000001000010 | 4 | 000100000001 | 2 |
| 060 | 010100101000 | 3 | 001001010000 | 1 | 000001000100 | 3 | 001001010000 | 1 |

FIG. 15B

| Data Symbol | MCG1 Code Word MSB      LSB | NCG | MCG2 Code Word MSB      LSB | NCG | DCG1 Code Word MSB      LSB | NCG | DCG2 Code Word MSB      LSB | NCG |
|---|---|---|---|---|---|---|---|---|
| 061 | 010100101000 | 4 | 001000101000 | 3 | 000001000100 | 4 | 001000101000 | 3 |
| 062 | 010101010000 | 1 | 001000101000 | 4 | 000001000101 | 2 | 001000101000 | 4 |
| 063 | 101010101000 | 3 | 000010101010 | 4 | 101010101000 | 3 | 010000100101 | 2 |
| 064 | 101010101000 | 4 | 000010100101 | 2 | 101010101000 | 4 | 010000101010 | 3 |
| 065 | 101010100000 | 1 | 001000010100 | 3 | 101010100000 | 1 | 001000010100 | 3 |
| 066 | 101010010100 | 3 | 000010001000 | 3 | 101010010100 | 3 | 010000101010 | 4 |
| 067 | 101010010100 | 4 | 000010001000 | 4 | 101010010100 | 4 | 010001000100 | 3 |
| 068 | 101010001010 | 3 | 000000101010 | 2 | 101010001010 | 3 | 010001000100 | 4 |
| 069 | 101010001010 | 4 | 000001000100 | 3 | 101010001010 | 4 | 010001001000 | 3 |
| 070 | 101010000101 | 2 | 000001000100 | 4 | 101010000101 | 2 | 010001001000 | 4 |
| 071 | 101010000010 | 3 | 000001010010 | 4 | 101010000010 | 3 | 010001001001 | 2 |
| 072 | 101010000010 | 4 | 000001001001 | 2 | 101010000010 | 4 | 010001010001 | 2 |
| 073 | 101001010000 | 1 | 001000010100 | 4 | 101001010000 | 1 | 001000010100 | 4 |
| 074 | 101001000001 | 2 | 000000101010 | 3 | 101001000001 | 2 | 010001010010 | 3 |
| 075 | 101000101000 | 3 | 001000001010 | 3 | 101000101000 | 3 | 001000001010 | 3 |
| 076 | 101000101000 | 4 | 001000001010 | 4 | 101000101000 | 4 | 001000001010 | 4 |
| 077 | 101000100000 | 1 | 000000100010 | 3 | 101000100000 | 1 | 010001010010 | 4 |
| 078 | 101000010100 | 3 | 001000000101 | 2 | 101000010100 | 3 | 001000000101 | 2 |
| 079 | 101000010100 | 4 | 000010000000 | 1 | 101000010100 | 4 | 010001010101 | 2 |
| 080 | 101000001010 | 3 | 001010010000 | 1 | 101000001010 | 3 | 001010010000 | 1 |
| 081 | 101000001010 | 4 | 001001001000 | 3 | 101000001010 | 4 | 001001001000 | 3 |
| 082 | 101000000101 | 2 | 001001001000 | 4 | 101000000101 | 2 | 001001001000 | 4 |
| 083 | 101000000010 | 3 | 001010100001 | 2 | 101000000010 | 3 | 001010100001 | 2 |
| 084 | 101000000010 | 4 | 001001010001 | 2 | 101000000010 | 4 | 001001010001 | 2 |
| 085 | 100101010100 | 3 | 000000100010 | 4 | 100101010100 | 3 | 010010000001 | 1 |
| 086 | 100101010100 | 4 | 000000010001 | 2 | 100101010100 | 4 | 010010001000 | 3 |
| 087 | 100101001010 | 1 | 010101001000 | 3 | 100101001010 | 4 | 010101001000 | 3 |
| 088 | 100101000101 | 2 | 010101001000 | 4 | 100101000101 | 2 | 010101001000 | 4 |
| 089 | 100101000010 | 1 | 000000101010 | 4 | 100101000010 | 4 | 010010001000 | 4 |
| 090 | 100100100001 | 2 | 000000100101 | 2 | 100100100001 | 2 | 010010010000 | 1 |
| 091 | 100100010000 | 1 | 010100100100 | 3 | 100100010000 | 1 | 010100100100 | 3 |
| 092 | 100100000001 | 2 | 001000010001 | 2 | 100100000001 | 2 | 001000101001 | 2 |
| 093 | 100010101010 | 1 | 010100100100 | 4 | 100010101010 | 4 | 010100100100 | 4 |
| 094 | 100010100101 | 2 | 010100010010 | 3 | 100010100101 | 2 | 010100100010 | 3 |
| 095 | 100010100010 | 1 | 010101010001 | 2 | 100010100010 | 4 | 010101010001 | 2 |
| 096 | 100010010001 | 2 | 010100101001 | 2 | 100010101001 | 2 | 010100101001 | 2 |
| 097 | 100010001000 | 3 | 010100010010 | 4 | 100010001000 | 3 | 010100010010 | 4 |
| 098 | 100010001000 | 4 | 010100001001 | 2 | 100010001000 | 4 | 010100001001 | 2 |
| 099 | 100010000000 | 1 | 001000100100 | 3 | 100010000000 | 1 | 001000100100 | 3 |
| 100 | 100001010101 | 2 | 010010101000 | 3 | 100001010101 | 2 | 010010101000 | 3 |
| 101 | 100001010010 | 1 | 010010100101 | 2 | 100001010010 | 4 | 010010100101 | 2 |
| 102 | 100001001001 | 2 | 010010000100 | 3 | 100001001001 | 2 | 010100000100 | 3 |
| 103 | 100001000100 | 3 | 010010101000 | 4 | 100001000100 | 3 | 010010101000 | 4 |
| 104 | 100001000100 | 4 | 010010010100 | 3 | 100001000100 | 4 | 010010010100 | 3 |
| 105 | 100000101010 | 1 | 010010000100 | 4 | 100000101010 | 4 | 010100000100 | 4 |
| 106 | 100000100101 | 2 | 010010000010 | 3 | 100000100101 | 2 | 010010000010 | 3 |
| 107 | 100000100010 | 1 | 010010010100 | 4 | 100000100010 | 4 | 010010010100 | 4 |
| 108 | 100000010001 | 2 | 010010001010 | 3 | 100000010001 | 2 | 010010001010 | 3 |
| 109 | 100000001000 | 3 | 010010000010 | 4 | 100000001000 | 3 | 010010000010 | 4 |
| 110 | 100000001000 | 4 | 010001000001 | 2 | 100000001000 | 4 | 010001000001 | 2 |
| 111 | 010100100001 | 2 | 001010101001 | 2 | 000001001001 | 2 | 001010101001 | 2 |
| 112 | 010101000101 | 2 | 010010001010 | 4 | 000001001010 | 3 | 010010001010 | 4 |
| 113 | 010100010000 | 1 | 010010000101 | 2 | 000001001010 | 4 | 010010000101 | 2 |
| 114 | 010010100010 | 3 | 001010010101 | 2 | 000001010010 | 1 | 001010010101 | 2 |
| 115 | 010010100010 | 4 | 001010100100 | 3 | 000001010001 | 2 | 001010100100 | 3 |
| 116 | 010010100101 | 2 | 010000100000 | 1 | 000001010010 | 4 | 010000100000 | 1 |
| 117 | 010010010001 | 2 | 001010000100 | 4 | 000001010100 | 3 | 001010000100 | 4 |
| 118 | 010010001000 | 3 | 001010101000 | 3 | 000001010100 | 4 | 001010101000 | 3 |
| 119 | 010010001000 | 4 | 001010100100 | 4 | 000001010101 | 2 | 001010100100 | 4 |
| 120 | 010001010101 | 2 | 001010010010 | 3 | 000010000000 | 1 | 001010010010 | 3 |

FIG. 15C

| Data Symbol | MCG1 Code Word MSB LSB | NCG | MCG2 Code Word MSB LSB | NCG | DCG1 Code Word MSB LSB | NCG | DCG2 Code Word MSB LSB | NCG |
|---|---|---|---|---|---|---|---|---|
| 121 | 010001010010 | 3 | 001001000010 | 3 | 000010000001 | 2 | 001001000010 | 3 |
| 122 | 010001010010 | 4 | 001001000010 | 4 | 000010000010 | 3 | 001001000010 | 4 |
| 123 | 010001001001 | 2 | 001001000001 | 2 | 000010000100 | 4 | 001000100001 | 2 |
| 124 | 010001000100 | 3 | 001010010010 | 4 | 000010000100 | 3 | 001010010010 | 4 |
| 125 | 010001000100 | 4 | 001010001001 | 2 | 000010000100 | 4 | 001010001001 | 2 |
| 126 | 010000010001 | 2 | 001001010100 | 3 | 000010000101 | 2 | 001001010100 | 3 |
| 127 | 010101010100 | 3 | 001001010100 | 4 | 000010001000 | 3 | 001001010100 | 4 |
| 128 | 010101010100 | 4 | 001001001010 | 3 | 000010001000 | 4 | 001001001010 | 3 |
| 129 | 010101000010 | 3 | 000101010101 | 2 | 000010001001 | 2 | 000101010101 | 2 |
| 130 | 010101000010 | 4 | 000101000100 | 3 | 000010001010 | 3 | 000101000100 | 3 |
| 131 | 010010101010 | 3 | 001001001010 | 4 | 000010001010 | 4 | 001001001010 | 4 |
| 132 | 010010101010 | 4 | 001001000101 | 2 | 000010010010 | 3 | 001001000101 | 2 |
| 133 | 010101001010 | 3 | 001000010000 | 1 | 000010010010 | 4 | 001000010000 | 1 |
| 134 | 010101001010 | 4 | 000101010010 | 3 | 000010010100 | 3 | 000101010010 | 3 |
| 135 | 010000101010 | 3 | 000101000100 | 4 | 000010010100 | 4 | 000101000100 | 4 |
| 136 | 010000101010 | 4 | 000100100010 | 3 | 000010010101 | 2 | 000100100010 | 3 |
| 137 | 010000100101 | 2 | 000010100010 | 4 | 000010100000 | 1 | 000010100010 | 4 |
| 138 | 010000100010 | 3 | 000101010010 | 4 | 000010100001 | 2 | 000101010010 | 4 |
| 139 | 010000100010 | 4 | 000101001001 | 2 | 000010100100 | 3 | 000101001001 | 2 |
| 140 | 010000001000 | 3 | 000100010001 | 2 | 000010100101 | 2 | 000100010001 | 2 |
| 141 | 010000001000 | 4 | 000010100100 | 3 | 000010100100 | 4 | 010000001000 | 4 |
| 142 | 101010101001 | 2 | 000010101001 | 4 | 101010101001 | 2 | 010010010001 | 2 |
| 143 | 101010100100 | 3 | 000100101010 | 3 | 101010100100 | 3 | 000100101010 | 3 |
| 144 | 101010100100 | 4 | 000100101010 | 4 | 101010100100 | 4 | 000100101010 | 4 |
| 145 | 101010100001 | 2 | 001000010101 | 2 | 101010100001 | 2 | 001000010101 | 2 |
| 146 | 101010010101 | 2 | 000010010101 | 3 | 101010010101 | 2 | 010010100001 | 2 |
| 147 | 101010010010 | 3 | 000100100101 | 2 | 101010010010 | 3 | 000100100101 | 2 |
| 148 | 101010010010 | 4 | 000100001000 | 3 | 101010010010 | 4 | 000100001000 | 3 |
| 149 | 101010010000 | 1 | 001000100100 | 4 | 101010010000 | 1 | 001000100100 | 4 |
| 150 | 101010001001 | 2 | 000100001000 | 4 | 101010001001 | 2 | 000100001000 | 4 |
| 151 | 101010000100 | 3 | 000010010010 | 4 | 101010000100 | 3 | 010010100010 | 3 |
| 152 | 101010000100 | 4 | 000010001001 | 2 | 101010000100 | 4 | 010010100010 | 4 |
| 153 | 101001010100 | 3 | 000010101001 | 2 | 101001010100 | 3 | 010010100101 | 2 |
| 154 | 101001010100 | 4 | 000100010101 | 2 | 101001010100 | 4 | 010010101010 | 3 |
| 155 | 101001010001 | 2 | 001000010000 | 3 | 101001010001 | 2 | 001000000100 | 3 |
| 156 | 101001001010 | 3 | 000010000100 | 3 | 101001001010 | 3 | 010010101010 | 4 |
| 157 | 101001001010 | 4 | 000010000100 | 4 | 101001001010 | 4 | 010100000001 | 2 |
| 158 | 101001001000 | 3 | 001000010010 | 3 | 101001001000 | 3 | 001000010010 | 3 |
| 159 | 101001001000 | 4 | 001000010010 | 4 | 101001001000 | 4 | 001000010010 | 4 |
| 160 | 101001000101 | 2 | 000001000010 | 3 | 101001000101 | 2 | 010100000010 | 3 |
| 161 | 101001000010 | 3 | 000001010100 | 3 | 101001000010 | 3 | 010100000010 | 4 |
| 162 | 101001000010 | 4 | 000001010100 | 4 | 101001000010 | 4 | 010100001010 | 4 |
| 163 | 101000101001 | 2 | 001000000100 | 4 | 101000101001 | 2 | 001000000100 | 4 |
| 164 | 101000100100 | 3 | 001000001001 | 2 | 101000100100 | 3 | 001000001001 | 2 |
| 165 | 101000100100 | 4 | 000101010000 | 1 | 101000100100 | 4 | 000101010000 | 1 |
| 166 | 101000100001 | 2 | 000001001010 | 3 | 101000100001 | 2 | 010100010000 | 1 |
| 167 | 101000010101 | 2 | 000100000010 | 3 | 101000010101 | 2 | 000100000010 | 3 |
| 168 | 101000010010 | 3 | 000100101000 | 3 | 101000010010 | 3 | 000100101000 | 3 |
| 169 | 101000010010 | 4 | 000100101000 | 4 | 101000010010 | 4 | 000100101000 | 4 |
| 170 | 101000010000 | 1 | 000001000010 | 4 | 101000010000 | 1 | 010100010100 | 3 |
| 171 | 101000001001 | 2 | 000100010100 | 3 | 101000001001 | 2 | 000100010100 | 3 |
| 172 | 101000000100 | 3 | 000100000010 | 4 | 101000000100 | 3 | 000010000010 | 4 |
| 173 | 101000000100 | 4 | 000010000001 | 2 | 101000000100 | 4 | 010100010100 | 4 |
| 174 | 100101010101 | 2 | 000001010010 | 4 | 100101010101 | 2 | 010100100000 | 1 |
| 175 | 100101010010 | 1 | 000000100001 | 2 | 100101010010 | 4 | 010100100001 | 2 |
| 176 | 100101010000 | 1 | 000100010100 | 4 | 100101010000 | 1 | 000100010100 | 4 |
| 177 | 100101001001 | 2 | 010101010101 | 2 | 100101001001 | 2 | 010100101000 | 3 |
| 178 | 100101000100 | 3 | 000001000101 | 2 | 100101000100 | 3 | 010100101000 | 4 |
| 179 | 100101000100 | 4 | 000000010000 | 1 | 100101000100 | 4 | 010100101010 | 3 |
| 180 | 100100101010 | 1 | 010100100010 | 3 | 100101101010 | 4 | 010100100010 | 3 |

FIG. 15D

| Data Symbol | MCG1 Code Word MSB LSB | NCG | MCG2 Code Word MSB LSB | NCG | DCG1 Code Word MSB LSB | NCG | DCG2 Code Word MSB LSB | NCG |
|---|---|---|---|---|---|---|---|---|
| 181 | 100100101000 | 3 | 000100001010 | 3 | 100100101000 | 3 | 000100001010 | 3 |
| 182 | 100100101000 | 4 | 000100001010 | 4 | 100100101000 | 4 | 000100001010 | 4 |
| 183 | 100100100101 | 2 | 010100100010 | 4 | 100100100101 | 2 | 010100100010 | 4 |
| 184 | 100100100010 | 1 | 010101010010 | 3 | 100100100010 | 4 | 010101010010 | 3 |
| 185 | 100100010100 | 3 | 000100000101 | 2 | 100100010100 | 3 | 000100000101 | 2 |
| 186 | 100100010100 | 4 | 000001000000 | 1 | 100100010100 | 4 | 010100101010 | 4 |
| 187 | 100100010001 | 2 | 010101010010 | 4 | 100100010001 | 2 | 010101010010 | 4 |
| 188 | 100100001010 | 1 | 010101001001 | 2 | 100100001010 | 4 | 010101001001 | 2 |
| 189 | 100100001000 | 3 | 010100010000 | 2 | 100100001000 | 3 | 010100010001 | 2 |
| 190 | 100100001000 | 4 | 010010100100 | 3 | 100100001000 | 4 | 010010100100 | 3 |
| 191 | 100100000101 | 2 | 010100100101 | 2 | 100100000101 | 2 | 010100100101 | 2 |
| 192 | 100100000010 | 1 | 010010100100 | 4 | 100100000010 | 4 | 010010100100 | 4 |
| 193 | 100010101001 | 2 | 010010010010 | 3 | 100010101001 | 2 | 010010100010 | 3 |
| 194 | 100010100100 | 3 | 010100001000 | 3 | 100010100100 | 3 | 010100001000 | 3 |
| 195 | 100010100100 | 4 | 010100001000 | 4 | 100010100100 | 4 | 010100001000 | 4 |
| 196 | 100010010101 | 2 | 010010010010 | 4 | 100010010101 | 2 | 010010010010 | 4 |
| 197 | 100010010010 | 1 | 010010101001 | 2 | 100010010010 | 4 | 010010101001 | 2 |
| 198 | 100010001001 | 2 | 010010010101 | 2 | 100010010001 | 2 | 010010010101 | 2 |
| 199 | 100010000100 | 3 | 010010001001 | 2 | 100010000100 | 3 | 010010001001 | 2 |
| 200 | 100010000100 | 4 | 010001010100 | 3 | 100010000100 | 4 | 010001010100 | 3 |
| 201 | 100010000001 | 2 | 010001010100 | 4 | 100010000001 | 2 | 010001010100 | 4 |
| 202 | 100001010100 | 3 | 010010000100 | 3 | 100001010100 | 3 | 010010000100 | 3 |
| 203 | 100001010100 | 4 | 010010000100 | 4 | 100001010100 | 4 | 010010000100 | 4 |
| 204 | 100001001010 | 1 | 010001000010 | 3 | 100001001010 | 4 | 010001000010 | 3 |
| 205 | 100001000101 | 2 | 010001000010 | 4 | 100001000101 | 2 | 010001000010 | 4 |
| 206 | 100001000010 | 1 | 010001001010 | 3 | 100001000010 | 4 | 010001001010 | 3 |
| 207 | 100001000000 | 1 | 010000100001 | 2 | 100001000000 | 1 | 010000100001 | 2 |
| 208 | 100000100001 | 2 | 010001001010 | 4 | 100000100001 | 2 | 010001001010 | 4 |
| 209 | 100000010000 | 1 | 001010101010 | 3 | 100000010000 | 1 | 001010101010 | 3 |
| 210 | 010101000100 | 3 | 001010101010 | 4 | 000010101010 | 3 | 001010101010 | 4 |
| 211 | 010101000100 | 4 | 001010100101 | 2 | 000010101000 | 4 | 001010100101 | 2 |
| 212 | 010100101010 | 3 | 010001000101 | 2 | 000010101001 | 2 | 010001000101 | 2 |
| 213 | 010100101010 | 4 | 010000010000 | 1 | 000010101010 | 4 | 010000010000 | 1 |
| 214 | 101010101010 | 3 | 001010001000 | 3 | 101010101010 | 3 | 001010001000 | 3 |
| 215 | 101010101010 | 4 | 001010010001 | 4 | 101010101010 | 4 | 001010001000 | 4 |
| 216 | 101010100101 | 2 | 001001010101 | 2 | 101010100101 | 2 | 001001010101 | 2 |
| 217 | 101010100010 | 3 | 001010100010 | 3 | 101010100010 | 3 | 001010100010 | 3 |
| 218 | 101010100010 | 4 | 001010100010 | 4 | 101010100010 | 4 | 001010100010 | 4 |
| 219 | 101010010001 | 2 | 001010010001 | 2 | 101010010001 | 2 | 001010010001 | 2 |
| 220 | 101010001000 | 3 | 001001000100 | 3 | 101010001000 | 3 | 001001000100 | 3 |
| 221 | 101010001000 | 4 | 001001000100 | 4 | 101010001000 | 4 | 001001000100 | 4 |
| 222 | 101001010101 | 2 | 001000100010 | 3 | 101001010101 | 2 | 001000100010 | 3 |
| 223 | 101001010010 | 3 | 001010010010 | 3 | 101001010010 | 3 | 001010010010 | 3 |
| 224 | 101001010010 | 4 | 001001010010 | 4 | 101001010010 | 4 | 001001010010 | 4 |
| 225 | 101001001001 | 2 | 001001001001 | 2 | 101001001001 | 2 | 001001001001 | 2 |
| 226 | 101001000100 | 3 | 001000100010 | 4 | 101001000100 | 3 | 001000100010 | 4 |
| 227 | 101001000100 | 4 | 001000010001 | 2 | 101001000100 | 4 | 001000010001 | 2 |
| 228 | 101000101010 | 3 | 001000101010 | 3 | 101000101010 | 3 | 001000101010 | 3 |
| 229 | 101000101010 | 4 | 001000101010 | 4 | 101000101010 | 4 | 001000101010 | 4 |
| 230 | 101000100101 | 2 | 001000100101 | 2 | 101000100101 | 2 | 001000100101 | 2 |
| 231 | 101000100010 | 3 | 000101001000 | 3 | 101000100010 | 3 | 000101001000 | 3 |
| 232 | 101000100010 | 4 | 000101001000 | 4 | 101000100010 | 4 | 000101001000 | 4 |
| 233 | 101000010001 | 2 | 000100100100 | 3 | 101000010001 | 2 | 000100100100 | 3 |
| 234 | 101000001000 | 3 | 001000001000 | 3 | 101000001000 | 3 | 001000001000 | 3 |
| 235 | 101000001000 | 4 | 001000001000 | 4 | 101000001000 | 4 | 001000001000 | 4 |
| 236 | 100101010001 | 2 | 000101010001 | 2 | 100101010001 | 2 | 000101010001 | 2 |
| 237 | 100101001000 | 3 | 000100100100 | 4 | 100101001000 | 3 | 000100100100 | 4 |
| 238 | 100101001000 | 4 | 000100010010 | 3 | 100101001000 | 4 | 000100100010 | 3 |
| 239 | 100100101001 | 2 | 000100101001 | 2 | 100100101001 | 2 | 000100101001 | 2 |
| 240 | 100100100100 | 3 | 000100010010 | 4 | 100100100100 | 3 | 000100100010 | 4 |

FIG. 15E

| Data Symbol | MCG1 Code Word MSB LSB | NCG | MCG2 Code Word MSB LSB | NCG | DCG1 Code Word MSB LSB | NCG | DCG2 Code Word MSB LSB | NCG |
|---|---|---|---|---|---|---|---|---|
| 241 | 100100100100 | 4 | 000100001001 | 2 | 100100100100 | 4 | 000100001001 | 2 |
| 242 | 100100010101 | 2 | 000100010101 | 2 | 100100010101 | 2 | 000100010101 | 2 |
| 243 | 100100010010 | 1 | 000010101000 | 3 | 100100010010 | 4 | 010101000001 | 2 |
| 244 | 100100001001 | 2 | 000010101000 | 4 | 100100001001 | 2 | 010101000010 | 3 |
| 245 | 100100000100 | 3 | 000100000100 | 3 | 100100000100 | 3 | 000100000100 | 3 |
| 246 | 100100000100 | 4 | 000100000100 | 4 | 100100000100 | 4 | 000100000100 | 4 |
| 247 | 100010101000 | 3 | 000010010100 | 3 | 100010101000 | 3 | 010101000010 | 4 |
| 248 | 100010101000 | 4 | 000010010100 | 4 | 100010101000 | 4 | 010101000100 | 3 |
| 249 | 100010010100 | 3 | 000010001010 | 3 | 100010010100 | 3 | 010101000100 | 4 |
| 250 | 100010010100 | 4 | 000010001010 | 4 | 100010010100 | 4 | 010101000101 | 2 |
| 251 | 100010001010 | 1 | 000010000101 | 2 | 100010001010 | 4 | 010101001010 | 3 |
| 252 | 100010000101 | 2 | 000000100000 | 1 | 100010000101 | 2 | 010101001010 | 4 |
| 253 | 100010000010 | 1 | 000010000010 | 3 | 100010000010 | 4 | 010101010000 | 1 |
| 254 | 100001000001 | 2 | 000010000010 | 4 | 100001000001 | 2 | 010101010100 | 3 |
| 255 | 100000100000 | 1 | 000001000001 | 2 | 100000100000 | 1 | 010101010100 | 4 |

FIG. 16

| Data Symbol | DSV Code Group Code Word MSB LSB | NCG | Data Symbol | DSV Code Group Code Word MSB LSB | NCG |
|---|---|---|---|---|---|
| 000 | 010101000000 | 1 | 035 | 010001000100 | 3 |
| 001 | 010010100000 | 1 | 036 | 010001000100 | 4 |
| 002 | 010001010000 | 1 | 037 | 010000000100 | 3 |
| 003 | 010000101000 | 3 | 038 | 010000010001 | 2 |
| 004 | 010000101000 | 4 | 039 | 010101010100 | 3 |
| 005 | 010000010100 | 3 | 040 | 010000000100 | 4 |
| 006 | 010000010100 | 4 | 041 | 010100100001 | 2 |
| 007 | 010000001010 | 3 | 042 | 010010100010 | 3 |
| 008 | 010000001010 | 4 | 043 | 010101010100 | 4 |
| 009 | 010000000101 | 2 | 044 | 010010100010 | 4 |
| 010 | 010100100000 | 1 | 045 | 010010101010 | 3 |
| 011 | 010010010000 | 1 | 046 | 010010010001 | 2 |
| 012 | 010001001000 | 3 | 047 | 010010101010 | 4 |
| 013 | 010001001000 | 4 | 048 | 010101001010 | 3 |
| 014 | 010000100100 | 3 | 049 | 010001010010 | 3 |
| 015 | 010000100100 | 4 | 050 | 010101001010 | 4 |
| 016 | 010000010010 | 3 | 051 | 010000100010 | 3 |
| 017 | 010000010010 | 4 | 052 | 010001010010 | 4 |
| 018 | 010000001001 | 2 | 053 | 010000100010 | 4 |
| 019 | 010101000101 | 2 | 054 | 010100101010 | 3 |
| 020 | 010000000010 | 3 | 055 | 010100101010 | 4 |
| 021 | 010000000010 | 4 | 056 | 010001001001 | 2 |
| 022 | 010010000000 | 1 | 057 | 010101000010 | 3 |
| 023 | 010100000001 | 2 | 058 | 010100000010 | 4 |
| 024 | 010101000001 | 2 | 059 | 010100101000 | 3 |
| 025 | 010100010000 | 1 | 060 | 010100101000 | 4 |
| 026 | 010100000010 | 3 | 061 | 010101010000 | 1 |
| 027 | 010010100001 | 2 | 062 | 010101000010 | 4 |
| 028 | 010010100101 | 2 | 063 | 010000101010 | 3 |
| 029 | 010001010001 | 2 | 064 | 010000101010 | 4 |
| 030 | 010010001000 | 3 | 065 | 010000100101 | 2 |
| 031 | 010000101001 | 2 | 066 | 010000001000 | 3 |
| 032 | 010010001000 | 4 | 067 | 010000001000 | 4 |
| 033 | 010001010101 | 2 | 068 | 010101000100 | 3 |
| 034 | 010000010101 | 2 | 069 | 010101000100 | 4 |

FIG. 17A

| Data Symbol | MCG1 Code Word MSB LSB | NCG | MCG2 Code Word MSB LSB | NCG | DCG1 Code Word MSB LSB | NCG | DCG2 Code Word MSB LSB | NCG |
|---|---|---|---|---|---|---|---|---|
| 000 | 0101010000000 | 1 | x001010000000 | 1 | 0101010000000 | 1 | x001010000000 | 1 |
| 001 | 0100101000000 | 1 | x000101000000 | 1 | 0100101000000 | 1 | x000101000000 | 1 |
| 002 | 0100010100000 | 1 | x000010100000 | 1 | 0100010100000 | 1 | x010000000010 | 3 |
| 003 | 0100001010000 | 1 | x000001010000 | 1 | 0100001010000 | 1 | x010000000010 | 4 |
| 004 | 0100000101000 | 3 | x000000101000 | 3 | 0100000101000 | 3 | x010000001000 | 3 |
| 005 | 0100000101000 | 4 | x000000101000 | 4 | 0100000101000 | 4 | x010000010001 | 2 |
| 006 | 0100000010100 | 3 | x000000010100 | 3 | 0100000010100 | 3 | x010000010010 | 3 |
| 007 | 0100000010100 | 4 | x000000010100 | 4 | 0100000010100 | 4 | x010000010010 | 4 |
| 008 | 0100000001010 | 1 | x001001000000 | 1 | 0100000001010 | 3 | x001001000000 | 1 |
| 009 | 0100000000101 | 2 | x000100100000 | 1 | 0100000000101 | 2 | x000100100000 | 1 |
| 010 | x010101000000 | 1 | x000010010000 | 1 | x000010010000 | 1 | x010101000000 | 1 |
| 011 | x010010100000 | 1 | x000001001000 | 3 | x000001001000 | 3 | x010010100000 | 1 |
| 012 | x010001010000 | 1 | x000001001000 | 4 | x000001001000 | 4 | x010001010000 | 1 |
| 013 | x010000101000 | 3 | x000000100100 | 3 | 0100000101000 | 4 | x010000101000 | 3 |
| 014 | x010000101000 | 4 | x000000100100 | 4 | 0100000010010 | 3 | x010000101000 | 4 |
| 015 | x010000010100 | 3 | x000000010010 | 3 | 0100000100010 | 3 | x010000010100 | 3 |
| 016 | x010000010100 | 4 | x000000010010 | 4 | 0100000101010 | 3 | x010000010100 | 4 |
| 017 | x010000001010 | 3 | x010100010100 | 3 | 0100001000010 | 3 | x010000001010 | 3 |
| 018 | x010000001010 | 4 | x010100010100 | 4 | 0100001001010 | 3 | x010000001010 | 4 |
| 019 | x010000000101 | 2 | x010100001010 | 3 | 0100001010010 | 3 | x010000000101 | 2 |
| 020 | x010000000010 | 3 | x001010000001 | 2 | 0100010000010 | 3 | x001010000001 | 2 |
| 021 | x010000000010 | 4 | x000101000001 | 2 | 0100010001010 | 3 | x000101000001 | 2 |
| 022 | x010010000000 | 1 | x001010100000 | 1 | 0100010010010 | 3 | x001010100000 | 1 |
| 023 | x010100000001 | 2 | x001000000001 | 2 | 0100010100010 | 3 | x001000000001 | 2 |
| 024 | 0101010000001 | 2 | x000010100001 | 2 | 0101010000001 | 2 | x010000100010 | 3 |
| 025 | 0101001000000 | 1 | x010100001010 | 4 | 0101001000000 | 1 | x010100001010 | 3 |
| 026 | 0101000000001 | 2 | x001000000010 | 3 | 0101000000001 | 2 | x001000000010 | 3 |
| 027 | 0100101000001 | 2 | x000000010001 | 2 | 0101010000001 | 2 | x010000100010 | 4 |
| 028 | 0100100100000 | 1 | x010100000101 | 2 | 0100100100000 | 1 | x010100000101 | 2 |
| 029 | 0100010100001 | 2 | x000000101001 | 2 | 0100010100001 | 2 | x010000100100 | 3 |
| 030 | 0100010010000 | 1 | x010001000000 | 1 | 0100010010000 | 1 | x010001000000 | 1 |
| 031 | 0100010000101 | 2 | x000000010101 | 2 | 0100010010001 | 2 | x010000100101 | 4 |
| 032 | 0100001001000 | 3 | x001010101000 | 3 | 0100001001000 | 3 | x001010101000 | 3 |
| 033 | 0100001001000 | 4 | x001010101000 | 4 | 0100001001000 | 4 | x001010101000 | 4 |
| 034 | 0100000101001 | 2 | x010010000001 | 2 | 0100000101001 | 2 | x010010000001 | 2 |
| 035 | 0100000100100 | 3 | x001010010100 | 3 | 0100000100100 | 3 | x001010010100 | 3 |
| 036 | 0100000100100 | 4 | x001010010100 | 4 | 0100000100100 | 4 | x001010010100 | 4 |
| 037 | 0100000010101 | 2 | x001010000010 | 3 | 0100000010101 | 2 | x001010000010 | 3 |
| 038 | 0100000010010 | 1 | x001010001010 | 3 | 0100000010010 | 4 | x001010001010 | 3 |
| 039 | 0100000001001 | 2 | x001010001010 | 4 | 0100000001001 | 2 | x001010001010 | 4 |
| 040 | 0100000000100 | 3 | x001010000010 | 4 | 0100000000100 | 3 | x001010000010 | 4 |
| 041 | 0100000000100 | 4 | x001001000001 | 2 | 0100000000100 | 4 | x001001000001 | 2 |
| 042 | x010101000001 | 2 | x000101000010 | 3 | 0100010101010 | 3 | x000101000010 | 3 |
| 043 | x010100100000 | 1 | x001010000101 | 2 | 0100100000010 | 3 | x001010000101 | 2 |
| 044 | x010010100001 | 2 | x000101010010 | 4 | 0100100001010 | 3 | x000101000010 | 4 |
| 045 | x010010010000 | 1 | x001000100000 | 1 | 0100100010010 | 3 | x001000100000 | 1 |
| 046 | x010001010001 | 2 | x000100100001 | 2 | 0100100100010 | 3 | x000100100001 | 2 |
| 047 | x010001001000 | 3 | x000101010100 | 3 | 0100100101010 | 3 | x000101010100 | 3 |
| 048 | x010001001000 | 4 | x000101010100 | 4 | 0100101000010 | 3 | x000101010100 | 4 |
| 049 | x010000101001 | 2 | x000010100010 | 3 | x000010100010 | 3 | x010000101001 | 2 |
| 050 | x010000100100 | 3 | x000101001010 | 3 | 0100101001010 | 3 | x000101001010 | 3 |
| 051 | x010000100100 | 4 | x000101001010 | 4 | 0100101010010 | 3 | x000101001010 | 4 |
| 052 | x010000010101 | 2 | x000010100010 | 4 | x000010100010 | 4 | x010000010101 | 2 |
| 053 | x010000010010 | 3 | x000101000101 | 2 | x000001000000 | 1 | x000101000101 | 2 |
| 054 | x010000010010 | 4 | x000100010000 | 1 | x000001000001 | 2 | x000100010000 | 1 |
| 055 | x010000001001 | 2 | x000010101010 | 3 | x000010101010 | 3 | x010000001001 | 2 |
| 056 | x010000000100 | 3 | x000010010001 | 2 | x000010010001 | 2 | x010000000100 | 3 |
| 057 | x010000000100 | 4 | x000001010010 | 3 | x000001010010 | 3 | x010000000100 | 4 |
| 058 | x010100000010 | 3 | x001000000010 | 4 | x000001000010 | 3 | x001000000010 | 4 |
| 059 | x010100000010 | 4 | x000100000001 | 2 | x000001000010 | 4 | x000100000001 | 2 |
| 060 | x010100101000 | 3 | x001001010000 | 1 | x000001000100 | 3 | x001001010000 | 1 |

FIG. 17B

| Data Symbol | MCG1 Code Word (MSB LSB) | NCG | MCG2 Code Word (MSB LSB) | NCG | DCG1 Code Word (MSB LSB) | NCG | DCG2 Code Word (MSB LSB) | NCG |
|---|---|---|---|---|---|---|---|---|
| 061 | x010100101000 | 4 | x001000101000 | 3 | x000001000100 | 4 | x001000101000 | 3 |
| 062 | x010101010000 | 1 | x001000101000 | 4 | x000001000101 | 2 | x001000101000 | 4 |
| 063 | 0101010101000 | 3 | x000010101010 | 4 | 0101010101000 | 3 | x010000100101 | 2 |
| 064 | 0101010101000 | 4 | x000010100101 | 2 | 0101010101000 | 4 | x010000101010 | 3 |
| 065 | 0101010100000 | 1 | x001000010100 | 3 | 0101010100000 | 1 | x001000010100 | 3 |
| 066 | 0101010010100 | 3 | x000010001000 | 3 | 0101010010100 | 3 | x010000101010 | 4 |
| 067 | 0101010010100 | 4 | x000010001000 | 4 | 0101010010100 | 4 | x010001000100 | 3 |
| 068 | 0101010001010 | 3 | x000001010101 | 2 | 0101010001010 | 3 | x010001000100 | 4 |
| 069 | 0101010001010 | 4 | x000001000100 | 3 | 0101010001010 | 4 | x010001001000 | 3 |
| 070 | 0101010000101 | 2 | x000001000100 | 4 | 0101010000101 | 2 | x010001001000 | 4 |
| 071 | 0101010000010 | 3 | x000001010010 | 4 | 0101010000010 | 3 | x010001001001 | 2 |
| 072 | 0101010000010 | 4 | x000001001001 | 2 | 0101010000010 | 4 | x010001010001 | 2 |
| 073 | 0101001010000 | 1 | x001000010100 | 4 | 0101001010000 | 1 | x001000010100 | 4 |
| 074 | 0101001000001 | 2 | x000000101010 | 3 | 0101001000001 | 2 | x010001010010 | 3 |
| 075 | 0101000101000 | 3 | x001000001010 | 3 | 0101000101000 | 3 | x001000001010 | 3 |
| 076 | 0101000101000 | 4 | x001000001010 | 4 | 0101000101000 | 4 | x001000001010 | 4 |
| 077 | 0101000100000 | 1 | x000000100010 | 3 | 0101000100000 | 1 | x010001010010 | 4 |
| 078 | 0101000010100 | 3 | x001000000101 | 2 | 0101000010100 | 3 | x001000000101 | 2 |
| 079 | 0101000010100 | 4 | x000010000000 | 1 | 0101000010100 | 4 | x010001010101 | 2 |
| 080 | 0101000001010 | 3 | x001010010000 | 1 | 0101000001010 | 3 | x001010010000 | 1 |
| 081 | 0101000001010 | 4 | x001001001000 | 3 | 0101000001010 | 4 | x001001001000 | 3 |
| 082 | 0101000000101 | 2 | x001001001000 | 4 | 0101000000101 | 2 | x001001001000 | 4 |
| 083 | 0101000000010 | 3 | x001010100001 | 2 | 0101000000010 | 3 | x001010100001 | 2 |
| 084 | 0101000000010 | 4 | x001001010010 | 2 | 0101000000010 | 4 | x001010100001 | 2 |
| 085 | 0100101010100 | 3 | x000000100010 | 4 | 0100101010100 | 3 | x010010000000 | 1 |
| 086 | 0100101010100 | 4 | x000000010001 | 2 | 0100101010100 | 4 | x010010001000 | 3 |
| 087 | 0100101001010 | 1 | x010101001000 | 3 | 0100101001010 | 4 | x010101001000 | 3 |
| 088 | 0100101000101 | 2 | x010101001000 | 4 | 0100101000101 | 2 | x010101001000 | 4 |
| 089 | 0100101000010 | 1 | x000000101010 | 4 | 0100101000010 | 4 | x010010001000 | 4 |
| 090 | 0100100100001 | 2 | x000000100101 | 2 | 0100100100001 | 2 | x010010010000 | 1 |
| 091 | 0100100010000 | 1 | x010100100100 | 3 | 0100100010000 | 1 | x010100100100 | 3 |
| 092 | 0100100000001 | 2 | x001000101001 | 2 | 0100100000001 | 2 | x001000101001 | 2 |
| 093 | 0100010101010 | 1 | x010100100100 | 4 | 0100010101010 | 4 | x010100100100 | 4 |
| 094 | 0100010100101 | 2 | x010100010010 | 3 | 0100010100101 | 2 | x010100010010 | 3 |
| 095 | 0100010100010 | 1 | x010101010001 | 2 | 0100010100010 | 4 | x010101010001 | 2 |
| 096 | 0100010010001 | 2 | x010100101001 | 2 | 0100010010001 | 2 | x010100101001 | 2 |
| 097 | 0100010001000 | 3 | x010100010010 | 4 | 0100010001000 | 3 | x010100010010 | 4 |
| 098 | 0100010001000 | 4 | x010100001001 | 2 | 0100010001000 | 4 | x010100001001 | 2 |
| 099 | 0100010000000 | 1 | x001000100100 | 3 | 0100010000000 | 1 | x001000100100 | 3 |
| 100 | 0100001010101 | 2 | x010010101000 | 3 | 0100001010101 | 2 | x010010101000 | 3 |
| 101 | 0100001010010 | 1 | x010100010101 | 2 | 0100001010010 | 4 | x010100010101 | 2 |
| 102 | 0100001001001 | 2 | x010100000100 | 3 | 0100001001001 | 2 | x010100000100 | 3 |
| 103 | 0100001000100 | 3 | x010010101000 | 4 | 0100001000100 | 3 | x010010101000 | 4 |
| 104 | 0100001000100 | 4 | x010010010100 | 3 | 0100001000100 | 4 | x010010010100 | 3 |
| 105 | 0100000101010 | 1 | x010100000100 | 4 | 0100000101010 | 4 | x010100000100 | 4 |
| 106 | 0100000100101 | 2 | x010010000010 | 3 | 0100000100101 | 2 | x010010000010 | 3 |
| 107 | 0100000100010 | 1 | x010010010100 | 4 | 0100000100010 | 4 | x010010010100 | 4 |
| 108 | 0100000010001 | 2 | x010010001010 | 3 | 0100000010001 | 2 | x010010001010 | 3 |
| 109 | 0100000001000 | 3 | x010010000010 | 4 | 0100000001000 | 3 | x010010000010 | 4 |
| 110 | 0100000000100 | 4 | x010001000001 | 2 | 0100000000100 | 4 | x010001000001 | 2 |
| 111 | x010100100001 | 2 | x001010101001 | 2 | x000001001001 | 2 | x001010101001 | 2 |
| 112 | x010101000101 | 2 | x010010001010 | 4 | x000001001010 | 3 | x010010001010 | 4 |
| 113 | x010100010000 | 1 | x010010000101 | 2 | x000001001010 | 4 | x010010000101 | 2 |
| 114 | x010010100010 | 3 | x001010010101 | 2 | x000000101010 | 1 | x001010010101 | 2 |
| 115 | x010010100010 | 4 | x001010000100 | 3 | x000001010001 | 2 | x001010000100 | 3 |
| 116 | x010010100101 | 2 | x010000100000 | 1 | x000001010010 | 4 | x010000100000 | 1 |
| 117 | x010010010001 | 2 | x001010000100 | 4 | x000001010100 | 3 | x001010000100 | 4 |
| 118 | x010010001000 | 3 | x001010100100 | 3 | x000001010000 | 4 | x001010100100 | 3 |
| 119 | x010010001000 | 4 | x001010100100 | 4 | x000001010101 | 2 | x001010100100 | 4 |
| 120 | x010000101010 | 2 | x001010010010 | 3 | x000010000000 | 1 | x001010010010 | 3 |

FIG. 17C

| Data Symbol | MCG1 Code Word MSB LSB | NCG | MCG2 Code Word MSB LSB | NCG | DCG1 Code Word MSB LSB | NCG | DCG2 Code Word MSB LSB | NCG |
|---|---|---|---|---|---|---|---|---|
| 121 | x010001010010 | 3 | x001001000010 | 3 | x000010000001 | 2 | x001001000010 | 3 |
| 122 | x010001010010 | 4 | x001001000010 | 4 | x000010000010 | 3 | x001001000010 | 4 |
| 123 | x010001001001 | 2 | x001000100001 | 2 | x000010000010 | 4 | x001000100001 | 2 |
| 124 | x010001000100 | 3 | x001010010010 | 4 | x000010000100 | 3 | x001010010010 | 4 |
| 125 | x010001000100 | 4 | x001010001001 | 2 | x000010000100 | 4 | x001010001001 | 2 |
| 126 | x010000010001 | 2 | x001001010100 | 3 | x000010000101 | 2 | x001001010100 | 3 |
| 127 | x010101010100 | 3 | x001001010100 | 4 | x000010001000 | 3 | x001001010100 | 4 |
| 128 | x010101010100 | 4 | x001001001010 | 3 | x000010001000 | 4 | x001001001010 | 3 |
| 129 | x010101000010 | 3 | x000101010101 | 2 | x000010001001 | 2 | x000101010101 | 2 |
| 130 | x010101000010 | 4 | x000101000100 | 3 | x000010001010 | 3 | x000101000100 | 3 |
| 131 | x010010101010 | 3 | x001001001010 | 4 | x000010001010 | 4 | x001001001010 | 4 |
| 132 | x010010101010 | 4 | x001001000101 | 2 | x000010010010 | 3 | x001001000101 | 2 |
| 133 | x010101001010 | 3 | x001000010000 | 1 | x000010010010 | 4 | x001000010000 | 1 |
| 134 | x010101001010 | 4 | x000101010010 | 3 | x000010010100 | 3 | x000101010010 | 3 |
| 135 | x010000101010 | 3 | x000101000100 | 4 | x000010010100 | 4 | x000101000100 | 4 |
| 136 | x010000101010 | 4 | x000100100010 | 3 | x000010010101 | 2 | x000100100010 | 3 |
| 137 | x010000100101 | 2 | x000100100010 | 4 | x000010100000 | 1 | x000100100010 | 4 |
| 138 | x010000101010 | 3 | x000101010010 | 4 | x000010100001 | 2 | x000101010010 | 4 |
| 139 | x010000100010 | 4 | x000101001001 | 2 | x000010100100 | 3 | x000101001001 | 2 |
| 140 | x010000001000 | 3 | x000100010001 | 2 | x000010100101 | 2 | x000100010001 | 2 |
| 141 | x010000001000 | 4 | x000010100100 | 3 | x000010100100 | 4 | x010000001000 | 4 |
| 142 | 0101010101001 | 2 | x000010100100 | 4 | 0101010101001 | 2 | x010010010001 | 2 |
| 143 | 0101010100100 | 3 | x000100101010 | 3 | 0101010100100 | 3 | x000100101010 | 3 |
| 144 | 0101010100100 | 4 | x000100101010 | 4 | 0101010100100 | 4 | x000100101010 | 4 |
| 145 | 0101010100001 | 2 | x001000010101 | 2 | 0101010100001 | 2 | x001000010101 | 2 |
| 146 | 0101010010101 | 2 | x000010010010 | 3 | 0101010010101 | 2 | x010010100001 | 2 |
| 147 | 0101010010101 | 3 | x000100100101 | 2 | 0101010010101 | 3 | x000100100101 | 2 |
| 148 | 0101010010010 | 4 | x000100001000 | 3 | 0101010010010 | 4 | x000100001000 | 3 |
| 149 | 0101010010000 | 1 | x001000100100 | 4 | 0101010010000 | 1 | x001000100100 | 4 |
| 150 | 0101010001001 | 2 | x000100001000 | 4 | 0101010001001 | 2 | x000100001000 | 4 |
| 151 | 0101010000100 | 3 | x000010010010 | 4 | 0101010000100 | 3 | x010010100010 | 3 |
| 152 | 0101010000100 | 4 | x000010000100 | 4 | 0101010000100 | 4 | x010010100010 | 4 |
| 153 | 0101001010100 | 3 | x000010101001 | 2 | 0101001010100 | 3 | x010010100101 | 2 |
| 154 | 0101001010100 | 4 | x000010010101 | 2 | 0101001010100 | 4 | x010010101010 | 3 |
| 155 | 0101001010001 | 2 | x001000000100 | 3 | 0101001010001 | 2 | x001000000100 | 3 |
| 156 | 0101001001010 | 3 | x000010000100 | 3 | 0101001001010 | 3 | x010010101010 | 4 |
| 157 | 0101001001010 | 4 | x000010000100 | 4 | 0101001001010 | 4 | x010100000001 | 2 |
| 158 | 0101001001000 | 3 | x001000010010 | 3 | 0101001001000 | 3 | x001000010010 | 3 |
| 159 | 0101001001000 | 4 | x001000010010 | 4 | 0101001001000 | 4 | x001000010010 | 4 |
| 160 | 0101001000101 | 2 | x000001000010 | 3 | 0101001000101 | 2 | x010100000010 | 3 |
| 161 | 0101001000010 | 3 | x000001010100 | 3 | 0101001000010 | 3 | x010100000010 | 4 |
| 162 | 0101001000010 | 4 | x000001010100 | 4 | 0101001000010 | 4 | x010100001010 | 4 |
| 163 | 0101000101001 | 2 | x001000000100 | 4 | 0101000101001 | 2 | x001000000100 | 4 |
| 164 | 0101000100100 | 3 | x001000001001 | 2 | 0101000100100 | 3 | x001000001001 | 2 |
| 165 | 0101000100100 | 4 | x000101010000 | 1 | 0101000100100 | 4 | x000101010000 | 1 |
| 166 | 0101000100001 | 2 | x000001001010 | 3 | 0101000100001 | 2 | x010100010000 | 1 |
| 167 | 0101000010101 | 2 | x000100000010 | 3 | 0101000010101 | 2 | x000100000010 | 3 |
| 168 | 0101000100010 | 3 | x000100101000 | 3 | 0101000100010 | 3 | x000100101000 | 3 |
| 169 | 0101000100100 | 4 | x000100101000 | 4 | 0101000100100 | 4 | x000100101000 | 4 |
| 170 | 0101000010000 | 1 | x000001000010 | 4 | 0101000010000 | 1 | x010100010100 | 3 |
| 171 | 0101000001001 | 2 | x000100010100 | 3 | 0101000001001 | 2 | x000100010100 | 3 |
| 172 | 0101000000100 | 3 | x000100000010 | 4 | 0101000000100 | 3 | x000100000010 | 4 |
| 173 | 0101000000100 | 4 | x000010000001 | 2 | 0101000000100 | 4 | x010100010100 | 4 |
| 174 | 0100101010101 | 2 | x000001001010 | 4 | 0100101010101 | 2 | x010100100000 | 1 |
| 175 | 0100101010010 | 1 | x000000100001 | 2 | 0100101010010 | 4 | x010100100001 | 2 |
| 176 | 0100101010000 | 1 | x000100010100 | 4 | 0100101010000 | 1 | x000100010100 | 4 |
| 177 | 0100101001001 | 2 | x010101010101 | 2 | 0100101001001 | 2 | x010100101000 | 3 |
| 178 | 0100101000010 | 3 | x000001000101 | 2 | 0100101000010 | 3 | x010100101000 | 4 |
| 179 | 0100101000100 | 4 | x000000010000 | 1 | 0100101000100 | 4 | x010100101010 | 3 |
| 180 | 0100100101010 | 1 | x010100100010 | 3 | 0100100101010 | 4 | x010100100010 | 3 |

FIG. 17D

| Data Symbol | MCG1 Code Word MSB LSB | NCG | MCG2 Code Word MSB LSB | NCG | DCG1 Code Word MSB LSB | NCG | DCG2 Code Word MSB LSB | NCG |
|---|---|---|---|---|---|---|---|---|
| 181 | 01001001 01000 | 3 | x000100001010 | 3 | 0100100101000 | 3 | x000100001010 | 3 |
| 182 | 0100100101000 | 4 | x000100001010 | 4 | 0100100101000 | 4 | x000100001010 | 4 |
| 183 | 0100100100101 | 2 | x010100100010 | 4 | 0100100100101 | 2 | x010100100010 | 4 |
| 184 | 0100100100010 | 1 | x010101010010 | 3 | 0100100100010 | 4 | x010101010010 | 3 |
| 185 | 0100100010100 | 3 | x000100000101 | 2 | 0100100010100 | 3 | x000100000101 | 2 |
| 186 | 0100100010100 | 4 | x000001000000 | 1 | 0100100010100 | 4 | x010100101010 | 4 |
| 187 | 0100100010001 | 2 | x010101010010 | 4 | 0100100010001 | 2 | x010101010010 | 4 |
| 188 | 0100100001010 | 1 | x010101001001 | 2 | 0100100001010 | 4 | x010101001001 | 2 |
| 189 | 0100100001000 | 3 | x010100010001 | 2 | 0100100001000 | 3 | x010100010001 | 2 |
| 190 | 0100100001000 | 4 | x010010100100 | 3 | 0100100001000 | 4 | x010010100100 | 3 |
| 191 | 0100100000101 | 2 | x010100100101 | 2 | 0100100000101 | 2 | x010100100101 | 2 |
| 192 | 0100100000010 | 1 | x010010100100 | 4 | 0100100000010 | 4 | x010010100100 | 4 |
| 193 | 0100010101001 | 2 | x010010010010 | 3 | 0100010101001 | 2 | x010010010010 | 3 |
| 194 | 0100010100100 | 3 | x010100001000 | 3 | 0100010100100 | 3 | x010100001000 | 3 |
| 195 | 0100010100100 | 4 | x010100001000 | 4 | 0100010100100 | 4 | x010100001000 | 4 |
| 196 | 0100010010101 | 2 | x010010100010 | 4 | 0100010010101 | 2 | x010010100010 | 4 |
| 197 | 0100010010010 | 1 | x010010101001 | 2 | 0100010010010 | 4 | x010010101001 | 2 |
| 198 | 0100010001001 | 2 | x010010010101 | 2 | 0100010001001 | 2 | x010010010101 | 2 |
| 199 | 0100010000100 | 3 | x010010001001 | 2 | 0100010000100 | 3 | x010010001001 | 2 |
| 200 | 0100010000100 | 4 | x010001010100 | 3 | 0100010000100 | 4 | x010001010100 | 3 |
| 201 | 0100010000001 | 2 | x010001010100 | 4 | 0100010000001 | 2 | x010001010100 | 4 |
| 202 | 0100001010100 | 3 | x010010000100 | 3 | 0100001010100 | 3 | x010010000100 | 3 |
| 203 | 0100001010100 | 4 | x010010000100 | 4 | 0100001010100 | 4 | x010010000100 | 4 |
| 204 | 0100001001010 | 1 | x010001000010 | 3 | 0100001001010 | 4 | x010001000010 | 3 |
| 205 | 0100001000101 | 2 | x010001000101 | 4 | 0100001000101 | 2 | x010001000101 | 4 |
| 206 | 0100001000010 | 1 | x010001001010 | 3 | 0100001000010 | 4 | x010001001010 | 3 |
| 207 | 0100001000000 | 1 | x010000100001 | 2 | 0100001000000 | 1 | x010000100001 | 2 |
| 208 | 0100000100001 | 2 | x010001001010 | 4 | 0100000100001 | 2 | x010001001010 | 4 |
| 209 | 0100000010000 | 1 | x001010101010 | 3 | 0100000010000 | 1 | x001010101010 | 3 |
| 210 | x010101000100 | 3 | x010010101010 | 4 | x000010101000 | 3 | x010101010100 | 4 |
| 211 | x010101000100 | 4 | x001010100101 | 2 | x000010101000 | 4 | x001010100101 | 2 |
| 212 | x010100101010 | 3 | x010001000101 | 2 | x000010101001 | 2 | x010001000101 | 2 |
| 213 | x010100101010 | 4 | x010000010000 | 1 | x000010101010 | 4 | x010000010000 | 1 |
| 214 | 0101010101010 | 3 | x001010101000 | 3 | 0101010101010 | 3 | x001010101000 | 3 |
| 215 | 0101010101010 | 4 | x001010001000 | 4 | 0101010101010 | 4 | x001010001000 | 4 |
| 216 | 0101010100101 | 2 | x001001010101 | 2 | 0101010100101 | 2 | x001001010101 | 2 |
| 217 | 0101010100010 | 3 | x001010100010 | 3 | 0101010100010 | 3 | x001010100010 | 3 |
| 218 | 0101010100010 | 4 | x001010100010 | 4 | 0101010100010 | 4 | x001010100010 | 4 |
| 219 | 0101010100001 | 2 | x001010100001 | 2 | 0101010100001 | 2 | x001010100001 | 2 |
| 220 | 0101010001000 | 3 | x001001000100 | 3 | 0101010001000 | 3 | x001001000100 | 3 |
| 221 | 0101010001000 | 4 | x001001000100 | 4 | 0101010001000 | 4 | x001001000100 | 4 |
| 222 | 0101001010101 | 2 | x001000100010 | 3 | 0101001010101 | 2 | x001000100010 | 3 |
| 223 | 0101001010010 | 3 | x001001010010 | 3 | 0101001010010 | 3 | x001001010010 | 3 |
| 224 | 0101001010010 | 4 | x001001010010 | 4 | 0101001010010 | 4 | x001001010010 | 4 |
| 225 | 0101001001001 | 2 | x001001001001 | 2 | 0101001001001 | 2 | x001001001001 | 2 |
| 226 | 0101001000100 | 3 | x001000100010 | 4 | 0101001000100 | 3 | x001000100010 | 4 |
| 227 | 0101001000100 | 4 | x001000010001 | 2 | 0101001000100 | 4 | x001000010001 | 2 |
| 228 | 0101000101010 | 3 | x001000101010 | 3 | 0101000101010 | 3 | x001000101010 | 3 |
| 229 | 0101000101010 | 4 | x001000101010 | 4 | 0101000101010 | 4 | x001000101010 | 4 |
| 230 | 0101000100101 | 2 | x001000100101 | 2 | 0101000100101 | 2 | x001000100101 | 2 |
| 231 | 0101000100010 | 3 | x000101001000 | 3 | 0101000100010 | 3 | x000101001000 | 3 |
| 232 | 0101000100010 | 4 | x000101001000 | 4 | 0101000100010 | 4 | x000101001000 | 4 |
| 233 | 0101000010001 | 2 | x000100100100 | 3 | 0101000010001 | 2 | x000100100100 | 3 |
| 234 | 0101000001000 | 3 | x001000001000 | 3 | 0101000001000 | 3 | x001000001000 | 3 |
| 235 | 0101000001000 | 4 | x001000001000 | 4 | 0101000001000 | 4 | x001000001000 | 4 |
| 236 | 0100101010001 | 2 | x000101010001 | 2 | 0100101010001 | 2 | x000101010001 | 2 |
| 237 | 0100101001000 | 3 | x000100100100 | 4 | 0100101001000 | 3 | x000100100100 | 4 |
| 238 | 0100101001000 | 4 | x000100010010 | 3 | 0100101001000 | 4 | x000100010010 | 3 |
| 239 | 0100100101001 | 2 | x000100101001 | 2 | 0100100101001 | 2 | x000100101001 | 2 |
| 240 | 0100100100100 | 3 | x000100010010 | 4 | 0100100100100 | 3 | x000100010010 | 4 |

| Data Symbol | MCG1 Code Word MSB  LSB | NCG | MCG2 Code Word MSB  LSB | NCG | DCG1 Code Word MSB  LSB | NCG | DCG2 Code Word MSB  LSB | NCG |
|---|---|---|---|---|---|---|---|---|
| 241 | 0100100100100 | 4 | x000100001001 | 2 | 0100100100100 | 4 | x000100001001 | 2 |
| 242 | 0100100010101 | 2 | x000100010101 | 2 | 0100100010101 | 2 | x000100010101 | 2 |
| 243 | 0100100010010 | 1 | x000010101000 | 3 | 0100100010010 | 4 | x010101000001 | 2 |
| 244 | 0100100001001 | 2 | x000010101000 | 4 | 0100100001001 | 2 | x010101000010 | 3 |
| 245 | 0100100000100 | 3 | x000100000100 | 3 | 0100100000100 | 3 | x000100000100 | 3 |
| 246 | 0100100000100 | 4 | x000100000100 | 4 | 0100100000100 | 4 | x000100000100 | 4 |
| 247 | 0100010101000 | 3 | x000010010100 | 3 | 0100010101000 | 3 | x010101000010 | 4 |
| 248 | 0100010101000 | 4 | x000010010100 | 4 | 0100010101000 | 4 | x010101000100 | 3 |
| 249 | 0100010010100 | 3 | x000010001010 | 3 | 0100010010100 | 3 | x010101000100 | 4 |
| 250 | 0100010010100 | 4 | x000010001010 | 4 | 0100010010100 | 4 | x010101000101 | 2 |
| 251 | 0100010001010 | 1 | x000010000101 | 2 | 0100010001010 | 4 | x010101001010 | 3 |
| 252 | 0100010000101 | 2 | x000000100000 | 1 | 0100010000101 | 2 | x010101001010 | 4 |
| 253 | 0100010000010 | 1 | x000010000010 | 3 | 0100010000010 | 4 | x010101010000 | 1 |
| 254 | 0100001000001 | 2 | x000010000010 | 4 | 0100001000001 | 2 | x010101010100 | 3 |
| 255 | 0100000100000 | 1 | x000001000001 | 2 | 0100000100000 | 1 | x010101010100 | 4 |

FIG. 23

| CODE GROUP POINTED OUT BY NCG | SYNC TYPE | MSB | LSB | MSB | LSB |
|---|---|---|---|---|---|
| MCG1 OR DCG2 | SYNC0 | 0101000000010 | 0000000001001 | 1000010100010 | 0000000001001 |
| | SYNC1 | 1001000000010 | 0000000001001 | 1001010000010 | 0000000001001 |
| | SYNC2 | 0100100000010 | 0000000001001 | 0101010000010 | 0000000001001 |
| | SYNC3 | 0100000010010 | 0000000001001 | 0101000010010 | 0000000001001 |
| | SYNC4 | 1000010000010 | 0000000001001 | 1001000010010 | 0000000001001 |
| | SYNC5 | 1001010010010 | 0000000001001 | 0100010010010 | 0000000001001 |
| | SYNC6 | 0100010000010 | 0000000001001 | 0100001010010 | 0000000001001 |
| MCG2 OR DCG1 | SYNC0 | 0000101100010 | 0000000001001 | 0010000100010 | 0000000001001 |
| | SYNC1 | 0001001100010 | 0000000001001 | 0101010100010 | 0000000001001 |
| | SYNC2 | 0010100000010 | 0000000001001 | 0000010100010 | 0000000001001 |
| | SYNC3 | 0010000110010 | 0000000001001 | 0010101010010 | 0000000001001 |
| | SYNC4 | 0010000100010 | 0000000001001 | 0000100100010 | 0000000001001 |
| | SYNC5 | 0100001000010 | 0000000001001 | 0010101100010 | 0000000001001 |
| | SYNC6 | 0010001000010 | 0000000001001 | 0101001000010 | 0000000001001 |

FIG. 24

| CODE GROUP POINTED OUT BY NCG | SYNC TYPE | MSB　　　　　LSB | MSB　　　　　LSB |
|---|---|---|---|
| MCG1 OR DCG1 | SYNC0 | 100000100010 000000001001 | 101000010010 000000001001 |
| MCG1 OR DCG1 | SYNC1 | 100001000010 000000001001 | 101000100010 000000001001 |
| MCG1 OR DCG1 | SYNC2 | 100101010010 000000001001 | 100100010010 000000001001 |
| MCG1 OR DCG1 | SYNC3 | 100010000010 000000001001 | 100010010010 000000001001 |
| MCG1 OR DCG1 | SYNC4 | 101001010010 000000001001 | 100100100010 000000001001 |
| MCG1 OR DCG1 | SYNC5 | 101010100010 000000001001 | 101001000010 000000001001 |
| MCG1 OR DCG1 | SYNC6 | 100100000010 000000001001 | 100001010010 000000001001 |
| MCG1 OR DCG1 | SYNC7 | 101010010010 000000001001 | 100101000010 000000001001 |
| MCG2 OR DCG2 | SYNC0 | 010000100010 000000001001 | 010100010010 000000001001 |
| MCG2 OR DCG2 | SYNC1 | 001000010010 000000001001 | 001010010010 000000001001 |
| MCG2 OR DCG2 | SYNC2 | 010001000010 000000001001 | 010010010010 000000001001 |
| MCG2 OR DCG2 | SYNC3 | 001000100010 000000001001 | 001010100010 000000001001 |
| MCG2 OR DCG2 | SYNC4 | 010101010010 000000001001 | 010001010010 000000001001 |
| MCG2 OR DCG2 | SYNC5 | 001001000010 000000001001 | 010010100010 000000001001 |
| MCG2 OR DCG2 | SYNC6 | 010010000010 000000001001 | 010100100010 000000001001 |
| MCG2 OR DCG2 | SYNC7 | 000100010010 000000001001 | 010101000010 000000001001 |

FIG. 25

| ncg | WHEN IT IS NOT AT A POINT OF INSERTING CODE WORD FOR DSV CONTROL<br>USE MAIN CONVERSION TABLE AND MAIN CONVERSION TABLE FOR DSV CONTROL | WHEN IT IS AT A POINT OF INSERTING CODE WORD FOR DSV CONTROL<br>USE ONLY SUB CONVERSION TABLE FOR DSV CONTROL |
|---|---|---|
| 1 | MCG1 OR MCG2 | MCG1 OR MCG2 |
| 2 | MCG2 OR DSV CODE GROUP | MCG1 OR MCG2 |
| 3 | DCG1 | DCG1 |
| 4 | DCG2 | DCG2 |

METHOD OF ALLOCATING RLL CODE HAVING ENHANCED DC SUPPRESSION CAPABILITY, MODULATION METHOD, DEMODULATION METHOD, AND DEMODULATION APPARATUS THEREFOR

CROSS-REFERENCE TO RELATED APPLICATIONS

This application claims the benefit of Korean Applications Nos. 99-14284, 99-22574, and 99-42032, filed Apr. 21, Jun. 16, and Sep. 30, 1999, respectively, in the Korean Patent Office, the disclosures of which are incorporated herein by reference.

BACKGROUND OF THE INVENTION

1. Field of the Invention

The present invention relates to modulation of m-bit information words into a signal and demodulation of the modulated signal, and more particularly, to a method of generating and allocating a (1, 8, 8, 12) code having effective DC suppression in a code word stream, a modulation and demodulation method, a demodulation apparatus therefor, in a run length limited (RLL) code to be used in optical disc recording and/or reproducing apparatuses which require particularly high density recording and/or reproducing.

2. Description of the Related Art

In optical recording and/or reproducing apparatuses, a run length limited (RLL) code represented by (d, k, m, n) is widely used for modulating original information into a signal appropriate for an optical disc and demodulating the signal reproduced from the optical disc into the original information. Types of optical discs currently in use include a compact disc (CD), and a digital versatile disc (DVD), and, at present, a high density disc (HD-DVD) which will have a higher density recording than that of the DVD is under development.

Among RLL codes which can be used in the HD-DVD, the characteristic of a (1, 7, 2, 3) code is the fact that its run length is restricted since the minimum run length is 2T(d=1), and the maximum run length is 8T(k=7). Its code rate R is R=m/n=2/3. T is an interval between each bit in a code word.

As shown in FIG. 1A, 2 bits of data are converted into 3 channel bits. When the run length is violated, that is, when user data "00" is followed by user data "00" or "01", or when user data "10" is followed by user data "00" or "01", the channel bits are replaced by using the conversion table of FIG. 1B.

Since a code word by itself cannot suppress the DC component of the code word in the conventional (1, 7, 2, 3) code, the variation of the Digital Sum Value (DSV) does not converge with DC value "0", as shown in FIG. 2 which illustrates the DSV variation curve of the (1, 7, 2, 3) code, when synchronization signals are not added. When this code is used in an optical disc system, a data slicer (also referred to as a data digitizing circuit) which converts a radio frequency signal picked up from the disc into a binary signal cannot properly operate. In addition, the lower frequency component of the code signal flows in a servo unit, which includes a tracking control unit and a focusing control unit, to create a bad influence, and lowers the reliability of the system.

SUMMARY OF THE INVENTION

To solve the above problems, it is an object of the present invention to provide a method of allocating an RLL code which is appropriate for a high-density disc system and is capable of effectual DC suppression in a code word stream.

It is another object of the present invention to provide a modulation method of modulating an RLL code which is capable of effectively suppressing DC in a code word stream.

It is still another object of the present invention to provide a modulation method using a code conversion table for DSV control at DSV control points, and otherwise using the main code conversion table.

It is still further another object of the present invention to provide a modulation method in which the number of code word bits is reduced by using some or all of the code words, already used in the main conversion table as code words of the code conversion table for DSV control for DC suppression.

It is still yet further another object of the present invention to provide a modulation method capable of effectively suppressing DC by using a sub conversion table for DSV control, which is separate from the main conversion table, the sub conversion table using to the maximum the sign of a code word sum value (CSV), which indicates the DC value within a code word, and the characteristic of an INV parameter, which predicts the transition of the DSV in the next code word.

It is still yet further another object of the present invention to provide a demodulation method capable of effectively suppressing DC in code word streams.

It is still yet further another object of the present invention to provide a demodulation method of demodulating code words of the conversion table for DSV control for DC suppression, which are modulated using some or all of the code words already used in the main conversion table.

It is still yet further another object of the present invention to provide a demodulation method of demodulating code words modulated using the sub conversion table for DSV control, which is separate from the main conversion table, the sub conversion table using to the maximum the characteristics of the code words of the main conversion table, that is the characteristics of a code word sum value (CSV) and an INV parameter.

It is still yet further another objective of the present invention to provide a demodulation apparatus for demodulating the RLL code appropriate for a high density disc system.

Additional objects and advantages of the invention will be set forth in part in the description which follows and, in part, will be obvious from the description, or may be learned by practice of the invention.

To accomplish the above and other objects of the present invention, there is provided an allocating method of allocating code groups grouped by the characteristics of code words after generating a run length limited (RLL) code which is represented by (d, k, m, n), in which d means the minimum run length, k means the maximum run length, m means the length of data bits, and n means the length of code word bits, the allocating method comprising allocating a pair of code groups for controlling direct current (DC) suppression in a code word stream; and allocating code words to the pair of code groups, the code words corresponding to the same source code, in order that the corresponding code words of each of the code groups have opposite signs of a $1^{st}$ parameter, a code word sum value (CSV), which represents the DC value in a code word and opposite characteristics of a $2^{nd}$ parameter INV which predicts the transition direction of the digital sum value (DSV) of the succeeding code word.

To accomplish the above and other objects of the present invention, there is provided a modulation method of modulating data input to optical disc recording/reproducing apparatuses to a run length limited (RLL) code which are represented by (d, k, m, n) in which d means the minimum run length, k means the maximum run length, m means the length of data bits, and n means the length of code word bits, the modulation method comprising (a) at a point of DSV control, modulating m-bit data input while inserting a code word for DSV control, and otherwise, modulating m-bit data input while selecting a code word of one code group in main code groups, in which code words have duplicated code words and code words of each code group are allocated to have the opposite signs of a $1^{st}$ parameter code word sum value (CSV) which represents direct current (DC) value in a code word and the opposite characteristics of a $2^{nd}$ parameter (INV) which predicts the transition direction of a digital sum value (DSV) of the succeeding code word, and decision code groups for determining whether a code word is the duplicated code word.

To accomplish the above and other objects of the present invention, there is provided a demodulation method of demodulating a code word stream received in optical disc recording/reproducing apparatuses using a Run Length Limited (RLL) code into original data, in which at a point of DSV control, m-bit input data is modulated to a code word for DSV control, and when it is not at a point of DSV control, m-bit input data is modulated to a code word in one code group among main code groups and decision code groups, the main code groups having duplicated code words and having code words which have a $1^{st}$ parameter code word sum value (CSV), which represents DC value in a code word, and the characteristic of a $2^{nd}$ parameter INV, which predicts a transition direction of a digital sum value (DSV) of the succeeding code word, both opposite to those of the corresponding code words of the other main code group, and the decision code groups for determining whether a code word is one of the duplicated code words, the demodulation method comprising (a) updating a $3^{rd}$ parameter, which points out the code group having the current code word to be demodulated, according to the characteristics of the previous code words after inputting a code word stream; and (b) demodulating the code word into the corresponding original m-bit data in the code group pointed out by the updated the $3^{rd}$ parameter when only one current code word exists in the code group pointed out by the updated the $3^{rd}$ parameter (ncg).

To accomplish the above and other objects of the present invention, there is provided a demodulation apparatus for demodulating an n-bit code word into the original m-bit data in optical disc recording/reproducing apparatuses using a run length limited (RLL) code represented by (d, k, m, n), in which d means the minimum run length, k means the maximum run length, m means the data bit length, and n means the code word bit length, the demodulation apparatus comprising a shift register which stores the preceding code word, a current code word, and the succeeding code word in a received code word stream; a detector which detects the value of a $3^{rd}$ parameter (ncg), which points out the next code group of the preceding code word, according to the number of end zeros (EZ) after checking the number of EZ of the preceding code word; a determining unit which supplies a determination signal for determining whether or not a code word is duplicated, after checking a predetermined bit of the preceding code word; and a demodulation code table which supplies m-bit data corresponding to the current code word in the code group pointed out by the $3^{rd}$ parameter (ncg) of the preceding code word.

BRIEF DESCRIPTION OF THE DRAWINGS

The above objectives and advantages of the present invention will become more apparent by describing in detail preferred embodiments thereof with reference to the attached drawings in which:

FIGS. 6A and 6B are tables showing the number of available code words in an (1, 8, 8, 12) code according to the present invention;

FIGS. 7A through 7E are a main conversion table of the (1, 8, 8, 12) code generated by the method of FIGS. 5A and 5B;

FIG. 8 is a main conversion table for DSV control of the (1, 8, 8, 12) code generated by the method of FIGS. 5A and 5B;

FIGS. 9A through 9E are a sub conversion table for DSV control of the (1, 8, 8, 12) code generated by the method of FIGS. 5A and 5B;

FIG. 10 illustrates the power spectrum of the (1, 8, 8, 12) code which uses the sub conversion table for DSV control of FIGS. 9A through 9E;

FIGS. 12A through 12C are another example of a sub conversion table for DSV control, which is separate from the main conversion table;

FIGS. 13A through 13C are another example of a sub conversion table for DSV control, in which the code words in the table are allocated in order that CSV signs and INV characteristics are opposite to those of the corresponding code words of FIGS. 12A through 12C;

FIGS. 15A through 15E are a main conversion table of the (1, 8, 8, 12) code generated by the method of FIGS. 14A and 14B;

FIG. 16 is a main conversion table for DSV control of the (1, 8, 8, 12) code generated by the method of FIGS. 14A and 14B;

FIGS. 17A through 17E are a sub conversion table for DSV control of the (1, 8, 8, 12) code generated by the method of FIGS. 14A and 14B;

FIG. 18 illustrates a power spectrum density curve of the (1, 8, 8, 12) code using only the main conversion tables of FIGS. 15A through 16;

FIG. 23 is an example of a synchronization pattern which can be used in the (1, 8, 8, 12) code according to the present invention which uses the code conversion tables of FIGS. 7A through 9E;

FIG. 24 is another example of a synchronization pattern which can be used in the (1, 8, 8, 12) code according to the present invention which uses the code conversion tables of FIGS. 15A through 17E;

FIG. 25 illustrates code groups indicated by ncg used in the present invention;

DETAILED DESCRIPTION OF THE INVENTION

Figures 1A, 1B, 2:
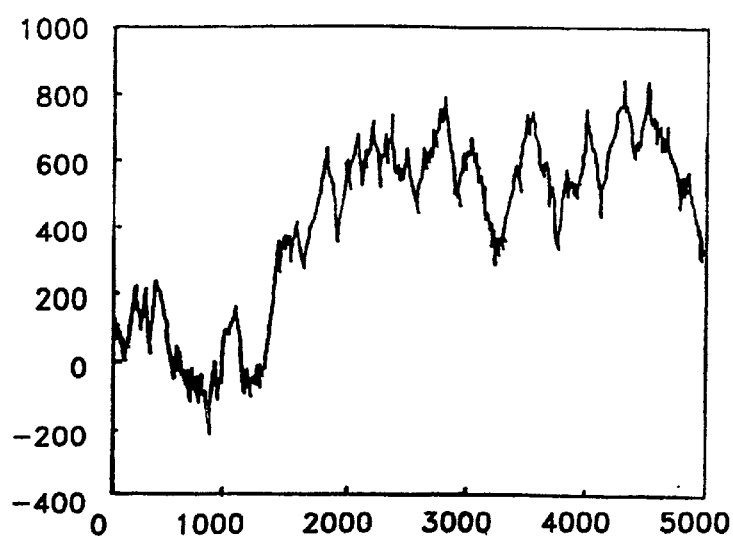
FIG. 1A illustrates a conventional (1, 7, 2, 3) code conversion table.
FIG. 1B illustrates a substitution conversion table used when the run length of the (1, 7, 2, 3) code is violated.
FIG. 2 is a curve showing the variation of a digital sum value (DSV) of the conventional (1, 7, 2, 3) code.

Hereinafter, embodiments of the present invention will be described in detail with reference to the attached drawings. The present invention is not restricted to the following embodiments, and many variations are possible within the spirit and scope of the present invention. The embodiments of the present invention are provided in order to more completely explain the present invention to anyone skilled in the art.

Among factors indicating code performance of a run length limited (RLL) code, which is represented by (d, k, m, n), recording density and DC suppression capability are generally used in evaluating the superiority thereof. The recording density and detection window margin of a code are expressed as the following equations 1 and 2.

$$\text{recording density} = (d+1)m/n \quad (1)$$

$$\text{detection window margin} = (m/n)T \quad (2)$$

Here, m is the number of data bits (also referred to as the number of source bits, or information word bit number), n is the number of code word bits after modulation (also referred to as channel bit number), d is the minimum number of consecutive zeros which can exist between the "1" bits in a code word, k is the maximum number of consecutive zeros which can exist between the "1" bits in a code word, and T is an interval between each bit in a code word.

As shown in the equation 1, a way for enhancing recording density in a modulation method is to reduce n, the number of code word bits, while maintaining the same d and m. However, the RLL code must satisfy the constraint that d is the minimum number of consecutive zeros situated between the "1" bits in a code word, and the constraint that k is the maximum number of consecutive zeros situated between the "1" bits in a code word. If the number of data bits that satisfy the (d, k) constraint is m, the number of code words that satisfy the RLL (d, k) constraint must be $2^m$ or more. However, in order to actually use such codes, even a part which connects a code word to another code word must satisfy the RLL (d, k) constraint, and the code must have DC suppression capability when it is used in optical disc recording and/or reproducing apparatuses in which the DC component of a code affects system performance.

For this reason, as for a compact disc (CD), an Eight-to-Fourteen Modulation (EFM) code, wherein 8 bits of data is modulated into a 14-bit code word, requires an additional 3 merge bits between code words in addition to the 14-bit converted code word in order to have DC suppression capability and to satisfy a run length constraint of the RLL (2, 10) (CD uses a code of 'd=2' and 'k=10'). The merge bits are added only to obtain a desired run length (d, k) and DC suppression and do not include any information. Thus, they become a heavy burden in enhancing recording density.

As for a digital versatile disc (DVD), an EFM plus (EFM+) code is used. The EFM+code also has a run length constraint of the RLL (2, 10), but does not use merge bits. Instead, the length (n) of a code word is 16 bits. If the run length (2, 10) is satisfied by using the four main conversion tables, DC suppression of the code stream is carried out by using the sub conversion table.

The above described code is superior in the aspect of suppression of the DC component. In particular, the EFM+ code which is applied to a DVD reduces the number of code word bits by one bit, and achieves a 5.9% increase in recording density by only changing a code modulation method, compared to the EFM code which is applied to a CD. However, the EFM+ code also requires four additional sub conversion tables, which causes a problem in that it is difficult to reduce the number of code word bits.

The major reason for suppressing the DC component in the RLL modulated code is to minimize the influence of a reproduced signal on the servo bandwidth. The method of suppressing the DC component will be referred to as a digital sum value (DSV) control method hereinafter.

The DSV control method can be broadly divided into two types. One method includes DSV control codes in the code itself for controlling the DSV, while the other method inserts merge bits at DSV control points. Among the codes described above, the EFM+code performs DSV control by using a separate code table, while an EFM code or (1, 7) code performs DSV control by inserting merge bits.

Figure 3:
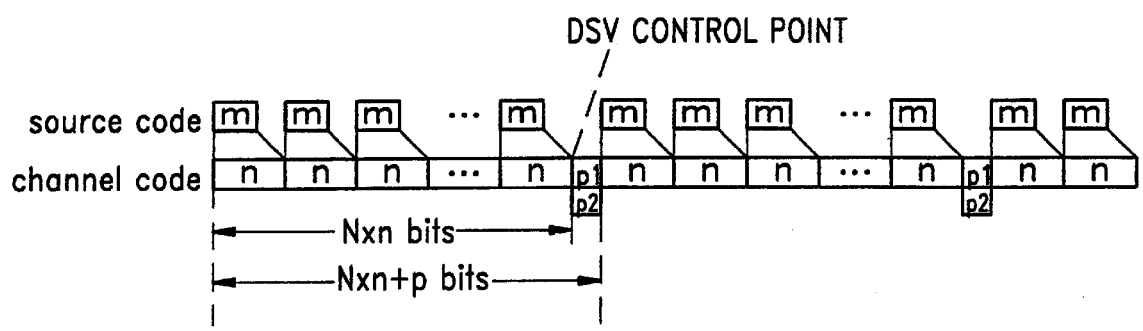
FIG. 3 illustrates a DSV control method using merge bits, in order to help one understand the present invention.

According to the DSV control method which uses merge bits as shown in FIG. 3, at a point which is not a DSV control point, an m-bit source code is converted into an n-bit channel code, and at a DSV control point, p merge bits are inserted. At this time, DSV control can only be performed when the (d, k) constraint of the RLL code is satisfied. When the (d, k) constraint is satisfied in the p merge bits, DSV control is performed in order that the cumulative DSV becomes smaller. At this time, if it is considered that DSV control is performed once every N codes, the actual number of channel bits corresponding to N source codes is N*n+p.

Figure 4:
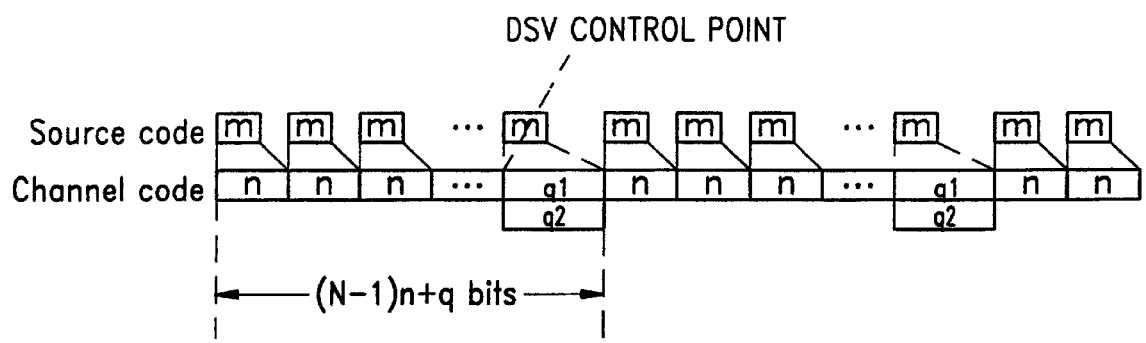
FIG. 4 illustrates a DSV control method using a separate DSV code, in order to help one understand the present invention.

When DSV control is performed by adding merge bits, DSV control cannot be performed at every DSV point. DSV control can only be performed when the (d, k) constraint of the RLL code is satisfied during merging. As an example, when 1 and 2 merge bits are inserted respectively in an RLL code which satisfies a (1, 8) constraint, the probability that DSV control is performed during each merge is 75 % and 95 %, respectively. Based on this fact, DSV control can be performed at every DSV point, as shown in FIG. 4, by using a separate modulation code table for DSV.

That is, instead of inserting merge bits at a DSV control point, a channel code of the DSV control point is obtained from a separate code table designed for DSV control. The separate code table for DSV control is designed to enable DSV control. In general, a q-bit code word of the separate code table for DSV control satisfies a condition that it is bigger than an n-bit channel word (q>n).

At a point which is not a DSV control point, an m-bit source code is converted into an n-bit channel code, and at a point which is a DSV control point, an m-bit source code is converted into a q-bit channel code. DSV control is performed in order that a code which minimizes the cumulated DSV is selected from q1 and q2, both of which can perform DSV control. The codes q1 and q2 are obtained from a code table which is formed to always enable DSV control, and always enable DSV control at every DSV point. In FIG. 4, if it is considered that DSV control is performed once every N codes, the number of channel bits corresponding to N source codes is (N−1)*n+q bits.

Therefore, according to the present invention, some or all code words which are already used in the main conversion table are used as code words of a sub conversion table for DSV control for suppressing DC, which enables the number of code word bits to be reduced. By taking full advantage of the characteristics of code words in the main conversion table, that is, a CSV parameter which indicates the DC value in a code word and an INV parameter which predicts the transition direction of the next code word, and, by creating a sub conversion table for DSV control which is separate from the main conversion table, effective DC suppression can be achieved.

An RLL code generating method which increases DC suppression and recording density by using these main and sub conversion tables and is particularly appropriate for a high-density optical disc system will now be described.

First, terms used in the present invention will be described.

| (Preceding code) | | (Current code) | |
| --- | --- | --- | --- |
| 000010001001000 | | 001000001001000 | |
| LZ(p) | EZ(p) | LZ(c) | EZ(c) |

Here, the minimum run length is d, the maximum run length is k, the length of data bits is m, and the length of code word bits is n. LZ(p) and LZ(c) are the number of lead zeros in a previous code word and in a current code word, respectively, while EZ(p) and EZ(c) are the number of end zeros in a previous code word and in a current code word, respectively. DSV is a digital sum value in a code word stream, that is, a value made by cumulatively adding "0" bits, which are treated as "−1", and "1" bits, which are treated as "+1" in an inverted pattern after inverting "1" or "0" until the next "1" in a series of code word streams comes. CSV is a digital sum value in a code word, that is, a value made by cumulatively adding 0, which are treated as "−1", and 1, which are treated as "+1" in the inverted pattern after inverting "1" or "0" until comes the next "1" in a code word. INV is a parameter which predicts the transition of a next code word. If there is an even number of "1" bits in a code word, the INV parameter is 0 (INV=0), and, if the number of "1" bits in a code word is an odd number, the INV parameter value is 1(INV=1). 'x' is a parameter which divides the main code groups, 'y' is a duplication parameter, and bit(i), bit(j), and bit(k) represent ith, jth, and kth bits, respectively, in a code word. Here, if the INV cumulated in a code word stream is 0, the DSV is updated by adding the inverted CSV of the next code, without change, to the DSV value cumulated previously, and, if the INV value is "1," the DSV is updated by adding the CSV of the next code word to the DSV value cumulated previously after inverting the sign of the CSV of the next code word.

If the above stream are taken as an example, INV, CSV, and DSV parameters are given as follows.

| Code word: | 000010001001000 | 001001001001000 |
| --- | --- | --- |
| INV: | 1 | 0 |
| CSV: | +1 | −3 |
| code stream: | 000011110001111 | 110001110001111 |
| DSV: | −1,−2,−3,−4,−3,−2,−1,0, | +2,+3,+2,+1,0, |
| | −1,−2,−3,−1,0,+1 | +1,+2,+3,+2,+1,0, |
| | | +1,+2,+3,+4 |

This method was proposed in the Patent Application No. 99-7723 which was filed under the title of "Method of generating Run Length Limited (RLL) code having improved DC suppression capability and modulation/demodulation method of the generated RLL code" in Korea on Mar. 9, 1999, by the above applicants. For reference, the method will now be described referring to FIGS. 5A and 5B.

Figure 5A:
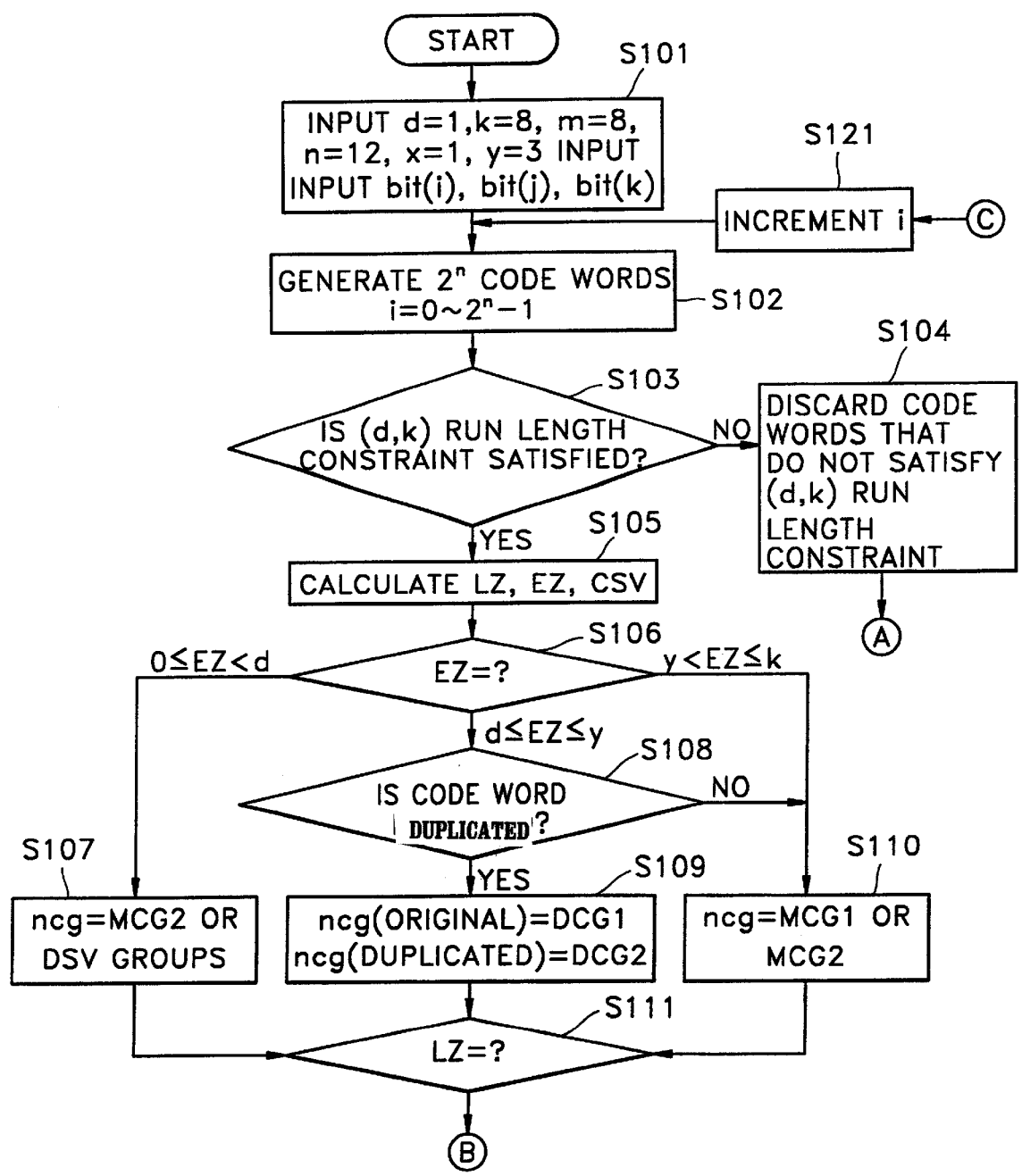
FIGS. 5A and 5B are a flowchart for describing a method of generating code groups for a Run Length Limited (RLL) code in order to help one understand the present invention.
Figure 5B:
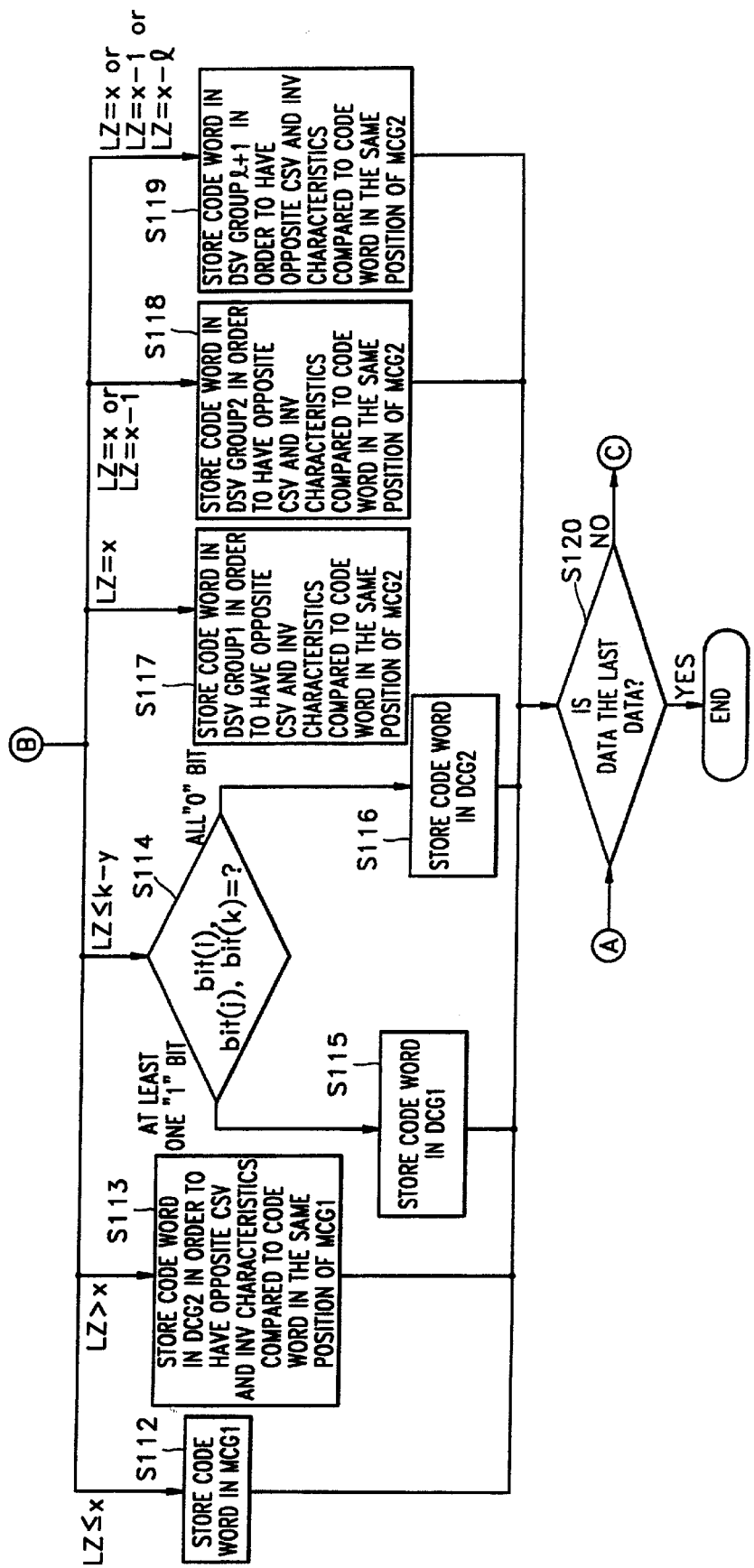

Referring to FIGS. 5A and 5B which are a flowchart of a method of generating an RLL code group in order to help one understand the present invention, the minimum run length (d), the maximum run length (k), the data bit length (m), the code word bit length (n), the division parameter (x) of the main conversion group, the code word duplication parameter (y), and predetermined bits (bit (i), bit (j), bit (k)) are input as desired in step S101.

$2^n$ code words from 0 through $2^n-1$ that satisfy the constraints set in the step S101 are generated in step S102. It is determined whether the generated codes satisfy the (d, k) run length constraint in step S103. Since only those codes that satisfy the (d, k) run length constraint can be used among the generated codes, the code words that do not satisfy the (d, k) run length constraint are discarded in step S104. The characteristics of code words are extracted from the code words that satisfy the run length (d, k) constraint in step S105, wherein parameters for extracting required characteristics include the number of lead zeros (LZ), the number of end zeros (EZ), and the code word sum value (CSV) of each code word.

Some code words are duplicated in order to increase the number of available codes, and the EZ values are checked in order to satisfy the (d, k) constraint of connection parts between code words in step 106. According to the EZ values, the following operations are performed. If the number of end zeros (EZ) in a code word is 0≦EZ<d, the code words of the next code group (hereinafter referred as ncg) are selected in order that the next code word is selected from the 2nd Main Code Group (MCG2) or the DSV group, in step S107.

If the EZ value in a code word is d≦EZ≦y, it is determined whether the code word is duplicated in step S108. If the code word is an original code word and not duplicated, the ncg is selected in order that the next code word can be selected from the 1$^{st}$ Decision Code Group (DCG1), and, if the code word is duplicated, the ncg is selected in order that the next code word can be selected from the 2$^{nd}$ Decision Code Group (DCG2) in step S109.

If the EZ value of a code word checked in the step S106 is y<EZ≦k, or if the EZ value is d≦EZ≦y and the code word is not duplicated, the ncg of the code word is selected in order that the next code word can be selected from one of the 1$^{st}$ main code group (MCG1) and the MCG2 in step S110.

In this manner, the ncg of code words that satisfy the (d, k) constraint is selected. According to the ncg, a code group of a next code word that can be attached to the current code word is determined, and the connection part of code words also satisfies the (d, k) constraint. Here, the reason why the codes that satisfy d≦EZ≦y are duplicated is that, for the codes of which EZ values are 0, 1, ..., d−1, DSV control of a code word stream is performed by using DSV groups in order to suppress the entire DC component.

A method of grouping code words by code group and the characteristics of each code group will now be described. In order to group code words by code group, the number of lead zeros, that is, an LZ value, is used, and the LZ value of a code word is checked in step 111.

If the LZ value of a code word is less than or equal to x, the code word is stored in the MCG1 in step S112. If the LZ value is LZ>x, the code word is stored in the MCG2 in order that a code word, which has the characteristic of INV and the sign of CSV values opposite to those of an MCG1 code word that has the same decoded value, is allocated in step S113. If there is no code word of which both INV and CSV have opposite characteristic and sign, then a code word which has the opposite CSV sign is allocated, and, next a code word which has the opposite INV value is allocated. The reason for allocating code words in this way is to enable the selection of a code word that has better capability for suppressing the DC component if both code words, which have the same decoded value, of the two code groups satisfy the (d, k) constraint when the ncg of a code word commands to call a next code word in the MCG1 or the MCG2. At the same time, it is because the code words which are included in the two code groups and correspond to the same data have opposite INV and CSV values, which allows DC control to be performed optimally in one of the two code words.

If the LZ value is LZ≦k−y, bit(i), bit(j), and bit(k) are checked in step S114. If at least one of the bits is "1", the code word is stored in the DCG1 in step S115. If the bits checked in the step S114 are all "0", the code word is stored in the DCG2 in step S116. The allocation of code words in the DCGs is carried out in order that as many code words as possible may have the same positions in the MCG1 and the MCG2. For example, if "100010001000100" is a code word in the MCG1 and included in the DCG1, and the code word has a decoded value of 128 in the MCG1, the code word is allocated in the position, in the DCG1, at which the decoded value corresponds to 128. This is to minimize error propagation when an error occurs in decoding.

The reason for allocating code words which satisfy LZ≦k−y to the DCGs is because the code words which satisfy d≦EZ≦y are duplicated. When duplicated code words are decoded, the next code word is referred to in order to correctly decode duplicated code words into corresponding data. If the next code word is selected from the DCG1, the code word is demodulated into the decoded data corresponding to the original code word, and if the next code word is selected from the DCG2, the code word is demodulated into the decoded data corresponding to the duplicated code word.

In addition, in order that the code words that satisfy d≦EZ≦y may be connected with code words of the DCG1 or the DCG2 while satisfying the (d, k) constraint, EZ(p)+LZ(c), the sum of the number of end zeros of the preceding code word, EZ(p), and the number of lead zeros of the current code word, LZ(c), must satisfy d≦EZ(p)+LZ(c)≦k, and therefore LZ(c) of the decision group must satisfy LZ≦k−y.

For example, upon decoding, when two duplicated "100010001000100" code words exist in the MCG1, that is, when the decoded value of the original code word "100010001000100" is 128 and the ncg is the DCG1, and the decoded value of the duplicated code word "100010001000100" is 129 and the ncg is the DCG2, the code word "100010001000100" is demodulated into 128 or 129 depending on whether the ncg is the DCG1 or the DCG2.

The allocation of DSV groups will now be described. The DSV groups are proposed in the present invention as a method of suppressing the DC component in a code word stream, and correspond to sub-code groups because the DSV groups use code words which are already used in the MCG1 and do not require additional code words.

In step S117, the code words which satisfy LZ=x are allocated in the 1$^{st}$ DSV code group in order that the code words have the same positions as in the MCG2 and opposite CSV signs and INV characteristics to each other. In step S118, the code words which satisfy LZ=x or x−1 are allocated in the 2$^{nd}$ DSV code group in order that the code words have the same positions as in the MCG2 and opposite CSV signs and INV characteristics. In the same manner, in step S119, the code words which satisfy LZ=x, x−1, ..., or x−1 are allocated in DSV code group 1+1 in order that the code words have the same positions as in the MCG2 and opposite CSV signs and INV characteristics. The allocation of code words in DSV groups are carried out as in the MCG1. That is, if identical code words are in the MCG1 and a DSV group, the code word of the DSV group is placed at the same position in the DSV group as that of the identical code word in the MCG1, and by doing so, the identical code words in the two code groups can be decoded into the same data.

As described in the step S107, when the EZ value of a code word satisfies 0≦EZ<d, the ncg is selected from one of the MCG2 group and the DSV groups. Since the code words in the DSV group are extracted from the MCG1 among the main code groups according to the present invention, the code words in the DSV groups are clearly distinguished from the code words in the MCG2. A code word which follows the code word that satisfies 0≦EZ<d is selected from one of the MCG2 and the DSV group, which has better capability of suppressing the DC component.

Therefore, the method of selecting the DSV group is carried out in order that, if d≦EZ(p)+LZ(c)≦k is satisfied and EZ(p) is 0, a code word in DSV group 1 is selected, if EZ(p) is 1, a code word in DSV group 2 is selected, and in the same manner, if EZ(p) is x, x−1, ..., or x−1, a code word in DSV group 1+1 is selected.

Therefore, the ncg (next code group) which points out a code group of code words that follow the code words existing in each code group checks the EZ value of a code word, and, if EZ≦d−1 is satisfied, the ncg is made to indicate the 2$^{nd}$ main code group or the DSV code group. If d≦EZ≦y is satisfied and the code word is duplicated, the ncg is made to indicate the 1$^{st}$ decision code group or the 2$^{nd}$ decision code group, and, if y<EZ≦k is satisfied or d≦EZ≦y is satisfied and the code word is not duplicated, the ncg is made to indicate the $1^{st}$ main code group or the $2^{nd}$ main code group. By doing so, when the maximum run length k is not violated, the scope of code selection can be widened, which enhances DC suppression capability of a code.

The selected code word is stored in the corresponding code group. After determining whether or not data is the last data in step S120, if it is the last data, the allocation is finished, and, otherwise, i (here, i=0, 1, . . . , $2^{n-1}$) is incremented in step S121, and the step S102 in which $2^n$ code words are generated is carried out.

FIGS. 6A and 6B show the number of available code words in the (1, 8, 8, 12) code proposed by the present invention. The generated code words are divided into 5 code groups based on the characteristics of the code words, and the five code groups are divided into two main code groups (MCG1, MCG2), two decision code groups (DCG1, DCG2), and one DSV code group, based on respective functions of the code groups.

Here, no identical code words exist in the two main code groups MCG1 and MCG2, and likewise no identical code words exist in the two decision code groups DCG1 and DCG2.

Here, the main code group is defined as a code group which is comprised of code words that follow a code word which is not duplicated, and the decision code group is defined as a code group which is comprised of code words that follow a code word which is duplicated. Therefore, the code groups can be differently named later depending on the purpose of code word use, but the meaning of the code groups will be maintained within the above scope.

The DSV code group is a separate code group for suppressing the DC component in a code stream. 70 code words which belong to the DSV code group all begin with "010" and belong to the $1^{st}$ main code group (MCG1) which is one of the main code groups. A main code group and a decision code group must each have 256 code words. The $1^{st}$ main code group (MCG1) lacks 70 code words and the $2^{nd}$ main code group (MCG2) lacks 58 code words. The total number of lacking code words is 128. The lacking code words are complemented with code words which begin with "01." Therefore, except the DSV code group, if one code word in the $2^{nd}$ decision code group (DCG2) is excluded, all code groups have 256 code words, respectively.

The code conversion table generated by the characteristics of the code groups of FIG. 6A is shown in FIGS. 7A through 8, and the code conversion table generated by the characteristics of the code groups of FIG. 6B is shown in FIGS. 15A through 16.

FIGS. 7A through 7E are the main conversion table, which is divided into code groups (MCG1, MCG2, DCG1, DCG2), for the (1, 8, 8, 12) code of the present invention, and illustrate an example of a code conversion table when parameters are set as d=1, k=8, m=8, n=12, x=1, y=3, bit(i)=bit(j)=9, bit (k)=5.

First, in a main code group, for example, in the $1^{st}$ main code group (MCG1), 70 code words of 186 code words which satisfy LZ=0 and no code words among 128 code words which satisfy LZ=1 are allocated. As for what code words will be allocated in the $1^{st}$ main code group (MCG1), though it is very experimental, one that is advantageous for DSV control among code words corresponding to the same source words in the $1^{st}$ main code group (MCG1) and the $2^{nd}$ main code group (MCG2) is selected. Here, code words corresponding to the same source words are allocated in order that they have opposite CSV signs and INV characteristics.

Once all code groups except the DSV code group obtain 256 code words, first, code words of the MCG1 and the MCG2 are allocated so that the absolute values of their CSVs are in descending order. Then, the code words of the MCG2 are re-allocated in an order in which the MCG2 code words have opposite INV characteristics as well as opposite CSV signs with respect to the corresponding MCG1 code words. Likewise, 70 code words of the DSV code group are allocated so that the absolute values of their CSVs are in descending order, and then, re-allocated in an order in which the DSV code words have opposite INV characteristics as well as opposite CSV signs with respect to the MCG2 code words corresponding to the same source words.

In the meantime, in addition to the above-described allocation method in which code words are allocated to have opposite INV characteristics and CSV signs, other methods can be implemented as a code word allocation method of allocating a pair of code groups which can control DC suppression (for example, the MCG1 and the MCG2, or the MCG2 and the DSV code group). In one of such methods, code words in a pair of code groups which can control DC suppression, in which the code words correspond to the same source words, have opposite CSV signs and INV characteristics, and select the same code group of the next code words so that the DSV direction of a code word stream are opposite to each other with respect to the identical source codes in the pair of code groups. Alternatively, the code words which correspond to the same source words can have opposite INVs and select the same code group of the next code words so that the DSV direction of a code word stream can converge on "0" even if the current DSV is disadvantageous, which is particularly advantageous when the code stream selection algorithm of a look-ahead method is used.

These code group pairs, the MCG1 and the MCG2, or the MCG2 and the DSV code group, are the code groups which can control DC suppression, and DC suppression capability when code words have opposite CSV signs and INV characteristics can be expected to have an additional suppression effect of about 2~3 dB compared to DC suppression capability when code words have only opposite CSV signs.

FIG. 8 shows the main conversion table for DSV control. As described above, in order to make the DSV code group and the main conversion table for DSV control, 70 code words which satisfy LZ=1 and belong to the MCG1 are grouped and allocated in order that the code words have opposite CSV signs and INV characteristics compared to the code words in the MCG2. If a point is not a DSV inserting point when DSV control bits are inserted into a code word to be modulated, DSV control is carried out by selectively using one of the MCG2 conversion table of FIGS. 7A through 7E and the main conversion table for DSV control of FIG. 8 when input data to be modulated is less than 70.

Here, even though a code group which has the next code word is the MCG1, the DSV code group can be made by using code words which are included in the MCG2 and have the possibility of obeying the (d, k) run length constraint. At this time, the code words which have opposite CSV signs and INV characteristics compared to the MCG1 code word corresponding to the same source words are allocated to the DSV control code group. By doing so, additional DC suppression control can be carried out together with the MCG1.

FIGS. 9A through 9E are a sub conversion table for DSV control for use instead of the main conversion table of FIGS. 7A through 7E at a point which is a DSV control point when DSV control bits are inserted into a code word to be modulated. Contrary to FIGS. 7A through 8, each code word is formed with 13 bits, and the most significant bit (MSB) is a bit for DSV control. 'x' means that both 0 and 1 can be used, and one that is advantageous to DSV control is selected. The characteristic of the sub conversion table for DSV control is that 1 merge bit is added to the number of bits in each code word of the main conversion table of FIGS. 7A through 7E, and the merge bit is allocated to the MSB, and the value is represented as x which can be selected as "0" or "1" in order not to violate the run length constraint.

Therefore, the sub conversion table has a characteristic in that x of the MSB is selected as one of "0" and "1", which is advantageous to DSV control, and the other bits except the MSB bit (12 bits in the present embodiment) are the same as those in the main conversion table. However, the code words in FIGS. 9A through 9E are for DSV control and have a greater number of bits (here, 13 bits) as compared to the main conversion code words, and, when the designer more strongly desires the DSV control, a code word appropriate for DSV control can be found and designed by using 13 bits which are separate from the main conversion table, without using the merge bit. At this time, the code words can be formed with a predetermined number of bits (for example, equal to or more than 13 bits), which are separate from the sub conversion table, for DSV control using the tables of FIGS. 9A through 9E.

Figures 9E, 10:
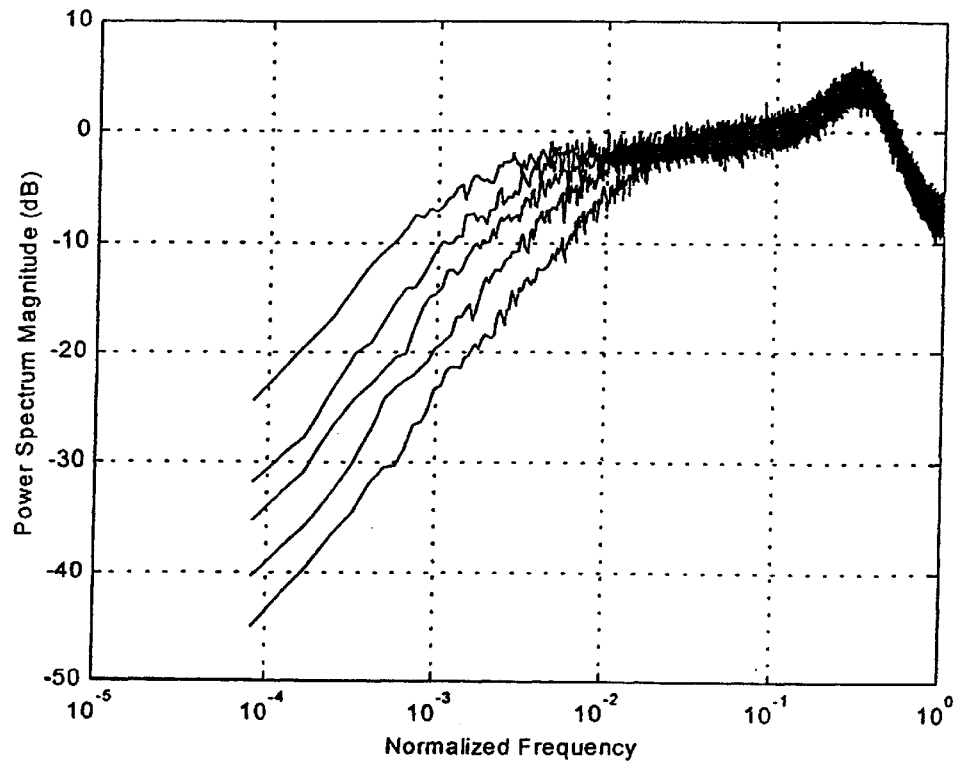

FIG. 10 illustrates the DSV variation curves of the (1, 8, 8, 12) code which uses the code tables of FIGS. 7A through 9E, and shows the result obtained by simulating DC performance of code words according to the DSV control frequency (the frequency of usage of the sub conversion table for DSV control of FIGS. 9A through 9E). Shown from top to bottom are the power spectrum when the sub conversion table for DSV control is not used; the power spectrum when the sub conversion table for DSV control is used once for every 8 code words; the power spectrum when the sub conversion table for DSV control is used once for every 4 code words; the power spectrum when the sub conversion table for DSV control is used once for every 2 code words; and the power spectrum when the sub conversion table for DSV control is used once for every code word.

Figure 11:
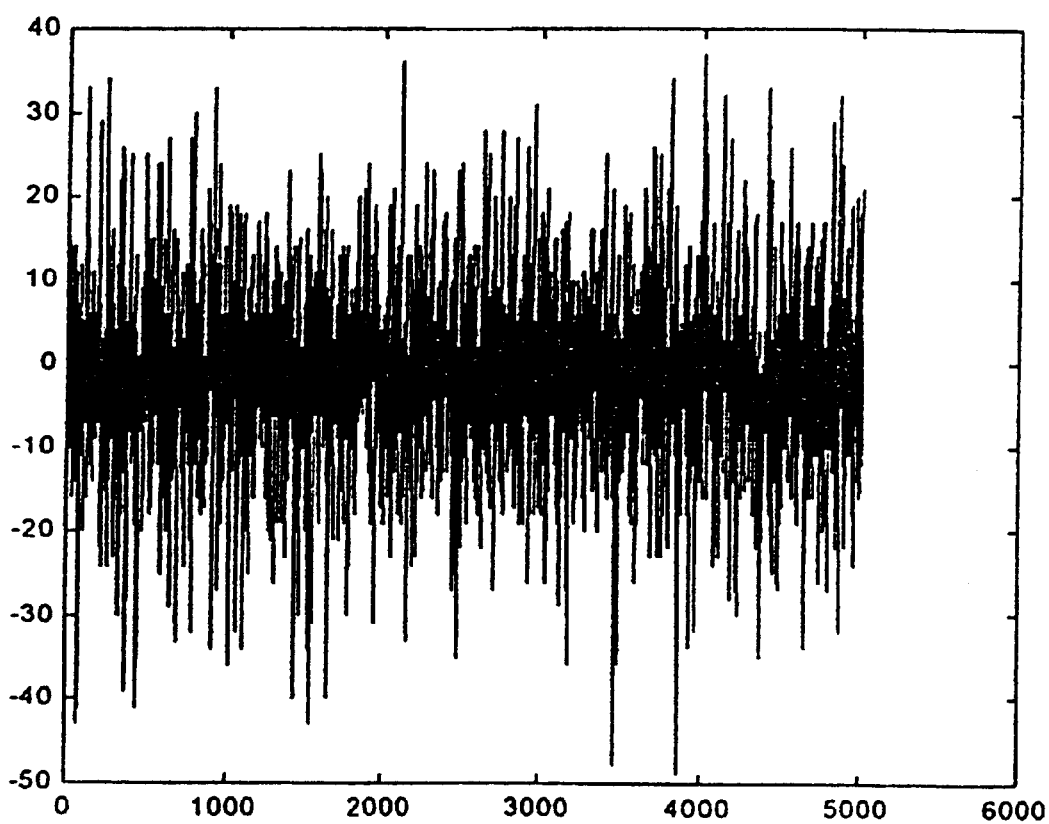
FIG. 11 illustrates the DSV variation curve of the (1, 8, 8, 12) code which does not use the sub conversion table for DSV control of FIGS. 9A through 9E.

Input data is random data, and it is shown that the low-frequency component of a code word is decreased as the frequency of usage of the sub conversion table for DSV control of FIGS. 9A through 9E becomes higher. In addition, as shown in FIG. 11, when only the main conversion table (FIGS. 7A through 7E) and the main conversion table for DSV control (FIG. 8) are used without using the sub conversion table for DSV control (FIGS. 9A through 9E), it is characteristic that the DSV value is continuously converging on "0" contrary to FIG. 2 which is the DSV variation curve of the conventional (1, 7, 2, 3) code.

Figure 14A:
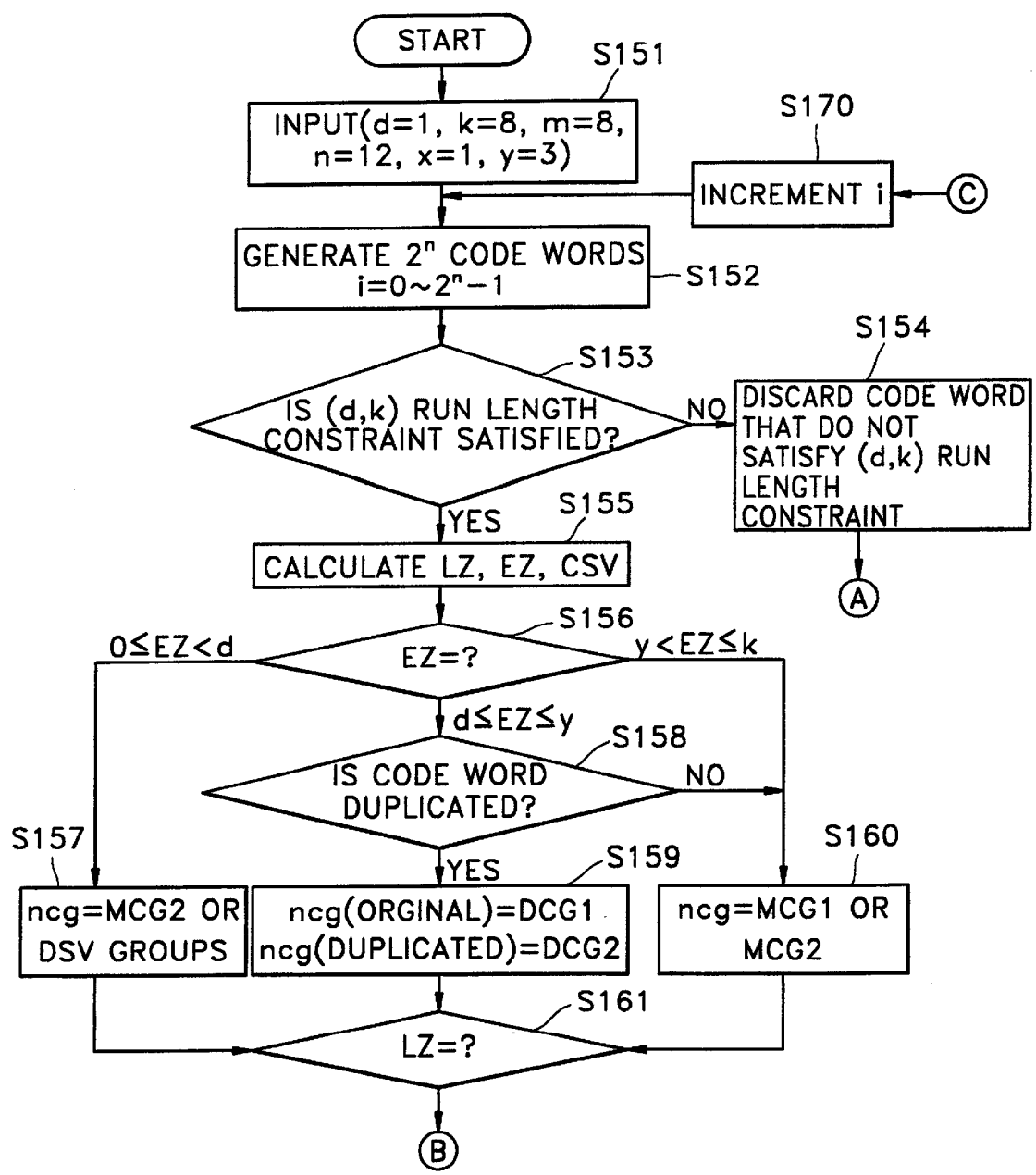
FIGS. 14A and 14B are a flowchart for describing an embodiment of a method of generating code groups for the (1, 8, 8, 12) code using the RLL code group generation method of FIGS. 5A and 5B.
Figure 14B:
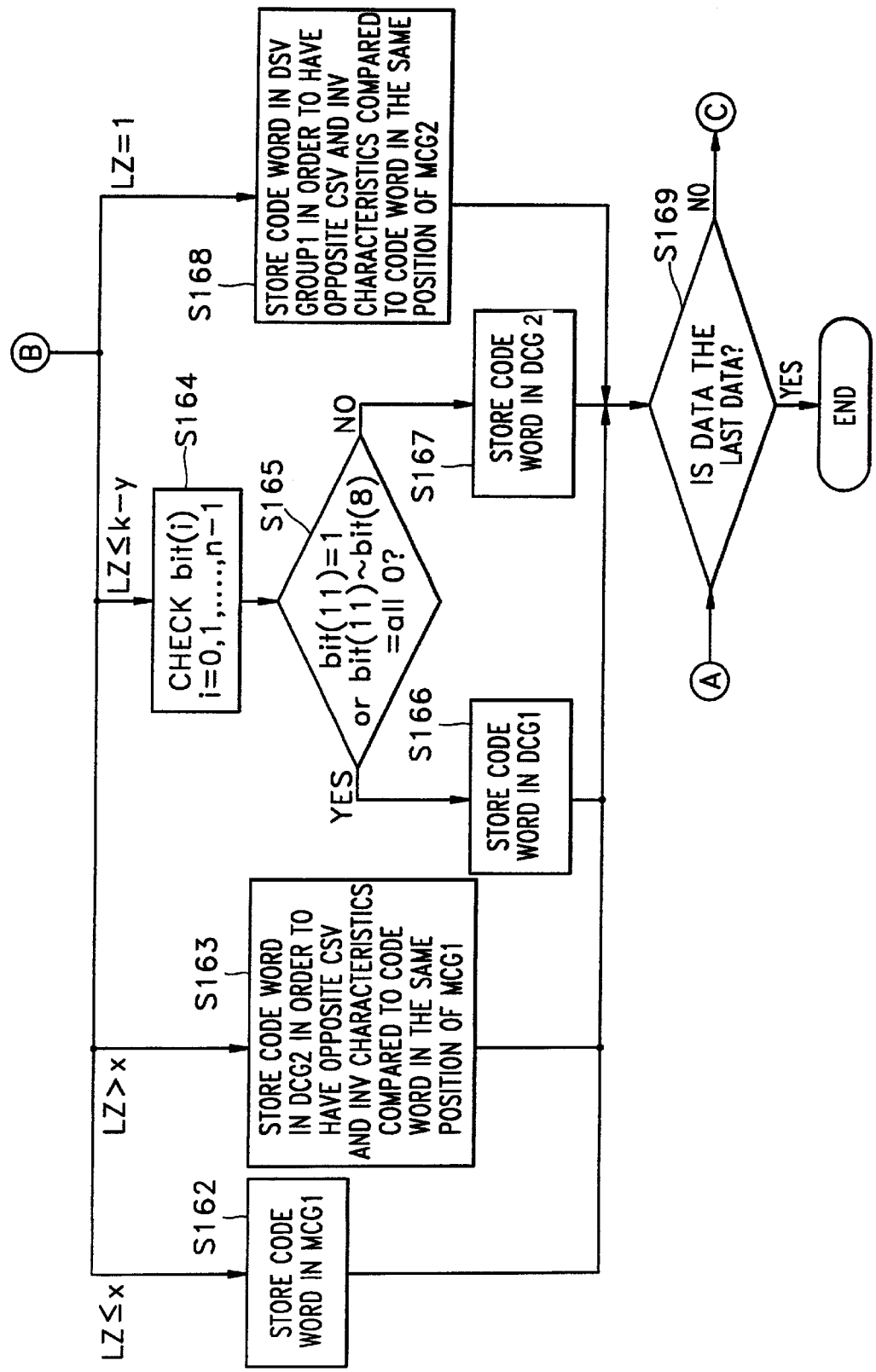

FIGS. 12A through 12C and FIGS. 13A through 13C are sub conversion tables for DSV control which are generated while satisfying the constraints of d=1 and k=8 by using the RLL code generation method of FIGS. 14A and 14B, and separate from the main conversion table. The sub conversion table for DSV control of FIGS. 9A through 9E uses the main conversion table code words of FIGS. 7A through 7E without change and the most significant bit is used as the DSV control bit in a code word, while the sub conversion tables for DSV control of FIGS. 12A through 12C and 13A through 13C use 14-bit code words separate from the main conversion table.

The separate sub conversion tables for DSV control of FIGS. 12A through 12C and 13A through 13C include each of four code groups. The code groups (MCG1-1, MCG2-1, DCG1-1, DCG2-1) of the sub conversion table of FIGS. 12A through 12C and corresponding code groups (MCG1-2, MCG2-2, DCG1-2, DCG2-2) of the sub conversion table of FIGS. 13A through 13C are allocated as the characteristic of the main conversion table code words in order that the code words have opposite CSV signs and INV characteristics. At the same time, the next code group are identically selected so that the DSV direction of a code stream are opposite to each other with respect to the identical source codes in the pair of code groups.

FIGS. 14A and 14B are a flowchart of an embodiment of a method of generating code groups for the (1, 8, 8, 12) code using the RLL code group generation method of FIGS. 5A and 5B. Since the steps S153 through S163, and the steps S169 and S170 are the same compared to FIGS. 5A and 5B, the explanation thereof will be omitted. The differences with FIGS. 5A and 5B will now be described mainly focusing on steps S151 and S152, and steps S164 through S168.

In step S151, input is carried out, so that the minimum run length (d) is 1, the maximum run length (k) is 8, the length of data bits (m) is 8, the length of code word bits (n) is 12, the main code group division parameter(x) is 1, and the code word duplication parameter (y) is 3. In step S152, $2^n$(i= 0~$2^n$−1) code words which satisfy the constraints input in the step S152 are generated, that is, $2^{12}$ code words are generated.

In the meantime, when the LZ value satisfies LZ≦k−y, bits from the least significant bit (bit0) to the most significant bit (bit11) are checked in step S164. It is determined whether the most significant bit (bit11) is "1" (10xxb: LZ=0) or the upper significant four bits (bit11 bit8) are all "0" (000b: LZ=4 or 5) in step S165. If the most significant bit (bit11) is "1" or the upper significant four bits (bit11 ~bit8) are all "0," the code word is stored in the DCG1 in step 166. Otherwise (010xb(LZ=1), 0010b (LZ=1), or 0001b (LZ=3)), the code word is stored in the DCG2 in step S167. The code words which satisfy LZ=1 are stored in the DSV code group so that the code words have opposite CSV signs and INV characteristics while having the same position as the MCG2 code words in step S168.

FIGS. 15A through 15E are a main conversion table by code group (MCG1, MCG2, DCG1, DCG2) for the (1, 8, 8, 12) code generated by the algorithm of FIGS. 14A and 14B, and the characteristics of each code group are the same as FIG. 6B. However, the two decision code groups DCG1 and DCG2 are allocated in a manner in which code words that satisify LZ is 0, 4, or 5 are allocated in the DCG1 and code words that satisfy LZ is 1, 2, or 3 are allocated in the DCG2, and both groups' code words are allocated in the same positions as MCG1 and MCG2 code words which correspond to the same source words so that errors can be reduced when demodulating.

FIG. 16 is a main conversion table for DSV control which includes 70 code words that exist in the MCG1 of FIGS. 15A through 15E and are specially parted for DSV control. The conversion table is generated in order that the code words of the conversion table have the opposite CSV and INV parameters with respect to the code words of the MCG2.

FIGS. 17A through 17E are a sub conversion table for DSV control for use instead of the main conversion table of FIGS. 15A through 15E at a DSV control point when a DSV control bit is inserted into a code word to be modulated.

Each code word in the sub conversion table is made by adding 1 merge bit to a code word in the main conversion table of FIGS. 15A through 15E. The 1 bit is allocated in the MSB of a code word, and the value of the 1 bit is represented by x which means "0" or "1" can be selected in order not to violate the run length constraint.

Figures 17E, 18:
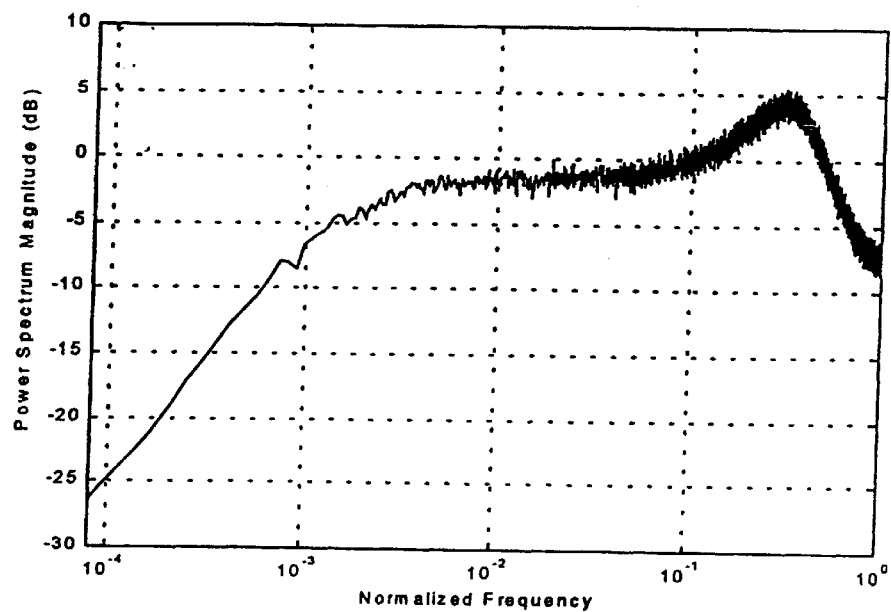

FIG. 18 illustrates the result of a computer simulation of the DC performance of a code word by using only the main conversion tables of FIGS. 15A through 16. The result indicates that the code word itself has a DC suppression effect without using merge bits.

Figure 19:
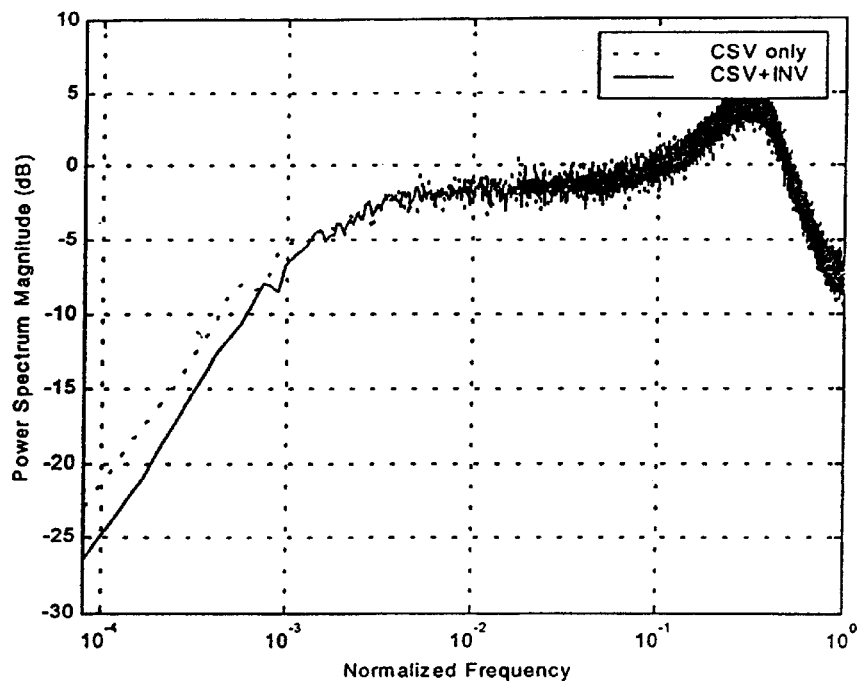
FIG. 19 illustrates a DC suppression effect of the INV parameter in the (1, 8, 8, 12) code by using only the main conversion tables of FIGS. 15A through 16.

FIG. 19 illustrates that the code group pairs (the MCG1 and the MCG2, or the MCG2 and the DSV code group) can control DC suppression and DC suppression capability when code words have opposite CSV and INV parameters (represented by a solid line) can be expected to have an additional suppression effect of about 2~3 dB compared to the DC suppression capability when code words have only opposite CSV signs (represented by a dotted line).

Figure 20:
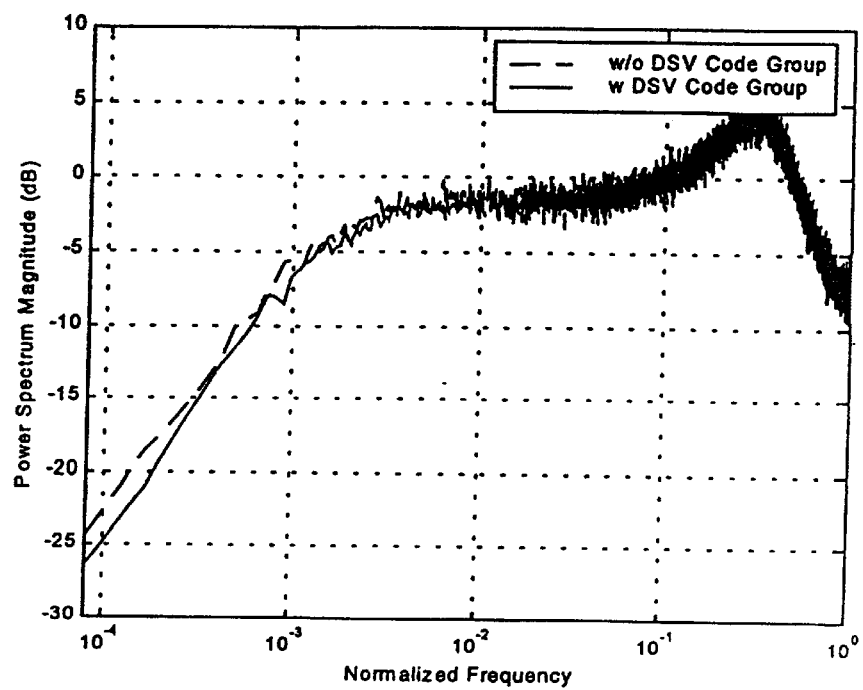
FIG. 20 illustrates a DC suppression effect of the DSV code group in the (1, 8, 8, 12) code by using only the main conversion tables of FIGS. 15A through 16.

FIG. 20 illustrates that DC suppression capability when a DSV code group is prepared separately and used (represented by a solid line), and can be expected to have additional suppression effect of about 2 dB compared to DC suppression capability when a DSV code group is not used (represented by a dotted line).

Figure 21:
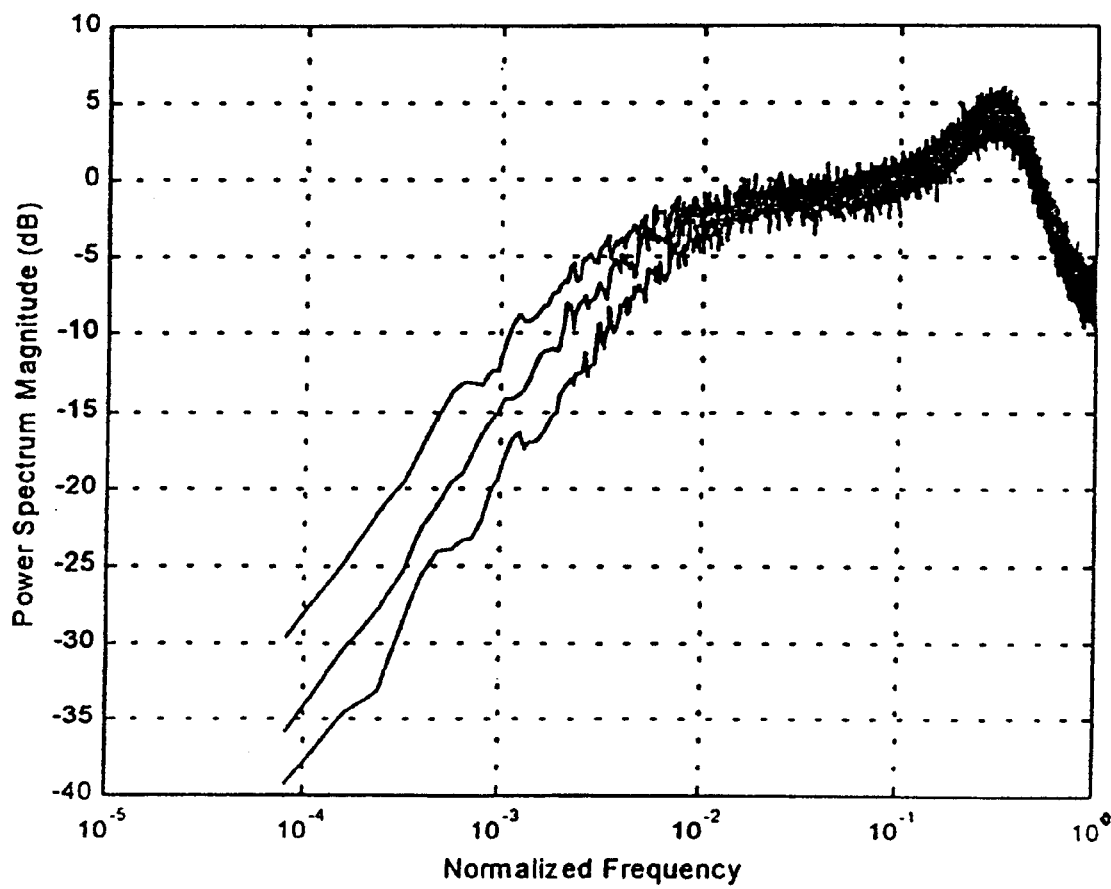
FIG. 21 illustrates a DC suppression effect when merge bits for DSV control are added at the (1, 8, 8, 12) code using the main conversion tables and the sub conversion table of FIGS. 15A through 17E.

FIG. 21 illustrates the result of a computer simulation of the DC performance of a code word according to the frequency of DSV control (the frequency of usage of the sub conversion table for DSV of FIGS. 17A through 17E) when random data is input. Shown from top to bottom are the power spectrum when the sub conversion table for DSV control is used once for every 8 code words; the power spectrum when the sub conversion table for DSV control is used once for every 4 code words; and the power spectrum when the sub conversion table for DSV control is used once for every 2 code words. As shown in FIG. 21, the low-frequency component of a code is decreased but the recording density of a code is lowered, as the frequency of usage of the sub conversion table for DSV control of FIGS. 17A through 17E is higher.

Next, a modulation method and a demodulation method of the (1, 8, 8, 12) code using the code conversion tables divided into code groups of FIGS. 7A through 9E, which are generated by the method of FIGS. 5A through 5B, and the code conversion table divided into code groups of FIGS. 15A through 17E, which is generated by the method of FIGS. 14A and 14B, will now be described.

Figure 22A:
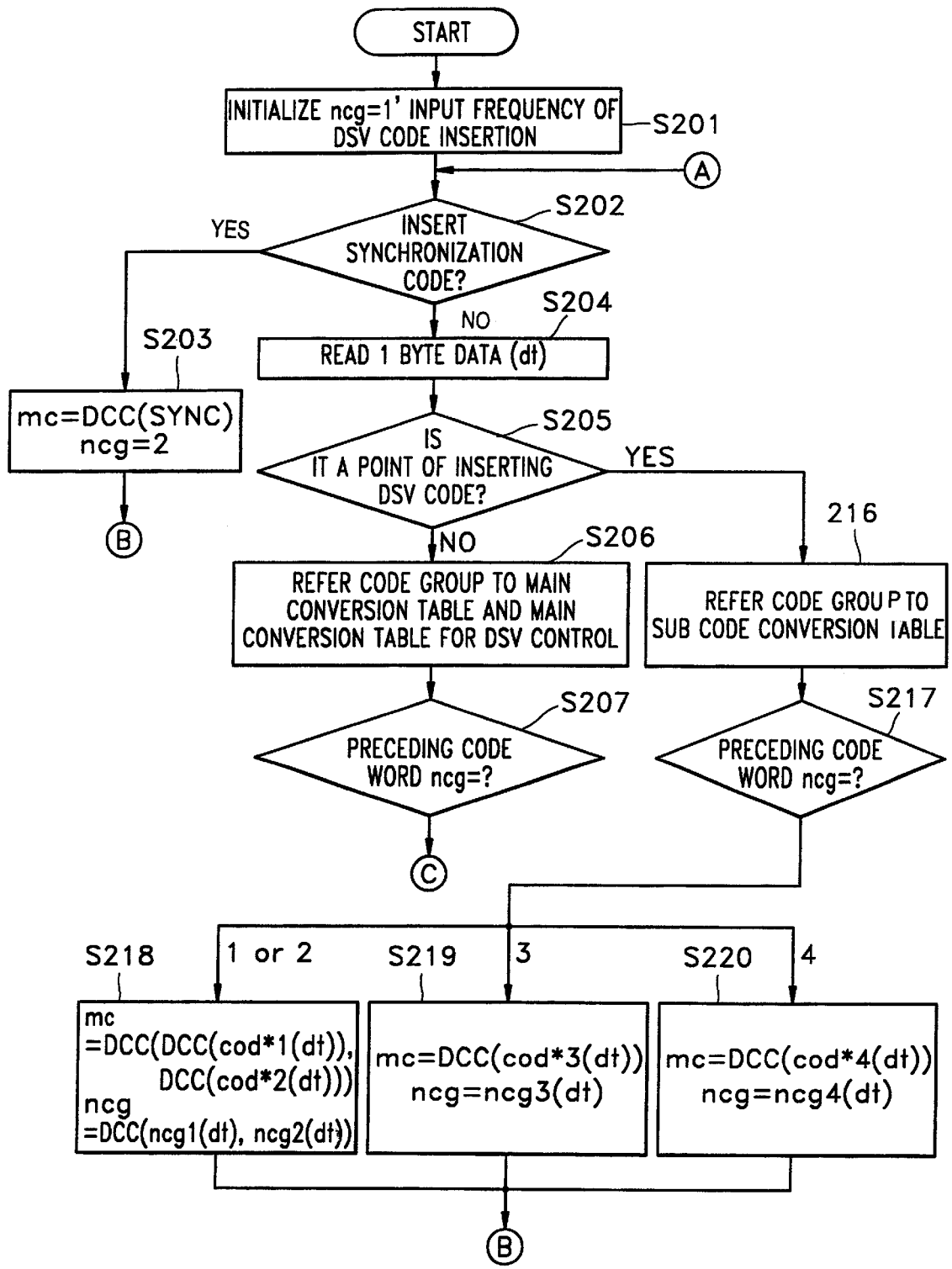
FIGS. 22A and 22B are a flowchart for describing an embodiment of a method of modulating the (1, 8, 8, 12) code.
Figure 22B:
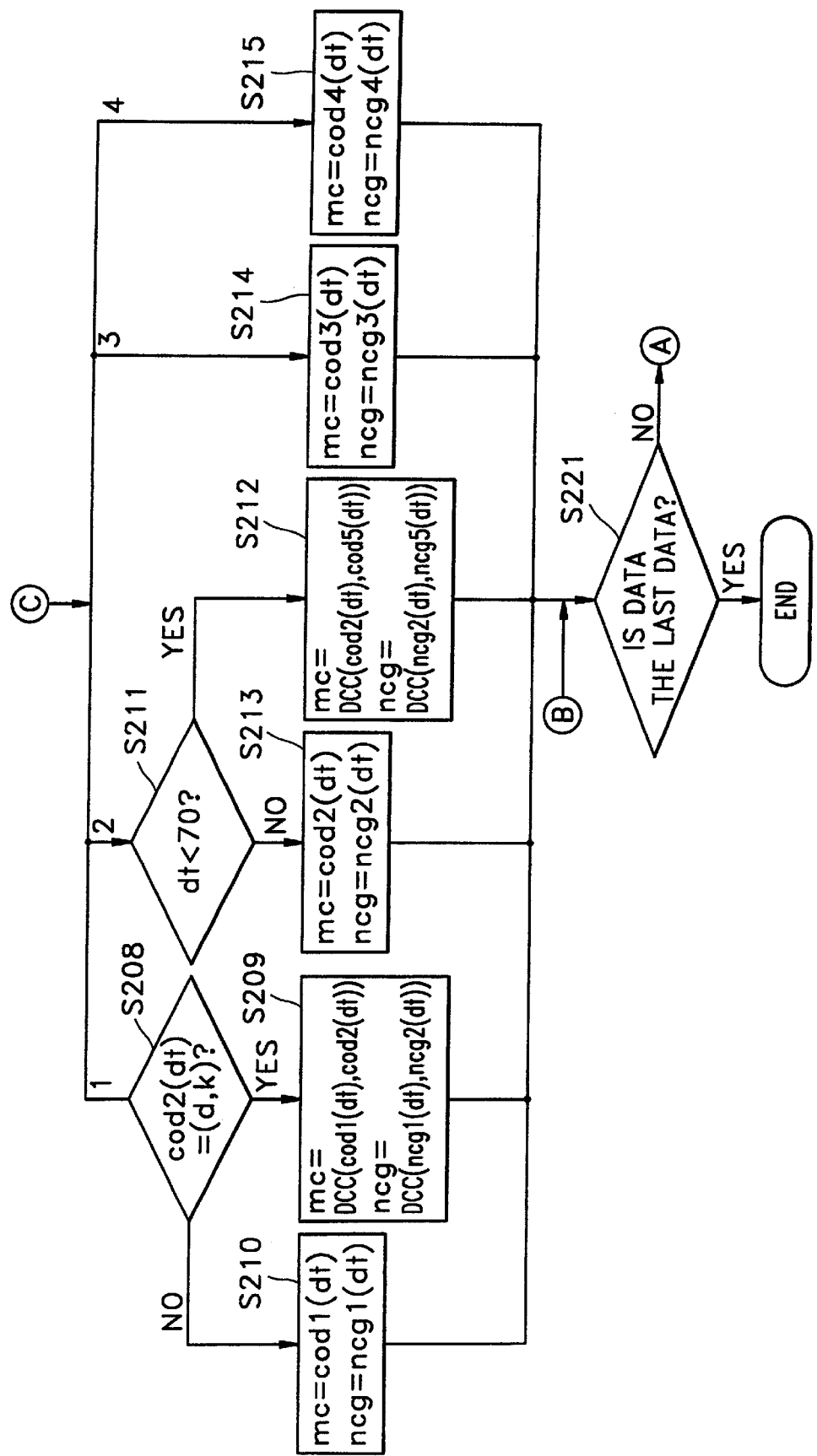

FIGS. 22A and 22B are a flowchart of an embodiment of a method of modulating an RLL code represented by the (1, 8, 8, 12) code according to the present invention, and will be described referring to FIGS. 7A through 9E.

First, ncg is initialized to "1", and frequency numbers of DSV code insertion are set in step S201.

Here, as for the meaning of the frequency numbers, "0" means that code words for DSV control are not used, that is, the sub conversion table for DSV control of FIGS. 9A through 9E is not used. "1" means that the DSV control bit is inserted in every code word, and in this case, encoding is carried out by using the sub conversion table for DSV control without using the main conversion tables of FIGS. 7A through 8. "2" means that the sub conversion table for DSV control is used once for every two code words, and in this case, encoding is carried out by using alternately the main conversion tables and the sub conversion table for DSV control. "4" means that the sub conversion table for DSV control is used once for every four code words.

Undoubtedly, when the frequency of usage of the sub conversion table for DSV control is higher, redundancy in code words increases, which causes disadvantage though it is advantageous in DSV control.

After the ncg is initialized to "1" and the frequency number of DSV code insertion are input in the step S201, it is determined whether a synchronization code is inserted in step S202. Examples of synchronization code words are shown in FIG. 23.

FIG. 23 illustrates 24-bit synchronization code words which can be used in modulating (1, 8, 8, 12) by using the code conversion tables of FIGS. 7A through 9E. For the synchronization code words, a case when ncg points out the MCG1 and the DCG2 is distinguished from a case when ncg points out the MCG2 and the DCG1. The synchronization code words are allocated in order that the synchronization code words used when the ncg points out the MCG1 and DCG2 have the opposite CSV signs compared to the synchronization code words used when ncg points out the MCG2 and DCG1, in order to select synchronization code words which are advantageous for DSV control.

FIG. 24 illustrates synchronization code words which can be used in modulation when the code conversion tables of FIGS. 15A through 17E are used. A case when the ncg points out the MCG1 and the DCG1 is distinguished from a case when the ncg points out the MCG2 and the DCG2. The synchronization code words are allocated in order that the synchronization code words used when ncg points out the MCG1 and DCG1 have the opposite CSV signs with respect to the synchronization code words used when ncg points out the MCG1 and DCG2, in order to select synchronization code words which are advantageous for DSV control.

In the meantime, if the result of the step 202 in FIG. 22A indicates a synchronization code word insertion point, a synchronization code word insertion routine, in which a synchronization code word advantageous for DC suppression is selected, is performed in step S203, and whether or not data is the last one is determined in step S221. If it is determined that data is not the last data, the step S202 for determining whether to insert a synchronization code word is performed in the step S202. In FIGS. 22A and 22B, mc means a code word to be modulated, and DCC means to select which is advantageous to DC control.

A rule that a code word which follows a synchronization code word must be selected in a predetermined code word group is required. Therefore, in an embodiment of the present invention, the ncg which points out a code word following a synchronization code word is 2, and a code word following a synchronization code word is selected in the MCG2.

If the result of the step 202 indicates that it is not a synchronization code word insertion point, input data is read in units of 1 byte in step S204. Then it is determined whether there is a DSV code insertion point in step S205, and if the result indicates that it is not a DSV code insertion point, the main conversion tables of FIGS. 7A through 8 are referred to a code group in step S206.

A modulated code word corresponding to the read 1 byte is selected in the code group corresponding to the ncg pointed out by the preceding code word in step S207. But, for DC suppression, two conversion code groups can be referred to when the ncg is 1 or 2.

First, when the ncg of the preceding code word is 1, a code word to be modulated can be selected by referring to both the MCG1 and the MCG2 when the preceding code word is not duplicated and the EZ of the preceding code word satisfies $1 \leq EZ \leq 3$, or the (1, 8) run length constraint is not violated when the EZ of the preceding code word satisfies EZ>3 in steps S208 and S209. At this time, the selection criterion of a code group is a code group which includes a code word advantageous to DC control. Therefore, an mc is selected from one that is advantageous to DC control between the MCG1 and the MCG2 and the ncg is updated with an ncg pointed out by the code word in the selected code group in the step S209.

Here, when a code word whose EZ value satisfies $1 \leq EZ \leq 3$ is to be duplicated, the code word is not duplicated if EZ=1 and the value of the upper significant 4 bits is 8 (1000b) or 9 (1001b), and ncg (=1) is generated in the manner, in which not the DCG1 or the DCG2, but the MCG1 or MCG2 is the code group which includes a following code word in order to control DSV effectively.

In the meantime, the ncg of the preceding code word is 1 and the code word in the MCG2 does not satisfy the (1, 8) run length, mc is selected in the MCG1, and the ncg is updated with the ncg pointed out by the code word selected in step S210.

If the ncg of the preceding code word is 2, the EZ of the code word is EZ=0. In this case, if the read data (dt) is less than 70, mc can be selected from one of the MCG2 and the DSV code group, and the ncg is updated with the ncg pointed out by the selected code word in steps S211 and S212. At this time, the selection criterion of a code group is a code group which is advantageous to DC suppression. If the read data (dt) is equal to or more than 70, mc is selected from the MCG2 and the ncg is updated with the ncg pointed out by the selected code word in step S213.

When the ncg of the preceding code word is 3 or 4, if the EZ of the preceding code word is $1 \leq EZ \leq 3$ and the preceding code word has a duplicate code word, the next code word is selected from one of the DCG1 and the DCG2, and the ncg is updated with the ncg pointed out by the selected code word in steps S214 and S215, respectively.

In FIG. 22B, cod1(dt) means that a code word to be modulated corresponding to input data is selected from the MCG1; cod2(dt) means that a code word to be modulated corresponding to input data is selected from the MCG2; cod3(dt) means that a code word to be modulated corresponding to input data is selected from the DCG1; cod4(dt) means that a code word to be modulated corresponding to input data is selected from the DCG2; and cod5(dt) means that a code word to be modulated corresponding to input data is selected from the DSV code group.

In the meantime, if the result of the step S205 indicates that it is at a DSV code inserting point, encoding of data is carried out by using the sub conversion table for DSV control (FIGS. 9A through 9E) without using the main conversion table in step S216. Here, the tables of FIGS. 12A through 13C can be used as a sub conversion table for DSV control. The ncg of the preceding code word is checked in step S217. If the ncg points out "1" or "2", both the MCG1 and the MCG2 in the sub conversion table for DSV control can be used, and in the MCG1 and the MCG2 of the sub conversion table for DSV control a code word where x exists can use x as both "0" and "1". Therefore, final code selection is made from DCC(DCC(cod*1(dt))), DCC(DCC(cod*2(dt)) in step S218.

In FIG. 22A, cod*1(dt) means that a code word is selected from the MCG1 of the sub conversion table for DSV; cod*2(dt) means that a code word is selected from the MCG2 of the sub conversion table for DSV; cod*3(dt) means that a code word is selected from the DCG1 of the sub conversion table for DSV; and cod*4(dt) means that a code word is selected from the DCG2 of the sub conversion table for DSV. The mark * means that a plurality of code words can be generated in a corresponding code group. In addition, DCC(cod*1(dt)) means that since an x (don't care) bit exists in the MSB of a code word and both "0" and "1" can be used for the bit when the sub conversion table of FIGS. 9A through 9E is used, a code word advantageous for DC suppression is selected.

When the ncg is 3 or 4, DSV control is impossible if a DSV control bit is not inserted (when the main conversion table is used), while DSV control is possible if a DSV control bit is inserted (when the sub conversion table for DSV control whose MSB is x is used). Therefore, when the ncg of the preceding code word points out "3" and "4", the DCG1 and the DCG2 of the sub conversion table for DSV are selected respectively, and "0" or "1" is selected for the don't care bit MSB to have better DSV control. Accordingly, when the ncg points out "3" and "4", final code selection is made by selecting an advantageous code word in DCC (cod*3(dt)) and DCC(cod*4(dt)), respectively.

FIG. 25 illustrates a table in which the code groups pointed out by ncgs are divided into two cases; at a point which is not a point of inserting a code word for DSV control and at a point of inserting a code word for DSV control. At a point which is not a point of inserting a code word for DSV control, the main conversion tables of FIGS. 7A through 8 are used during modulation and demodulation, while at a point of inserting a code word for DSV control, the sub conversion table for DSV control (for example, FIGS. 9A through 9E) is used during modulation and demodulation.

That is, at a point which is not a point of inserting a code word for DSV control, the code group which includes the next code word is the MCG1 or the MCG2 if the ncg is 1; the MCG2 or the DSV code group if the ncg is 2; the DCG1 if the ncg is 3; and the DCG2 if the ncg is 4.

At a point of inserting a code word for DSV control, the same code group as at a point which is not a point of inserting code word for DSV control is selected if the ncg is 1, 3, or 4. But, if the ncg is 2, the code group which includes the next code word is the MCG1 or the MCG2.

Figure 26A:
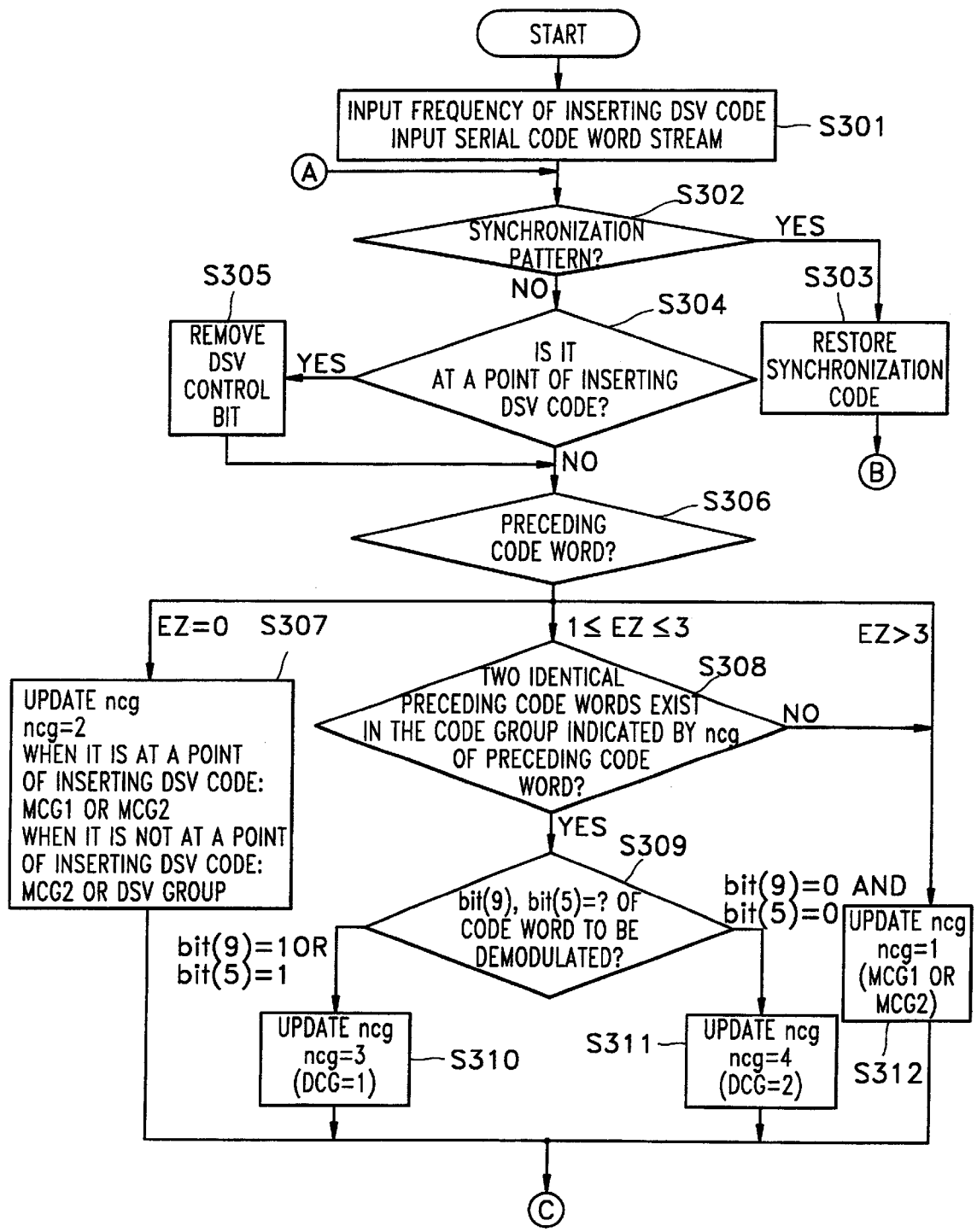
FIGS. 26A and 26B are a flowchart for describing an embodiment of a method of demodulating the (1, 8, 8, 12) code, in which the code modulated by the method of FIGS. 22A and 22B using the code conversion tables of FIGS. 7A through 9E is demodulated into the original data.
Figure 26B:
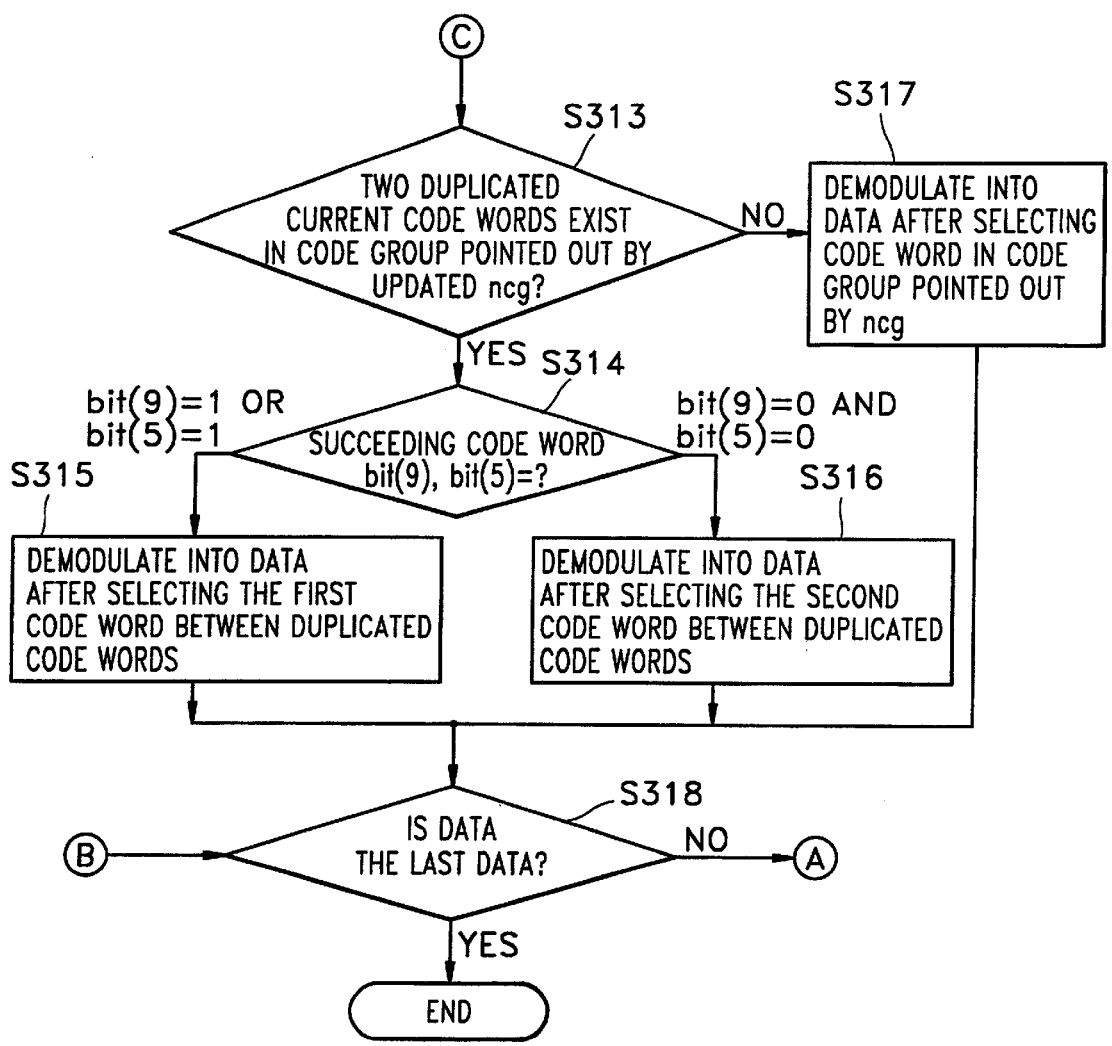

FIGS. 26A and 26B are a flowchart for describing an embodiment of the method, according to the present invention, for demodulating the (1, 8, 8, 12) code using the code conversion tables of FIGS. 7A through 9E, and will now be described with reference to a demodulation apparatus of FIG. 27 having shift registers SR2, SR1, SR0, and SR denoted by 102, 104, 106 and 108 respectively, a synchronization detection and protection unit 110, a $1^{st}$ bit checking unit 112, an ncg extracting and changing unit 114, a detector 116, a $2^{nd}$ bit checking unit 118, a logic circuit 120, a $3^{rd}$ bit checking unit 122, and a demodulation code table 124.

Figure 27:
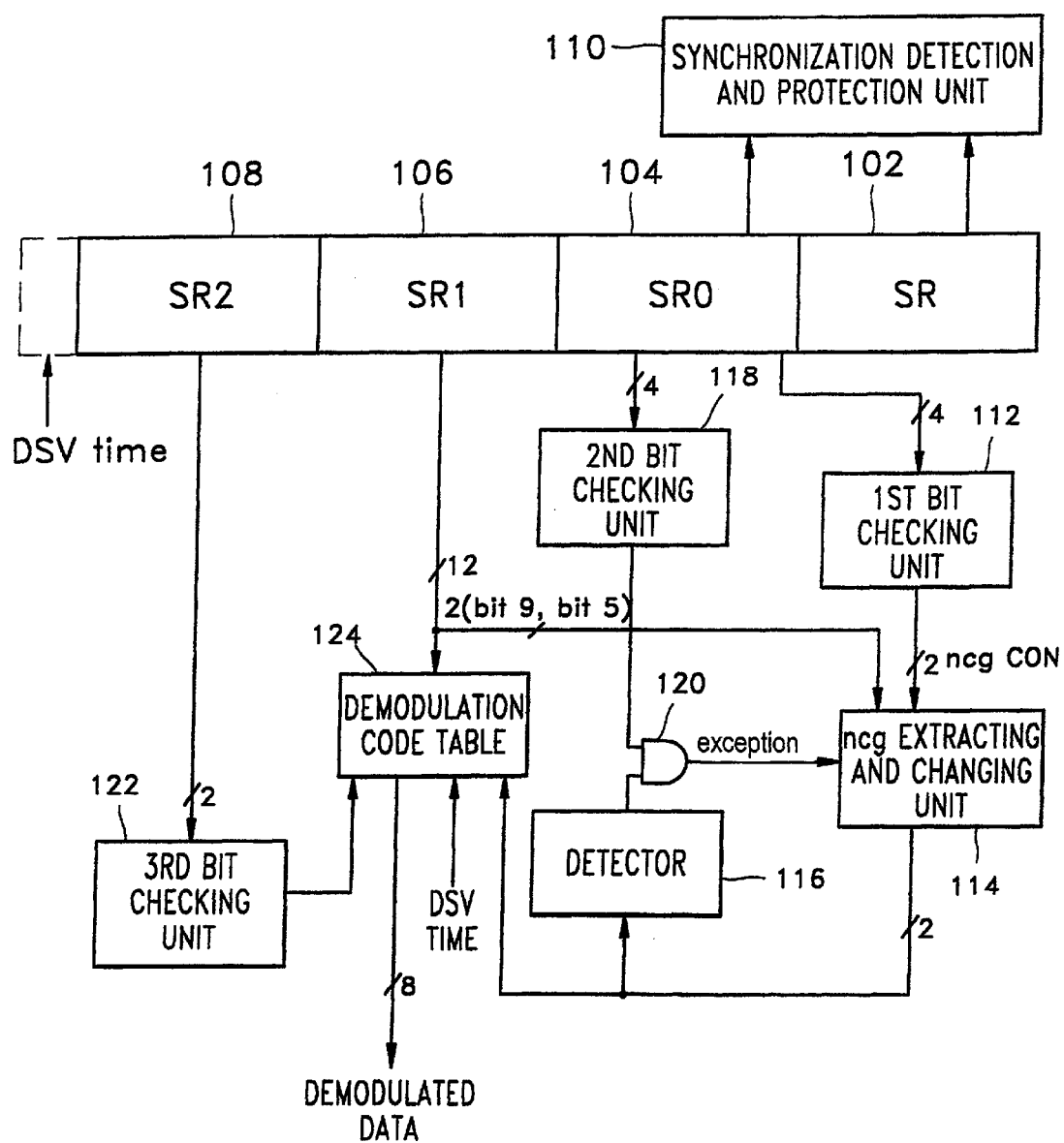
FIG. 27 is a circuit diagram of an embodiment of an apparatus for demodulating the (1, 8, 8, 12) code, according to the present invention, the circuit implemented according to the demodulation method of FIGS. 26A and 26B.

The frequency number of DSV code insertion is input, and a code word stream which is input serially is shifted and stored in the shift registers 108, 106, 104, and 102 of FIG. 27 in step S301.

The synchronization detection and protection unit 110 detects a synchronization code by decoding the 24-bit synchronization pattern, as illustrated in FIG. 23, supplied from the shift registers 102 and 104. When a synchronization pattern is detected by the synchronization detection and protection unit 110 in step S302, a synchronization restoration routine for synchronization protection and insertion is carried out, and the ncg following the synchronization pattern is updated with 2 in step S303, and it is determined whether data is the last data in step S318. That is, when the synchronization pattern detected in the synchronization detection and protection unit 110 is a normally detected synchronization pattern, the synchronization pattern is used as it is, and otherwise a pseudo synchronization pattern supplied by the synchronization detection and protection unit 110 is inserted in the step S303.

The way to find an ncg indicating a code group which includes a code word supplied from the shift register 106 which stores a code word to be demodulated will now be described.

After determining whether or not a code word stored in the shift registers 102 and 104 is a synchronization pattern in the step S302, it is determined whether at a point of inserting a DSV code or not. At a point of inserting a DSV code, a DSV control bit which is allocated at the most significant bit in a code word is removed when the sub conversion table for DSV control of FIGS. 9A through 9E is used in step S305. Here, when the sub conversion tables for DSV control of FIGS. 12A through 13C are used, the DSV control bit is not removed and demodulation is carried out in the same manner as in the steps S306 through S318 for demodulating modulated codes.

Here, a DSV control signal (DSV time) supplied to the shift register 108 and the demodulation code table 124 is enabled when a counted number becomes the same value as the frequency of DSV code insertion, which is input in the step S301, after counting starts after a synchronization pattern is detected. The counting operation is performed by a system controller (not shown) which generates a DSV control signal. When the sub conversion table for DSV control of FIGS. 9A through 9E is used, since the MSB of a code word is a DSV control bit and the remaining 12 bits are the same as in the main conversion table of FIGS. 7A through 7E, the main conversion table of FIGS. 7A through 7E can be used after removing the MSBs. That is, a code word bit stored in the highest bit (bit12) of the shift register 108 is removed when a DSV time signal is enabled.

At a point which is not a point of inserting DSV code in the step S304, the EZ value of the preceding code word supplied from the shift register 104 is checked in step S306, and when the EZ value is 0, the ncg is updated with 2 in step S307.

When EZ satisifies $1 \leq EZ \leq 3$, whether two duplicated code words exist in the code group pointed out by the ncg of the preceding code word is checked in step S308.

If two duplicated code words the same as the preceding code word stored in the shift register 104 exist in the code group pointed out by the ncg of the preceding code word in the step S308, the $9^{th}$ bit (bit9) and the $5^{th}$ bit (bit5) in the current code word to be demodulated in the shift register 106 are checked in step S309. If one of the two bits is a "1" bit, the ncg is updated with 3, and if both are "0", the ncg is updated with 4 in steps S310 and S311.

In the step S308, if the EZ of the preceding code word satisfies $1 \leq EZ \leq 3$ and there is no duplicated code word in the code group pointed out by the ncg of the preceding code, or if the EZ satisfies EZ>3, the ncg is updated with "1" in step S312.

That is, when the $1^{st}$ bit checking unit 112 checks the lower significant 4 bits of the preceding code word in the shift register 104, the ncg CON signal is output as "01b" (meaning that the ncg is 2) if the EZ value is "0" (when bit 0 is "1"); the ncg CON signal is output as "10b" (meaning that the ncg is 3 or 4) if the EZ value satisfies $1 \leq EZ \leq 3$; and ncg CON signal is output as "00b" (meaning that the ncg is "1") if the EZ value is equal to or greater than 4.

In the meantime, the $2^{nd}$ bit checking unit 118 checks the upper significant 4 bits (bit 11~bit 8) of the preceding code word supplied from the shift register SR0 104, and supplies a logic "high" signal to the logic circuit 120 if "1000b" or "1001b" is found. The detector 116, which includes a delay unit, supplies a logic "high" signal to the logic circuit 120 when "00b" is detected in outputs from the ncg extracting and changing unit 114.

The logic circuit 120 supplies an exception signal to the ncg extracting and changing unit 114 by enabling the exception signal if the upper significant 4 bit value of the shift register 104 is "1000b" or "1001b" and the ncg pointed out by the preceding code word stored in the shift register 104, detected by the detector 116, is "00b" (meaning that the ncg is 1). The ncg extracting and changing unit 114 changes the ncg CON signal "10b" (meaning that the ncg is 3 or 4) into "00b" and outputs "00b" according to the enabled exception signal, while outputting the ncg CON signal without changing to the demodulation code table 124 if the exception signal from the logic circuit 120 is disabled, or if the ncg CON signal is not "10b ".

But, if the ncg CON signal is "10b", the ncg extracting and changing unit 114 checks the $9^{th}$ bit and the $5^{th}$ bit in the code word stored in the shift register 106 and outputs "10b" (meaning that the ncg is 3) to the demodulation code table 124 if one of the two bits is "1", and outputs "11b" (meaning that the ncg is 4) to the demodulation code table 124 if both bits are "0".

The reason why the ncg extracting and changing unit 114 changes the ncg CON signal from "10b" to "00b" is to obtain "1" (ncg CON=00b), which makes the ncg of a code word which is not duplicated be the MCG1 or the MCG2, if the EZ is 1 and the value of the upper significant 4 bits is 8 (1000b) or 9 (1001b) when a code word whose EZ satisfies $1 \leq EZ \leq 3$ is being duplicated.

Next, a process for demodulating the output of the shift register 106 which stores a code word to be demodulated will now be described.

It is checked whether or not two code words exist in the code group indicated by the updated ncg in step S313. If two duplicated code words exist in the step S313, the $3^{rd}$ bit checking unit 122 checks the $9^{th}$ bit (bit 9) and the $5^{th}$ bit (bit 5) of the next code word supplied from the shift register 108 in step S314. If one of the two bits is "1", it is determined that the current code word to be demodulated supplied from the shift register 106 is the first code word of the two duplicated code words, and the current code word is demodulated into the original data in step S315.

If both the $9^{th}$ bit (bit 9) and the $5^{th}$ bit (bit 5) of the next code word supplied from the shift register 108 are "0" in the step S314, it is determined that the current code word to be demodulated supplied from the shift register 106 is the second code word in the two duplicated code words, and the current code word is demodulated into the orginal data in step S316.

If only one code word of the code group pointed out by the updated ncg in the step S313 is the same as the current code word supplied from the shift register 106, a code word in the code group pointed out by the updated ncg is demodulated into the original data corresponding to the current code word to be demodulated supplied from the shift register 106 in step S317.

As illustrated in FIG. 25, at a point which is not a point of inserting a code word for DSV control, a code group which includes the next code word is the MCG1 or the MCG2 if the ncg is 1; the MCG2 or the DSV code group if the ncg is 2; the DCG1 if the ncg is 3; and the DCG2 if the ncg is 4. At a point of inserting a code word for DSV control, a code group which includes the next code word is the MCG1 or the MCG2 if the ncg is 1 or 2; the DCG1 if the ncg is 3; and the DCG2 if the ncg is 4.

For example, if a DSV time signal is enabled in the demodulation code table 124 (meaning a point of inserting a code word for DSV control) and the signal supplied from the ncg extracting and changing unit 114 is "00b", selection is performed from one of the MCG1 and the MCG2.

Figure 28A:
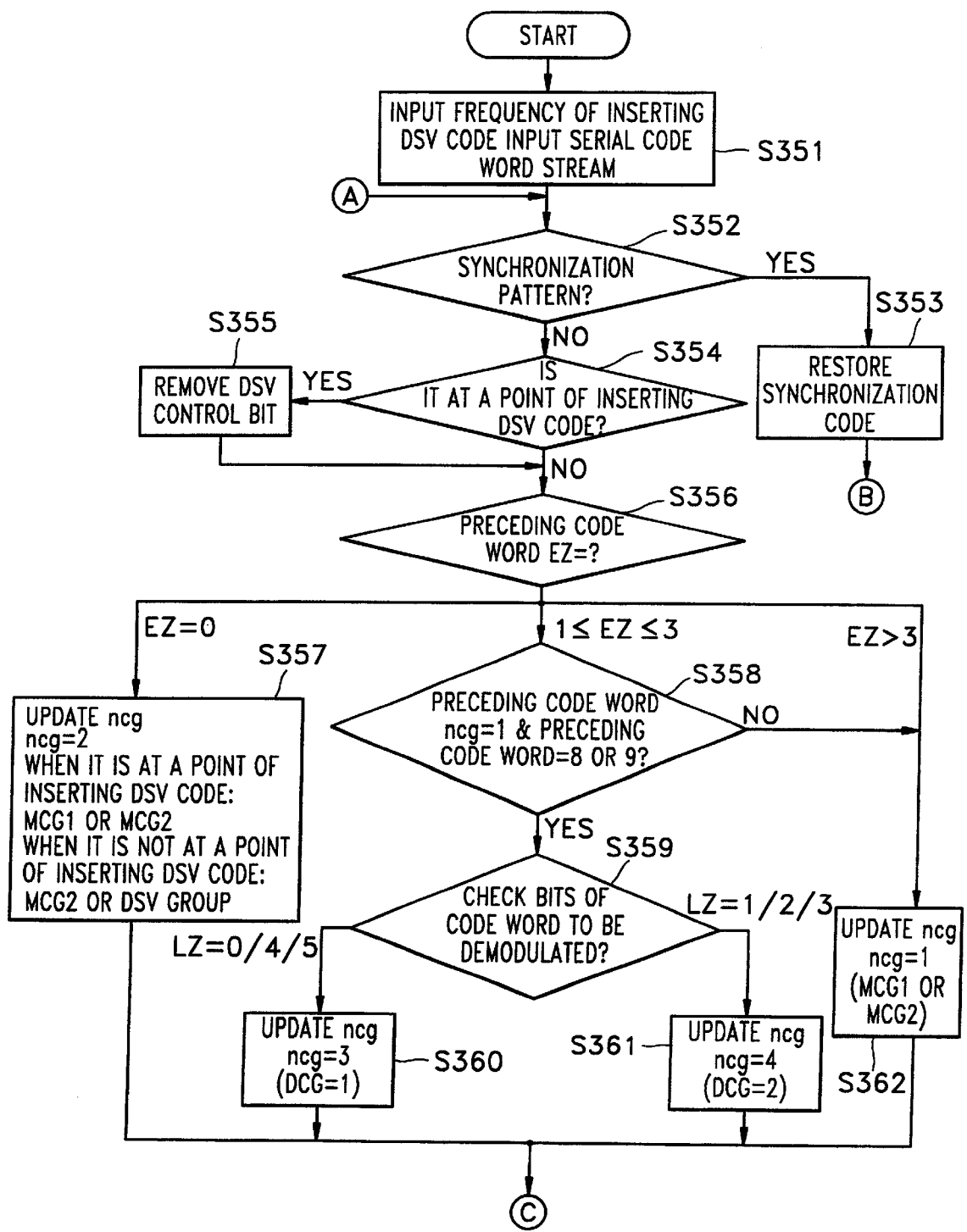
FIGS. 28A and 28B are a flowchart of another embodiment of the method of demodulating the (1, 8, 8, 12) code in which the code modulated by the method of FIG. 22A and 22B using the code conversion tables of FIGS. 15A through 17E is demodulated into the original data.
Figure 28B:
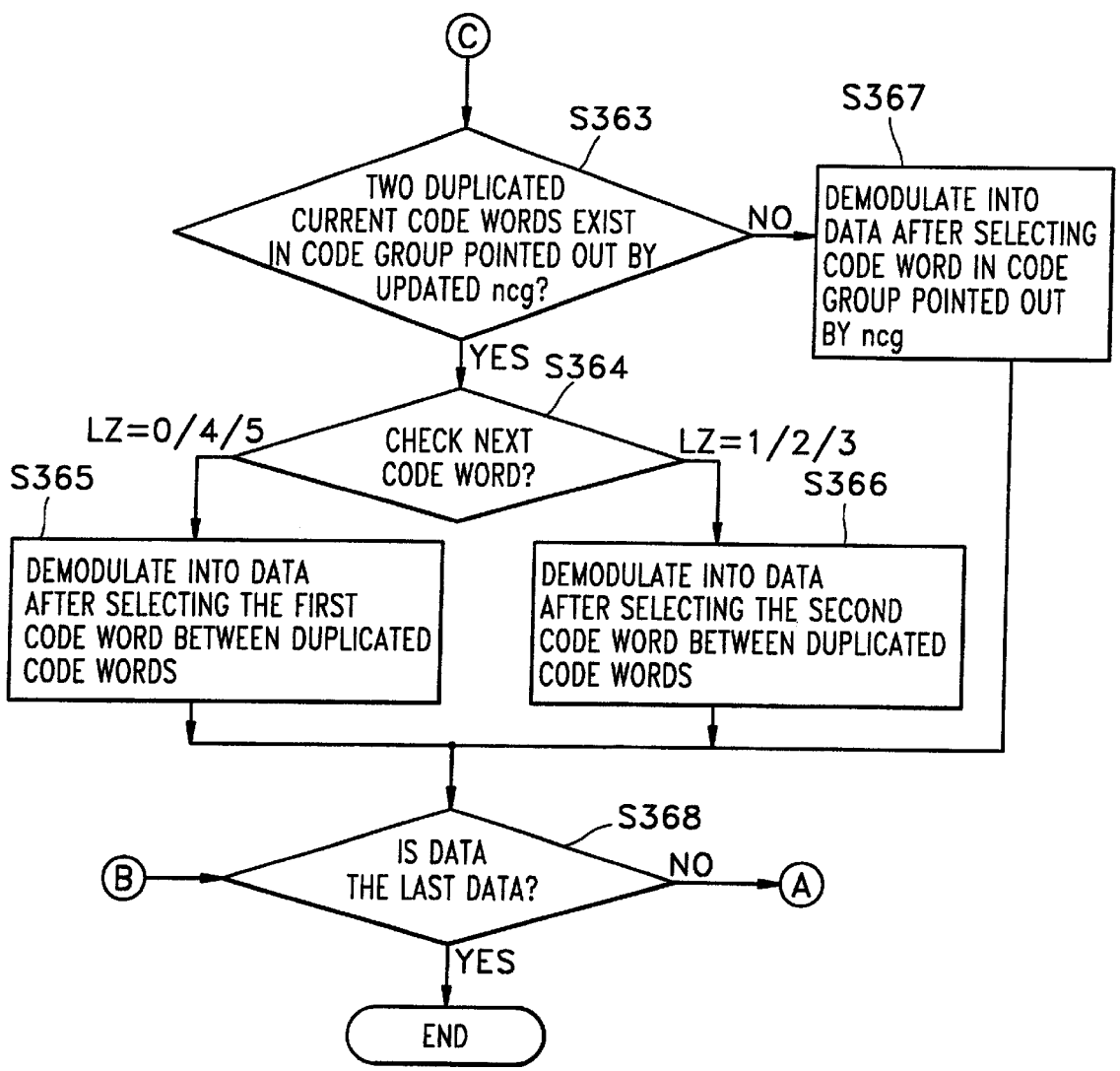

Regardless of the DSV time signal, the demodulation code table 124 selects from the MCG1 or the MCG2 if the signal supplied from the ncg extracting and changing unit 114 is "00b"; from the MCG2 or the DSV code group in the signal is "01b"; from the DCG1 if the signal is "10b"; and from the DCG2 if the signal is "11b". But, if the signal supplied from the ncg extracting and changing unit 114 is "10b" or "11b", the $9^{th}$ bit (bit 9) and the $5^{th}$ bit (bit 5) of the next code word in the shift register 108 are checked, and the first code word of the two duplicated code words is selected when there is "1" in the $9^{th}$ and $5^{th}$ bits, and otherwise the second code word of the two duplicated code words is selected. In this manner, the original 8-bit data is restored from the demodulation code table 124 according to the 12 bits in a code word stored in the shift register 106. FIGS. 28A and 28B are a flowchart for describing another embodiment of the method, according to the present invention, for demodulating the (1, 8, 8, 12) code using the code conversion tables of FIGS. 15A through 17E. Since steps S351~S357, S363, S367, and S368 are the same as steps in FIGS. 26A and 26B, the description thereof will be left out. Steps S358 through S361 and S364 through S366 will now be described.

It is checked whether the preceding code word is included in the MCG1 (ncg=1) and whether the upper significant 4 bits is 8 (1000b) or 9 (1001b) in step S358. All bits of a code word to be demodulated are checked in step S359. If the LZ of the code word to be demodulated is 0, 4, or 5, the ncg is updated with 3 in step S360, and if the LZ of the code word to be demodulated is 1, 2, or 3, the ncg is updated with 4 in step S361.

Bits of the succeeding code word are checked in step S364. If the LZ of the succeeding code word is 0, 4, or 5, it is determined that the current code word to be demodulated is the first code word in the duplicated code words, and the corresponding original data is demodulated from the first code word in step S365. If the LZ of the succeeding code word is 1, 2, or 3, it is determined that the current code word to be demodulated is the second code word in the duplicated code words, and the corresponding original data is demodulated from the second code word in step S366.

A synchronization pattern checked in step S352 is a 24-bit synchronization pattern of FIG. 24.

Figure 29:
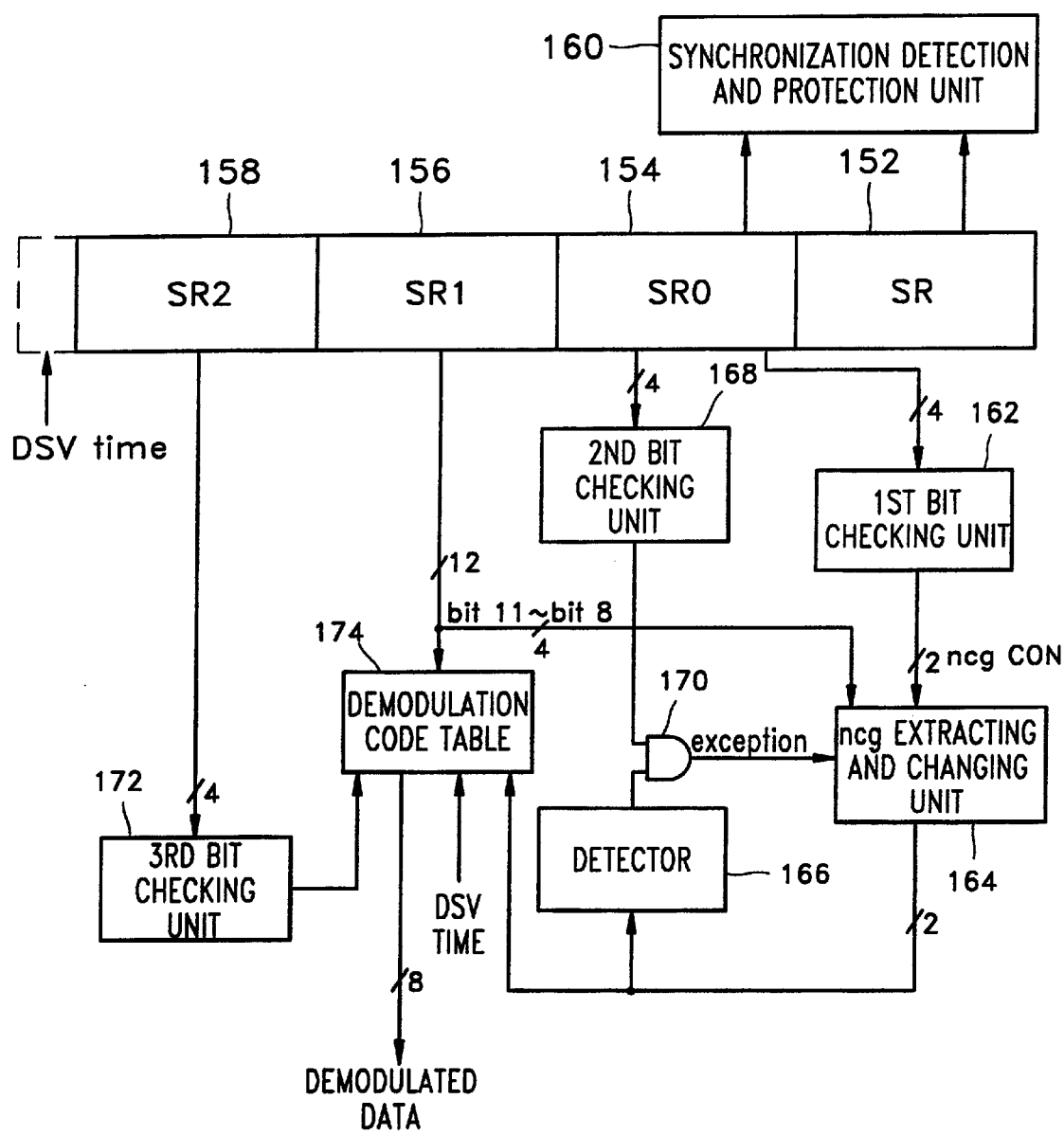
FIG. 29 is a circuit diagram of an embodiment of an apparatus for demodulating the (1, 8, 8, 12) code according to the present invention, the circuit implemented according to the demodulation method of FIGS. 28A and 28B.

FIG. 29 is a demodulation apparatus for performing the demodulation method of FIGS. 28A and 28B. Since the operations of shift registers 152 through 158, a $1^{st}$ bit checking unit 162 and a $2^{nd}$ bit checking unit 168, a detector 166, and a logic circuit 170 are the same as in the demodulation apparatus of FIG. 27, the description thereof will be left out. An ncg extracting and changing unit 164, a $3^{rd}$ bit checking unit 172, and a demodulation code table 174 will now be described.

The ncg extracting and changing unit 164 receives an ncg CON signal supplied from the $1^{st}$ bit checking unit 162. When the EZ value of the lower significant 4 bits in the preceding code word supplied from the shift register 154 is 0 (when bit 0 is 1), the ncg CON signal is "01b" (meaning that the ncg is 2); when the EZ value is between 1 and 3 (when bit 3~bit 0 is 1000b, 0100b, 0010b, or 1010b), the ncg CON signal is "10b" (meaning that the ncg is 3 or 4); and when the EZ value is equal to or more than 4 (when bit3~bit0 is 00b), the ncg CON signal is "00b" (meaning that the ncg is 1).

At this time, when the ncg CON signal is "10b", the ncg extracting and changing unit 164 supplies "10b" which indicates that ncg=3, to the demodulation code table 174 if the value of the upper significant 4 bits of the current code word supplied from the shift register 156 is 10xxb (LZ=0) or 0000b (LZ=4, or 5); and supplies "11b", which indicates that ncg=4, to the demodulation code table 174 if the value of the upper significant 4 bits of the current code word supplied from the shift register 156 is 010xb (LZ=1), 0010b (LZ=2) or 0001b (LZ=3).

In the meantime when the value of the upper significant 4 bits (bit 11~bit 8) in the preceding code word which is checked by the $2^{nd}$ bit checking unit 168 is "8" (=1000b) or "9" (=10001b), an exception signal is enabled if the previous ncg CON signal is "00b" (when the ncg of the preceding code word stored in the shift register 104 is 1). At this time, if the ncg CON signal supplied from the $1^{st}$ bit checking unit 162 is "10b", the ncg CON signal is changed into "00b" and "00b" is output. If the exception signal is disabled or the ncg CON is not "10b", the ncg CON signal is supplied to the demodulation code table 174 without change.

In the demodulation code table 174, the MCG2 or the DSV code group is selected when the DSV time signal is disabled and the signal supplied from the ncg extracting and changing unit 164 is "01b", and the MCG1 or the MCG2 is selected when the DSV time signal is enabled (meaning that it is at a point of inserting a code word for DSV control) and the signal supplied from the ncg extracting and changing unit 164 is "01b".

Regardless of the DSV time signal, the MCG1 or the MCG2 is selected when the signal supplied from the ncg extracting and changing unit 164 is "00b"; the DCG1 is selected when the signal is "10b"; and the DCG2 is selected when the signal is "11b". But, when the signal supplied from the ncg extracting and changing unit 164 is "10b" or "11b", the $3^{rd}$ bit checking unit 172 is referred. When the value of the upper significant 4 bits (bit 11~bit 8) in the succeeding code word which is checked by the $3^{rd}$ bit checking unit 172 is "10xxb" or "0000b", the first code word of duplicated code words is selected, and when the value is "0100b", "0101b", "0010b", or "0001b", the second code word of duplicated code words is selected. By doing so, using the demodulation code table 174 according to the 12 bits of the current code word supplied from the shift register 156, a code word is demodulated and the original 8-bit data is restored.

As described above, according to the present invention, some of the code words which are already used in the main code group are used for the DSV code group for DC suppression, and the DSV code group is generated using the characteristics (for example, the CSV and INV parameters) of the code words of the main code group to the maximum, and thus reduces the number of code word bits to improve the recording density of an optical disk and increases DC suppression capability.

By using the main code conversion table at a point which is not a point of a predetermined DSV control, or by using the sub code conversion table for DSV control at a point of a predetermined DSV control, the present invention has an effect of reducing the number of code word bits.

By using the sub conversion table for DSV control which is used at a point of a predetermined DSV control after forming the sub conversion table in order that the sub conversion table has code words separate from the main conversion table and the characteristics of code words in the main conversion table, that is, the signs of the CSV which indicates the DC value in a code word and the characteristic of the INV parameter which predicts the transition direction of the succeeding code word are maximized, the present invention has an effect of effectual DC suppression. At this time, by selecting the code group which includes the succeeding code word as the same code group, it becomes appropriate to be used in a code stream selection algorithm of a look-ahead method.

In addition, the present invention enables DC suppression which is not possible in the (1, 7, 2, 3) code, and enables additional DC suppression by using DSV control bits. Thanks to these effects, code noise flowing into a servo system can be greatly reduced, and the problems in digitizing RF signals output from a pick-up are removed, and thus reliability of an entire recording/reproducing system is greatly increased.

Although a preferred embodiment of the present invention has been shown and described, it would be appreciated by those skilled in the art that changes may be made in this embodiment without departing from the principles and spirit of the invention, the scope of which is defined in the claims and their equivalents.

What is claimed is:

1. An allocating method of allocating code groups grouped by characteristics of code words after generating a run length limited (RLL) code which is represented by (d, k, m, n), wherein d indicates the minimum run length, k indicates the maximum run length, m indicates the length of data bits, and n indicates the length of code word bits, the allocating method comprising the:

allocating a pair of the code groups for controlling direct current (DC) suppression in a code word stream; and allocating code words to the pair of code groups, the code words corresponding to a same source code, so that corresponding ones of the code words of each of the code groups have opposite signs of a $1^{st}$ parameter, a code word sum value (CSV), which represents a DC value in the code word and opposite characteristics of a $2^{nd}$ parameter INV which predicts a transition direction of a digital sum value (DSV) of a succeeding code word.

2. The allocating method of claim 1, wherein the allocating of the code words longuises:

arranging the code words in each of the pair of code groups, the code words corresponding to the same source code, so that the code words have opposite signs of the $1^{st}$ parameter and opposite characteristics of the $2^{nd}$ parameter; and making the corresponding code words of each of the code groups select the same code group as a code group which includes the succeeding code word so that the digital sum value (DSV) direction of the code stream are opposite to each other with respect to identical source codes in the pair of code groups.

3. The allocating method of claim 1, wherein the arranging of the code words comprises:

determining a reference code group; and averaging the code words in the reference code group in the pair of code groups so that an absolute value of the $1^{st}$ parameters (CSVs) are in descending order.

4. The allocating method of claim 3, wherein the arranging of the comprises:

arranging the code words of the reference code group in the pair of code groups and code words of a code group which controls DC suppression so that the absolute value of the $1^{st}$ parameters (CSVs) are in descending order and arranging code words corresponding to the same source codes of the reference code group so that the code words have opposite signs of the $1^{st}$ parameter (CSV) and opposite characteristics of the $2^{nd}$ parameter (INV).

5. An allocating method of allocating code groups grouped by the characteristics of code words after generating a run length limited (RLL) code which is represented by (d, k, m, n), wherein d indicates a minimum run length, k indicates the maximum run length, m indicates the length of data bits, and n indicates the length of code word bits, the allocating method comprising:

allocating a pair of code groups so as to control suppression of DC in a code word stream; and allocating code words in the pair of code groups, the code words corresponding to a same source code, so that the code words have the opposite characteristics of a $2^{nd}$ parameter INV which predicts a transition direction of a digital sum value (DSV) of a succeeding code word and the making the code words select the same code group as a code group which includes the succeeding code word so that the DSV direction of the code stream are opposite.

6. An allocating method of allocating code groups grouped by characteristics of code words after generating a run length limited (RLL) code which is represented by (d, k, m, n), wherein d indicates the minimum run length, k indicates the maximum run length, m indicates the length of data bits, and n indicates the length of code word bits, the allocating method comprising:

allocating a main code group defined as one of the code groups which includes a code word following a not-duplicated code word, and a decision code group defined as one of the code groups which includes a code word following a duplicated code word;

allocating the code words of the main code group so that a code word whose lead zero (LZ) number is less than or equal to a main code group division parameter (x) is allocated to a $1^{st}$ main code group, and a code word whose LZ number is greater than the main code group division parameter (x) is allocated to a $2^{nd}$ main code group, and there are no the same code words in the $1^{st}$ main code group and the $2^{nd}$ code group; and allocating the code words of the decision code group so that the decision code group is formed with code words which satisfy that LZ is equal to or less than a difference value of the maximum run length (k) and a code word duplication parameter (y) and the code words are allocated to one of a $1^{st}$ decision code group and a $2^{nd}$ decision code group according to a value of predetermined bits in each code word.

7. The allocating method of claim 6, wherein the allocating of the code words of the decision group comprises allocating the code words which satisfy that $LZ \leq 3$ and a $9^{th}$ bit or a $5^{th}$ bit thereof are "1" to the $1^{st}$ decision code group, and allocating the code words which satisfy that $LZ \leq 3$ and the $9^{th}$ bit and the $5^{th}$ bit thereof are both "0" to the $2^{nd}$ decision code group, and there are no the same code words in the $1^{st}$ decision code group and the $2^{nd}$ decision code group.

8. The allocating method of claim 6, wherein when the $11^{th}$ bit in a code word is referred to as the most significant bit and $0^{th}$ bit in a code word is referred to as the least significant bit, the allocating of the code words of the dedision group comprises allocating the code word to the $1^{st}$ decision of code group if the most significant bit is "1" or the upper significant 4 bits are all "0", that is, if the code word satisfies that the LZ of the upper significant 4 bits is 0, 4, or 5, and allocating the code word to the $2^{nd}$ discussion code group if the code word satisfies that the LZ of the upper significant 4 bits is 1, 2, or 3.

9. The allocating method of claim 6, further comprising allocating a DSV code group which comprises code words extracted from one of the $1^{st}$ and $2^{nd}$ main code groups as a separate code group for suppression of DC in the code stream.

10. The allocating method of claim 9, wherein the allocating of the DSV code group comprises forming the DSV code group so that, though a code word which includes a next code is in the $1^{st}$ main code group, code words which are included in the $2^{nd}$ main code group and have a possibility of not violating the (d, k) run length constraint are extracted, whereas the code words are allocated to have opposite signs of a $1^{st}$ parameter code word sum value (CSV) which represents a direct current (DC) value in the code word and opposite characteristics of a $2^{nd}$ parameter INV which predicts a transition direction of a digital sum value (DSV) of a succeeding code word with respect to the code words which are included in the $1^{st}$ main code group and correspond to the same source codes, and the DSV code group together with the $1^{st}$ code group control DC suppression.

11. The allocating method of claim 9, wherein the allocating of the DSV code group comprises forming the DSV code group so that, though a code word which includes a next code is in the $2^{nd}$ main code group, code words which are included in the $1^{st}$ main code group and have a possibility of not violating the (d, k) run length constraint are extracted, wherein the code words are allocated to the code group for DSV control to have opposite signs of the $1^{st}$ parameter (CSV) and characteristics of the $2^{nd}$ parameter (INV) with respect to the code words which are included in the $2^{nd}$ main code group and correspond to the same source codes, and the DSV code group together with the $2^{nd}$ main code group control DC suppression.

12. The allocating method of claim 11, wherein the forming of the DSV code group comprises forming the DSV code group with the code words which satisfy LZ is 1, and the code words whose number of end zeros is "0" are made to indicate the $2^{nd}$ main code group as a code group which includes the succeeding code word, and allocating the code words to have the opposite signs of the $1^{st}$ parameter (CSV) and the opposite characteristics of the $2^{nd}$ parameter (INV) with respect to the code words which are included in the $2^{nd}$ main code group and correspond to the same source codes, and the DSV code group together with the $2^{nd}$ main code group control the DC suppression in the code word stream.

13. A modulation method of modulating data input to an optical disc recording/reproducing apparatus to a run length limited (RLL) code which is represented by (d, k, m, n) wherein d indicates the minimum run length, k indicates the maximum run length, m indicates the length of data bits, and n indicates the length of code word bits, the modulation method comprising:

(a) at a point of DSV control, modulating m-bit data input while inserting a code word for DSV control, or, modulating the m-bit data input while selecting a code word of one code group in main code groups, in which code words have duplicated code words and the code words of each code group are allocated to have opposite signs of a $1^{st}$ parameter a code word sum value (CSV), which represents a direct current (DC) value in the code word and opposite characteristics of a $2^{nd}$ parameter (INV) which predicts a transition direction of a digital sum value (DSV) of a succeeding code word, and decision code groups for determining whether the code word is the duplicated code word.

14. The modulation method of claim 13, wherein, when it is not at a point of DSV control, modulating the m-bit data input using a DSV code group which is formed with some or all of the code words of one of the main code groups, to perform the DSV control.

15. The modulation method of claim 14, wherein if it is the point of the DSV control, set by a frequency number of inserting a code word for the DSV control, modulating the m-bit data input into the code word for the DSV control, modulating the m-bit data input into a code word of the one code group among the main code groups, the decision code groups, and the DSV code groups.

16. The modulation method of claim 15, wherein the main code groups include a $1^{st}$ main code group and a $2^{nd}$ main code group which are a pair of code groups to control DC suppression;

the decision code groups include a $1^{st}$ decision code group and a $2^{nd}$ decision code group; and the DSV code group includes some or all of the code words in one of the $1^{st}$ main code group and the $2^{nd}$ code group and allocate the code words so that the code words have the opposite signs of the $1^{st}$ parameter and the opposite characteristics of the $2^{nd}$ parameter with respect to corresponding code words which are included in the other one of the $2^{nd}$ main code group and the $1^{st}$ main code group and correspond to the same source codes, and then DC suppression is performed.

17. The modulation method of claim 16, the method further comprising:

(b) checking a number of end zeros (EZ) of the code words; and (c) if $EZ \leq d-1$, making a $3^{rd}$ parameter (ncg), which indicates a code group of a code word following a code word of the each code group, to point out the $2^{nd}$ main code group or the DSV code group; if $d \leq EZ \leq y$ (y: code word duplication parameter) and the code word is duplicated, making the $3^{rd}$ parameter to point out the decision code group or the $2^{nd}$ decision code group; and if $y \leq EZ \leq k$ or $d < EZ < y$ and the code word is not duplicated, making the $3^{rd}$ parameter to indicate the $1^{st}$ main code group or the $2^{nd}$ main code group, wherein the maximum run length k is not violated.

18. The modulation method of claim 17, wherein for the RLL code d, k, m, and n are set to 1, 8, 8, 12, respectively, and x is a division parameter for distinguishing the $1^{st}$ main code group and the $2^{nd}$ main code group and is set to 1, and y is set to 3.

19. The modulation method of claim 17, the method further comprising:

(d) inserting a synchronization pattern in the m-bit data input at each of a plurality of predetermined cycles, and allocating synchronization patterns, which are used when the $3^{rd}$ parameter points out the $1^{st}$ main code group or the $2^{nd}$ decision code group, and synchronization patterns, which are used when the $3^{rd}$ parameter points out the $2^{nd}$ main code group or the $1^{st}$ decision code group, to have the opposite signs of the $1^{st}$ parameter and the opposite characteristics of the $2^{nd}$ parameter to select a synchronization code word for the DSV control.

20. The modulation method of claim 17, the method further comprising:

(d) inserting a synchronization pattern in the m-bit data input at each of a plurality of predetermined cycles and allocating synchronization patterns, which are used when the $3^{rd}$ parameter points out the $1^{st}$ main code group or the $1^{st}$ decision code group, and synchronization patterns, which are used when the $3^{rd}$ parameter points out the $2^{nd}$ main code group or the $2^{nd}$ decision code group, to have the opposite signs of the $1^{st}$ parameter and the opposite characteristics of the $2^{nd}$ parameter to select a synchronization code word for the DSV control.

21. The modulation method of claim 17, further comprising changing the code group pointed out by the 3rd parameter depending on whether at a point of the DSV control which is, when a number of end zeros is less than the minimum run length, the code group pointed out by the $3^{rd}$ parameter is the $1^{st}$ main code group or the $2^{nd}$ main code group to select a code word for the DSV control, and if it is not at the point of the DSV control, the code group pointed out by the $3^{rd}$ parameter is the $2^{nd}$ main code group or the DSV code group to select the code word for the DSV control.

22. The modulation method of claim 13, wherein in the step (a), at a point of the DSV control, modulating the m-bit input data using a sub conversion table for the DSV control whose code words are added with bits for the m-bit data input DSV control to strengthen suppression of a DC component in a code word stream.

23. The modulation method of claim 22, further comprising making the code words of the sub conversion table for the DSV control by adding predetermined merge bits to the same code words in the main code groups and the decision code groups.

24. The modulation method of claim 23, wherein the code words of the sub conversion table for DSV control points out the same code word groups as the main code groups and the decision code groups.

25. The modulation method of claim 22, further comprising making the code words of the sub conversion code table by adding a DSV control bit to the code words of the main code groups and the decision code groups as MSB.

26. The modulation method of claim 16, wherein the $1^{st}$ main code group comprises the code words whose LZ is less than or equal to the main code group division parameter (x) "1", and the $2^{nd}$ main code group comprises the code words whose LZ is equal to or greater than 1, and the $1^{st}$ main code group has no code words identical to any code word of the $2^{nd}$ main code group and vice versa, and the code words whose EZ is equal to or greater than the minimum run length (d) and less than or equal to the code word duplication parameter (y) are duplicated.

27. The modulation method of claim 26, wherein among the code words whose EZ is equal to or greater than the minimum run length (d) and less than or equal to the code word duplication parameter (y), some of the code words are not duplicated by checking a predetermined code group and bits of a code word to control more efficient DC suppression.

28. The modulation method of claim 27, wherein the not-duplicated code words do not select the $1^{st}$ decision code group or the $2^{nd}$ decision code group, but select the $1^{st}$ main code group or the $2^{nd}$ main code group as ncg.

29. The modulation method of claim 26, wherein the code words whose EZ is $1 \leq EZ \leq 3$ are duplicated, and the code words whose EZ is "1" and the upper significant four bits of the code words is 8 (1000b) or 9 (1001b) are not duplicated, and the $3^{rd}$ parameter (ncg) is made to point out not the $1^{st}$ decision code group or the $2^{nd}$ decision code group, but the $1^{st}$ main code group or the $2^{nd}$ main code group to perform the DSV control.

30. A modulation method of modulating data input to an optical disc recording/reproducing apparatus to a run length limited (RLL) code which are represented by (d, k, m, n) wherein d indicates the minimum run length, k indicates the maximum run length, m indicates the length of data bits, and n indicates the length of code word bits, the modulation method comprising the:

(a) setting a point of DSV control which indicates whether to repeatedly insert a code word for DSV control in a predetermined number of code words; and (b) when it is not at a point of DSV control, modulating m-bit input data to an n-bit code word selected from a main conversion table, and at the point of the DSV control, modulating the m-bit input data to a code word selected from a sub conversion table for the DSV control, the sub conversion table comprising code words longer than the n-bit code words of the main conversion table.

31. The modulation method of claim 30, wherein the main conversion table comprises main code groups and decision code groups for determining whether a code word is duplicated, and the main code groups allocated code words so that each code word in one of the main code groups has a sign of a $1^{st}$ parameter code word sum value (CSV), which represents a DC value in the code word, and a characteristic of a $2^{nd}$ parameter INV, which predicts a transition direction of digital sum value (DSV) of a succeeding code word, which both the sign and the characteristic are opposite to those of corresponding code words in the other one of the main code groups.

32. The modulation method of claim 31, wherein the main conversion table additionally includes one or more DSV code groups which comprise some or entire code words of one of the main code groups among the main code groups.

33. The modulation method of claim 30, wherein a sub conversion table for the DSV control has four states, each state having code words, which are longer than the n-bit code words of the code groups of the main conversion table and different from the n-bit code words, and each state having two code groups, and the two code groups of each state have code words having a $1^{st}$ parameter code word sum value (CSV), which represents a DC value in the code word, opposite to the $1^{st}$ parameter of the corresponding code word in the other code group in the same state.

34. The modulation method of claim 33, wherein the code words of the two code groups of each state select the same next code group which includes the succeeding code word.

35. The modulation method of claim 30, wherein a sub conversion table for the DSV control has four states, each state having code words, which are longer than the n-bit code words of the code groups of the main conversion table and different from the n-bit code words, and each state having two code groups, the two code groups of each state have code words having a $2^{nd}$ parameter (INV), which predicts a transition direction of a digital sum value (DSV) of the succeeding code word, opposite to the $2^{nd}$ parameter of the corresponding code word in the other code group in the same state.

36. The modulation method of claim 35, wherein the code words of the two code groups of each state select the same next code group which includes the succeeding code word.

37. The modulation method of claim 30, wherein the sub conversion table for the DSV control comprises 14-bit code words which satisify that d and k are 1 and 8, respectively.

38. A method of modulating a code word stream to a run length limited (RLL) code which is represented by (d,k,m, n), wherein d indicates the minimum run length, k indicates the maximum run length, m indicates the length of data bits, and n indicates the length of code word bits, the modulating method comprising:

modulating the code word stream using a main code conversion table at points other than digital signal value control points; and modulating the code word stream using a code conversion table distinct from the main code conversion table at the digital signal value control points;

wherein the code conversion table uses at least some of code words which are in the main code conversion table.

39. The method of claim 38, further comprising:

updating a digital sum value of the code word stream by adding the inverted digital sum value of the next code word without change to the digital sum value of the code word stream cumulated previously, if the INV parameter in the code word stream is "0"; and updating the digital sum value of the code word stream by adding the digital sum value of the next code word to the digital sum value of the code word stream cumulated previously after inverting the sign of the digital sum value of the next code word, if the INV parameter in the code word stream is "1".

40. A method of modulating a code word stream to a run length limited (RLL) code which is represented by (d,k,m,n), wherein d indicates the minimum run length, k indicates the maximum run length, m indicates the length of data bits, and n indicates the length of code word bits, the modulating method comprising:

modulating the code word stream using a main code conversion table at points other than digital signal value control points; and modulating the code word stream using a sub conversion table distinct from the main code conversion table at the digital signal value control points;

wherein the sub conversion table uses a maximum sign of a code word sum value, which indicates a DC value within a current code word, and a characteristic of an INV parameter, which predicts a transition of the digital sum value in a next code word.

41. The method of claim 40, further comprising:

updating a digital sum value of the code word stream by adding the inverted digital sum value of the next code word without change to the digital sum value of the code word stream cumulated previously, if the INV parameter in the code word stream is "0"; and updating the digital sum value of the code word stream by adding the digital sum value of the next code word to the digital sum value of the code word stream cumulated previously after inverting the sign of the digital sum value of the next code word, if the INV parameter in the code word stream is "1".

42. A method of modulating a code word stream to a run length limited (RLL) code which is represented by (d,k,m,n), wherein d indicates the minimum run length, k indicates the maximum run length, m indicates the length of data bits, and n indicates the length of code word bits, the modulating method comprising:

modulating the code word stream using a main code conversion table at points other than digital signal value control points; and modulating the code word stream using a sub conversion table distinct from the main code conversion table at the digital signal value control points;

wherein the sub conversion table uses a characteristic of a code word sum value, which indicates a DC value within a current code word, and a characteristic of an INV parameter, which predicts a transition of the digital sum value in a next code word, of the main conversion table.

43. The method of claim 42, further comprising:

updating a digital sum value of the code word stream by adding the inverted digital sum value of the next code word without change to the digital sum value of the code word stream cumulated previously, if the INV parameter in the code word stream is "0"; and updating the digital sum value of the code word stream by adding the digital sum value of the next code word to the digital sum value of the code word stream cumulated previously after inverting the sign of the digital sum value of the next code word, if the INV parameter in the code word stream is "1".

44. A demodulation method of demodulating a code word stream received in an optical disc recording/reproducing apparatus using a run length limited (RLL) code into original data, wherein at a point of DSV control, m-bit input data is modulated to a code word for the DSV control, and when it is not at a point of the DSV control, the m-bit input data is modulated to a code word in one code group among main code groups and decision code groups, the main code groups having duplicated code words and having code words which have a $1^{st}$ parameter code word sum value (CSV), which represents a DC value in the code word, and a characteristic of a $2^{nd}$ parameter INV, which predicts a transition direction of a digital sum value (DSV) of a succeeding code word, both opposite to those of the corresponding code words of the other main code group, and the decision code groups for determining whether a code word is the duplicated code words, the demodulation method comprising:

(a) updating a $3^{rd}$ parameter, which points out the code group having the current code word to be demodulated, according to characteristics of a previous code word after inputting a code word stream; and (b) demodulating the code word into the corresponding original m-bit data in the code group pointed out by the updated the $3^{rd}$ parameter when only one current code word exists in the code group pointed out by the updated the $3^{rd}$ parameter (ncg).

45. The demodulation method of claim 44, further comprising:

(c) checking predetermined bits of a succeeding code word when two duplicated code words exist in the code group pointed out by the updated $3^{rd}$ parameter (ncg), and if any one bit in the checked bits is "1", demodulating the first code word in the duplicated code words into the original data, and if all the bits are "0", demodulating the second code word in the duplicated code words into the original data.

46. The demodulation method of claim 44, further comprising:

(c) when two duplicated code words exist in the code group pointed out by the updated $3^{rd}$ parameter (ncg), if a number of lead zeros of a succeeding code word is 0, 4, or 5, demodulating the first code word of the duplicated code words into the original data, and if the number of lead zeros of the succeeding code word is 1, 2, or 3, demodulating the second code word of the duplicated code words into the original data.

47. The demodulation method of claim 44, further comprising:

(c) restoring a synchronization pattern after determining whether an input code word stream is the synchronization pattern, and initializing the $3^{rd}$ parameter (ncg) to one of the code groups.

48. The demodulation method of claim 44, further comprising:

(c) when an input code word stream is a code word modulated during the point of the DSV control, removing a DSV control bit from the modulated code word and then performing the step (a).

49. The demodulation method of claim 44, further comprising:
   (c) when an input code word stream is a code word modulated at the point of the DSV control, demodulating the code word by using an additional sub conversion table for the DSV control.

50. The demodulation method of claim 44, further comprising modulating the RLL data when it is not at the point of the DSV control by using one or more DSV code groups, each DSV code group comprising some code words of one of the main code groups.

51. The demodulation method of claim 50, wherein the step (a) comprises:
   (a1) determining a number of end zeros (EZ) in a preceding code word;
   (a2) if the EZ of the preceding code word is "0", updating the $3^{rd}$ parameter (ncg) as the $2^{nd}$ one of the main code groups;
   (a3) if the EZ of the preceding code word is "1", when it is not at the point of the DSV control, updating the $3^{rd}$ parameter (ncg) as either of the $2^{nd}$ main code group or the DSV code group for DC control, and at the point of the DSV control, updating the $3^{rd}$ parameter (ncg) as either a $1^{st}$ one of the main code groups or the $2^{nd}$ main code group;
   (a4) if the EZ of the preceding code word is equal to or greater than the minimum run length (d) and less than or equal to a code word duplication parameter (y), determining whether two duplicated code words exist in the code group pointed out by the $3^{rd}$ parameter (ncg) of the preceding code word;
   (a5) if two duplicated code words exist in the step (a4), checking predetermined bits of a current code word and updating the $3^{rd}$ parameter as a $1^{st}$ one of the decision code groups or a $2^{nd}$ one of the decision code groups depending on whether the predetermined bits are "1" or "0"; and
   (a6) if the EZ of the preceding code word is greater than the duplication parameter y and less than or equal to the maximum run length (k), or if the two duplicated code words do not exist in the step (a4), updating the $3^{rd}$ parameter as either the $1^{st}$ main code group or the $2^{nd}$ main code group for the DC control.

52. The demodulation method of claim 51, wherein if d is 1; k is 8; m is 8; n is 12; the division parameter (x) which divide the $1^{st}$ main code group and the $2^{nd}$ main code group is 1; the code word duplication parameter (y) is 3; and the predetermined bits are the $9^{th}$ bit and the $5^{th}$ bit, when any of the $9^{th}$ bit and the $5^{th}$ bit is "1" in the step (a5), updating the $3^{rd}$ parameter (ncg) as the $1^{st}$ decision code group, and when all of the predetermined bits are "0", updating the $3^{rd}$ parameter (ncg) as the $2^{nd}$ decision code group.

53. The demodulation method of claim 51, if d is 1; k is 8; m is 8; n is 12; the division parameter (x) which divide the $1^{st}$ main code group and the $2^{nd}$ main code group is 1; the code word duplication parameter (y) is 3; and the predetermined bits are the upper significant 4 bits of the current code word, in the step (a5), when a most significant bit of the current code word is "1" or the upper significant four bits of the current code word are all "0", updating the $3^{rd}$ parameter (ncg) as the $1^{st}$ decision code group, and otherwise updating the $3^{rd}$ parameter (ncg) as the $2^{nd}$ decision code group.

54. A demodulation method of demodulating a code word stream received in an optical disc recording/reproducing apparatus using a run length limited (RLL) code into original data, wherein when it is not at a point of DSV control, m-bit input data is modulated to an n-bit code word selected from a main conversion table, and at the point of the DSV control, the m-bit input data is modulated to a code word which is selected from a sub conversion table for the DSV control, the sub conversion table comprising code words longer than n-bit code words of a main conversion table, the demodulation method comprising:
   (a) determining whether the point of the DSV control is in a received code word stream, the point of the DSV control being when a code word for DSV control is inserted every predetermined number of code words into the code word stream; and
   (b) when the result of the step (a) determines that it is not at the point of the DSV control, demodulating an n-bit code word in the code word stream into original the m-bit data by using a $1^{st}$ demodulation table corresponding to the main conversion table, and when the result of the step (a) determines the point of the DSV control, demodulating a code word longer than n-bit into the original m-bit data by using a $2^{nd}$ demodulation table corresponding to the sub conversion table for the DSV control.

55. A demodulation apparatus for demodulating an n-bit code word into the original m-bit data in optical disc recording/reproducing apparatuses using a run length limited (RLL) code represented by (d, k, m, n), wherein d indicates the minimum run length, k indicates the maximum run length, m indicates the data bit length, and n indicates the code word bit length, the demodulation apparatus comprising:
   a shift register which stores a the preceding code word, a current code word, and a succeeding code word in a received code word stream;
   a detector which detects a value of a $3^{rd}$ parameter (ncg), which points out a next code group of the preceding code word, according to a number of end zeros (EZ) after checking the number of EZ of the preceding code word;
   a determining unit which supplies a determination signal for determining whether a code word is duplicated, after checking a predetermined bit of the preceding code word; and
   a demodulation code table for supplying the m-bit data corresponding to the current code word in the code group pointed out by the $3^{rd}$ parameter (ncg) of the preceding code word.

56. The demodulation apparatus of claim 55, wherein the demodulation code table comprises $1^{st}$ and $2^{nd}$ main code groups and decision code groups for determining whether or not duplicated code words exist, and the main code groups have duplicated code words and have code words which have a $1^{st}$ parameter code word sum value (CSV), which represents a DC value in the code word, and a characteristic of a $2^{nd}$ parameter INV, which predicts a transition direction of digital sum value (DSV) of the succeeding code word, both opposite to those of the corresponding code words of the other one of the main code groups, and the m-bit data corresponding to the current code word is read from the code group pointed out by the $3^{rd}$ parameter (ncg) of the preceding code word according to the $3^{rd}$ parameter (ncg), the duplication code word determination signal, and a DSV control signal which indicates a point of DSV control.

57. The demodulation apparatus of claim 55, further comprising a synchronization detection and protection unit which detects a synchronization pattern in an output from the shift register and uses the detected synchronization pattern when the pattern is normally detected, and otherwise uses a pseudo synchronization pattern.

58. The demodulation apparatus of claim 57, further comprising a system controller which starts counting from the synchronization pattern detection, and at a point of DSV control corresponding to a frequency of inserting code words for the DSV control, a most significant bit is removed from the current code word and the code word is demodulated into the original data using the demodulation code table.

59. The demodulation apparatus of claim 57, further comprising a system controller which starts counting from the synchronization pattern detection, and at a point of DSV control corresponding to a frequency of inserting code words for the DSV control, a code word to which the code word for the DSV control is inserted is demodulated using a separate demodulation code table for the DSV control.

60. The demodulation apparatus of claim 56, wherein the detector comprises:

a $1^{st}$ bit checking unit which checks the EZ of the preceding code word and supplies an ncg control signal pointing out the next code group according to the EZ value;

a $2^{nd}$ bit checking unit which checks a predetermined number of highest bits of the preceding code word to detect a code word having an exception condition of duplicated code words, and supplying an exception control signal when the predetermined number is checked; and an ncg extracting and changing circuit which changes the ncg control signal into a $1^{st}$ state value when the exception control signal supplied from the $2^{nd}$ bit checking unit and the ncg control signal supplied from the $1^{st}$ bit checking unit are $3^{rd}$ state values, and supplying the ncg control signals from $1^{st}$ and the $2^{nd}$ state values supplied from the $1^{st}$ bit checking unit, without change, when the $2^{nd}$ bit checking unit does not supply the exception control signal or the ncg control signal is not a $3^{rd}$ state value.

61. The demodulation apparatus of claim 60, wherein the ncg extracting and changing circuit checks a the lower significant four bits of the preceding code word, outputs the $3^{rd}$ parameter (ncg) in a form of the $2^{nd}$ state value when the EZ is 0, in a form of the $3^{rd}$ state value when the EZ is between 1 and 3, and in a form of the $1^{st}$ state value when the EZ is equal to or greater than 4.

62. The demodulation apparatus of claim 60, wherein the demodulation code table reads the original data corresponding to the current code word from one code group among the decision code groups if the $3^{rd}$ parameter (ncg) supplied from the ncg extracting and changing circuit is the $3^{rd}$ state value.

63. The demodulation apparatus of claim 60, wherein the demodulation code table reads the original data corresponding to the current code word from one code group among the $1^{st}$ and $2^{nd}$ main code groups if the $3^{rd}$ parameter (ncg) supplied from the ncg extracting and changing circuit is the $1^{st}$ state value.

64. The demodulation apparatus of claim 60, wherein the demodulation code table additionally has one or more DSV code groups, each DSV code group comprising some or entire code words of a code group among the $1^{st}$ and $2^{nd}$ main code groups.

65. The demodulation apparatus of claim 64, wherein if the $3^{rd}$ parameter (ncg) supplied from the ncg extracting and changing circuit is the $2^{nd}$ state value and, at a point of DSV control according to the DSV control signal, the demodulation code table reads the original data corresponding to the current code word from a code group among the $1^{st}$ and $2^{nd}$ main code groups, and if it is not at the point of the DSV control, the demodulation code table reads the original data corresponding to the current code word from one of the $1^{st}$ and $2^{nd}$ main code groups whose code words have opposite signs of the $1^{st}$ parameter and opposite characteristics of the $2^{nd}$ parameter with respect to the code words of the one or more DSV code groups.

66. The demodulation apparatus of claim 60, wherein the $2^{nd}$ bit checking unit checks whether an upper significant four bits of the preceding code word is 8 (1000b) or 9 (1001b); the determining unit checks whether the $9^{th}$ bit and the $5^{th}$ bit of the succeeding code word is "0" or "1"; and the demodulation code table selects one of two duplicated code words according to whether the $3^{rd}$ parameter (ncg) is the $3^{rd}$ state value and any of the $9^{th}$ bit and the $5^{th}$ bit is "1".

67. The demodulation apparatus of claim 60, wherein the $2^{nd}$ bit checking unit checks whether an upper significant four bits of the preceding code word is 8 (1000b) or 9 (1001b); the determining unit checks whether the upper significant four bits of the succeeding code word; and the demodulation code table selects one of two duplicated code words according to whether the $3^{rd}$ parameter (ncg) is the $3^{rd}$ state value and what is the number of lead zeros of the upper significant four bits.

68. The demodulation apparatus of claim 60, wherein the ncg extracting and changing circuit changes the $3^{rd}$ state value of the ncg control signal supplied from the $1^{st}$ bit checking unit into the $1^{st}$ state value to make the $3^{rd}$ parameter (ncg) of a not-duplicated code word point out one code group among the $1^{st}$ and $2^{nd}$ main code groups when the EZ of the preceding code word is 1 and an upper significant four bits is 8 (1000b) or 9 (1001b).

69. The demodulation apparatus of claim 55, wherein d is 1, k is 8, m is 8, n is 12, and the RLL code is an (1, 8, 8, 12) code.

* * * * *